United States Patent
Jurczyk et al.

(10) Patent No.: US 12,211,679 B2
(45) Date of Patent: Jan. 28, 2025

(54) METHOD AND APPARATUS FOR METAL AND CERAMIC NANOLAYERING FOR ACCIDENT TOLERANT NUCLEAR FUEL, PARTICLE ACCELERATORS, AND AEROSPACE LEADING EDGES

(71) Applicant: Starfire Industries LLC, Champaign, IL (US)

(72) Inventors: Brian E. Jurczyk, Champaign, IL (US); Robert A. Stubbers, Savoy, IL (US); Ivan Shchelkanov, Champaign, IL (US); Thomas James Houlahan, Jr., Champaign, IL (US); Ian F. Haehnlein, Champaign, IL (US)

(73) Assignee: Starfire Industries LLC, Champaign, IL (US)

( * ) Notice: Subject to any disclaimer, the term of this patent is extended or adjusted under 35 U.S.C. 154(b) by 0 days.

(21) Appl. No.: 16/801,002

(22) Filed: Feb. 25, 2020

(65) Prior Publication Data

US 2020/0273684 A1    Aug. 27, 2020

Related U.S. Application Data

(60) Provisional application No. 62/810,230, filed on Feb. 25, 2019.

(51) Int. Cl.
*H01J 37/34* (2006.01)
*C23C 14/35* (2006.01)
(Continued)

(52) U.S. Cl.
CPC .......... *H01J 37/3405* (2013.01); *C23C 14/35* (2013.01); *G21C 21/02* (2013.01);
(Continued)

(58) Field of Classification Search
CPC .............. C23C 14/0641; C23C 14/165; C23C 14/3407; C23C 14/35; C23C 14/562;
(Continued)

(56) References Cited

U.S. PATENT DOCUMENTS 4,221,652 A * 9/1980 Kuriyama ........... H01J 37/3405
                                                            204/192.12
4,545,882 A    10/1985 McKelvey
(Continued)

FOREIGN PATENT DOCUMENTS

EP    2882882 A0    6/2015
JP    01-309964    * 12/1989
(Continued)

OTHER PUBLICATIONS

International Searching Authority/US, International Search Report and Written Opinion in corresponding PCT International Application No. PCT/US20/19743 dated May 22, 2020 (17 pages).
(Continued)

*Primary Examiner* — Rodney G McDonald
(74) *Attorney, Agent, or Firm* — Leydig, Voit & Mayer, Ltd.

(57) ABSTRACT

A system is described that includes a sputter target and a magnetic element array including multiple sets of magnets arranged to have a Hall-Effect region that extends along a length of the sputter target. The elongated sputtering electrode material tube is interposed between the magnetic array and an object to be deposited with a sputtered material from the sputter target. During a direct current high-power impulse magnetron sputtering operation, the system performs a depositing on a surface of the object by generating and controlling an ion and neutral particle flux by: providing a vacuum apparatus containing a sputter target holder electrode; first generating a high-power pulsed plasma magne-
(Continued)

tron discharge with a high-current negative direct current (DC) pulse to the sputter a target holder electrode; and second generating a configurable positive voltage kick pulse to the sputter target holder electrode after terminating the negative DC pulse.

26 Claims, 51 Drawing Sheets

(51) Int. Cl.
  *G21C 21/02* (2006.01)
  *H05H 7/20* (2006.01)
(52) U.S. Cl.
  CPC ...... *H01J 37/3452* (2013.01); *H01J 37/3455* (2013.01); *H01J 37/3467* (2013.01); *H01J 2237/002* (2013.01); *H01J 2237/20214* (2013.01); *H05H 7/20* (2013.01)
(58) Field of Classification Search
  CPC .......... G21C 21/00; G21C 21/02; G21C 3/06; H01J 37/3405; H01J 37/3452; H01J 37/3455
  USPC ....................... 204/298.22, 298.21
  See application file for complete search history.

(56) References Cited

U.S. PATENT DOCUMENTS

| | | | | |
|---|---|---|---|---|
| 5,178,739 A | * | 1/1993 | Barnes | C23C 14/345 |
| | | | | 204/192.12 |
| 5,178,743 A | * | 1/1993 | Kumar | C23C 14/56 |
| | | | | 204/192.12 |
| 5,228,963 A | * | 7/1993 | Rose | C23C 14/35 |
| | | | | 204/192.12 |
| 5,364,518 A | * | 11/1994 | Hartig | C23C 14/3407 |
| | | | | 204/192.12 |
| 6,972,421 B2 | | 12/2005 | Melnychuk et al. | |
| 7,834,620 B2 | | 11/2010 | Kejik et al. | |
| 8,568,572 B2 | | 10/2013 | Anders et al. | |
| 9,039,871 B2 | | 5/2015 | Nauman et al. | |
| 2006/0272935 A1 | * | 12/2006 | Le | C23C 14/35 |
| | | | | 204/192.1 |
| 2010/0236919 A1 | * | 9/2010 | Alami | C23C 14/35 |
| | | | | 204/192.12 |
| 2012/0012458 A1 | | 1/2012 | Lopp et al. | |
| 2013/0206725 A1 | | 8/2013 | Leeser et al. | |
| 2017/0287578 A1 | | 10/2017 | Brachet et al. | |
| 2018/0358213 A1 | | 12/2018 | Ruzic et al. | |

FOREIGN PATENT DOCUMENTS

| | | | |
|---|---|---|---|
| JP | 04-350161 | * | 12/1992 |
| JP | 2007-314842 | | 12/2007 |
| WO | WO 2014/025995 A1 | | 2/2014 |

OTHER PUBLICATIONS

European Patent Office, extended European Search Report in European Application No. 20763719.0 dated Nov. 23, 2022 (8 pages).

Weichsel T et al., "An Inverted Cylindrical Sputter Magnetron as Metal Vapor Supply for Electron Cyclotron Resonance Ion Sources," Review of Scientific Instruments, American Institute of Physics, vol. 85, No. 5, pp. 053301-1 to 053301-10 (May 2, 2014) XP012185110.

* cited by examiner

PRIOR ART

Magnetic Field Minimum/Null
Ambipolar diffusion will confine ions in this region = submerged in plasma system

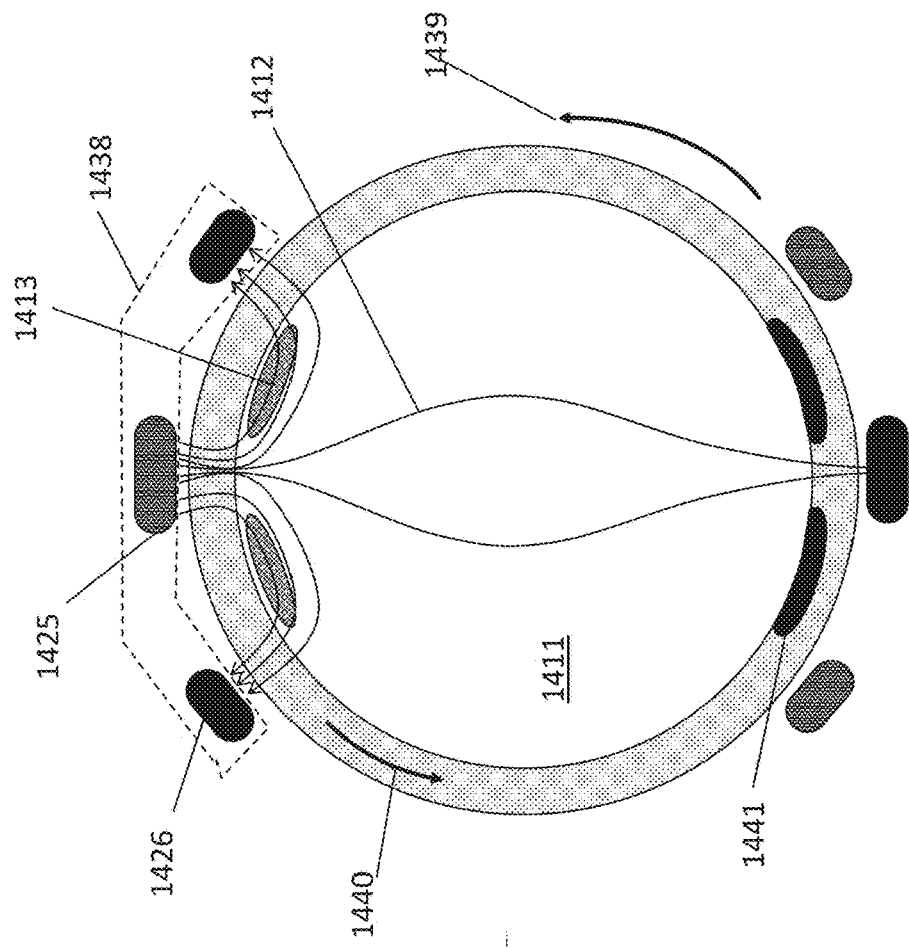
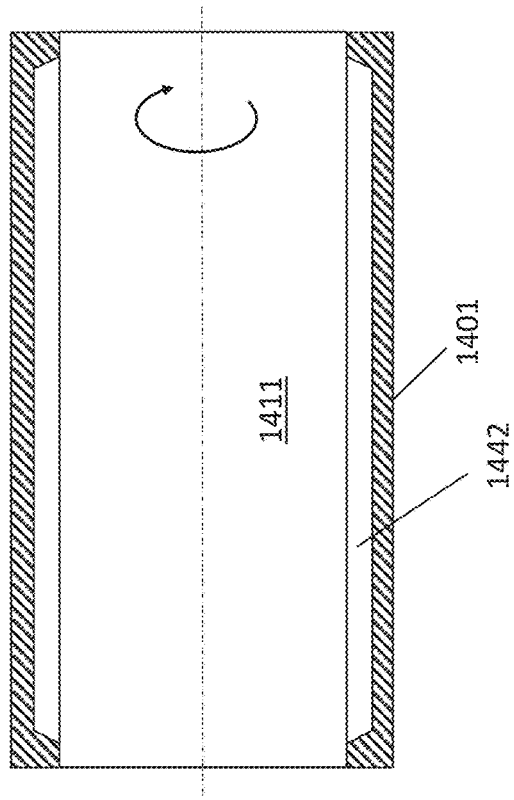

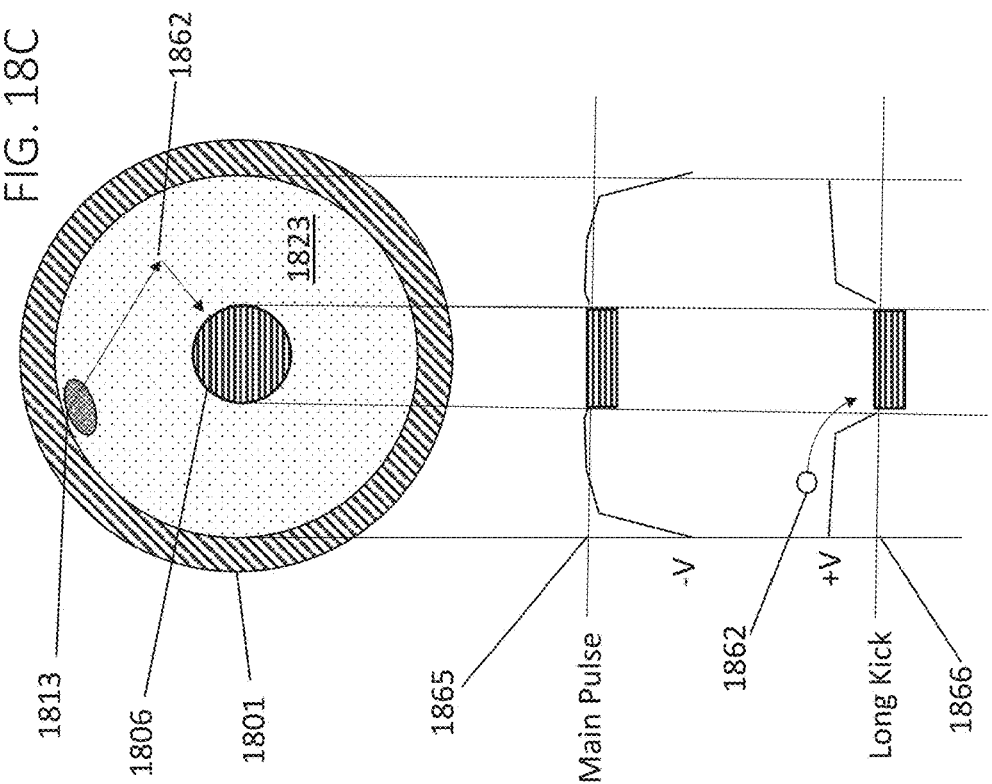
FIG. 18C
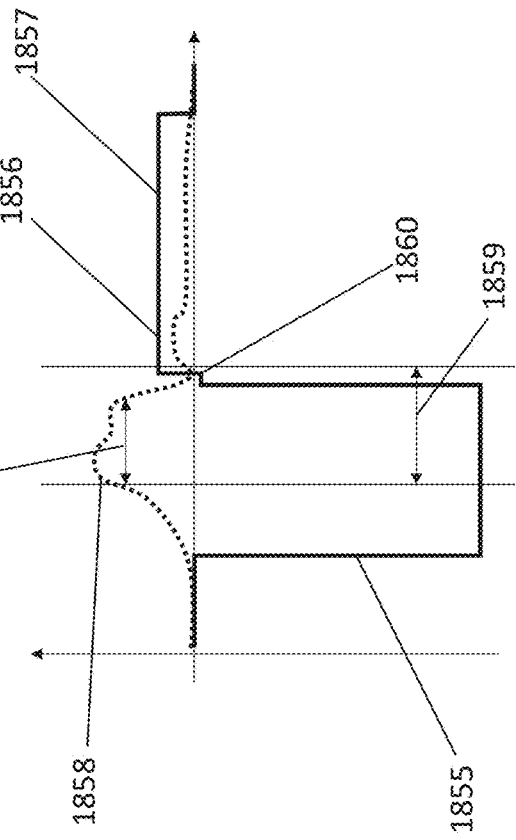
FIG. 18A
FIG. 18B

Continuous Process Without Breaking Vacuum or Staging: Adjust Voltages, Pulse Conditions, Process Gases, Movement

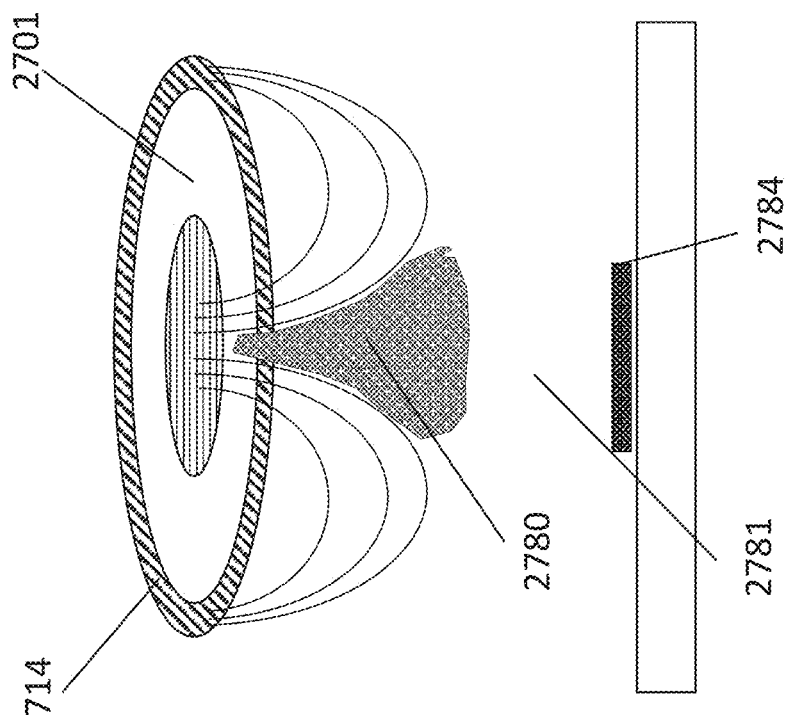
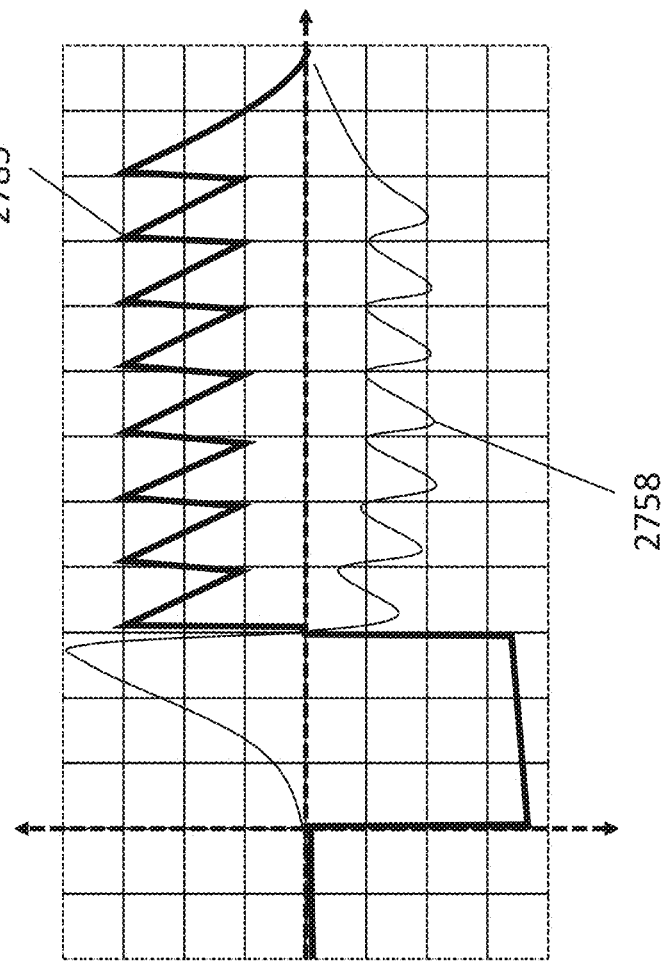
FIG. 27A
FIG. 27B

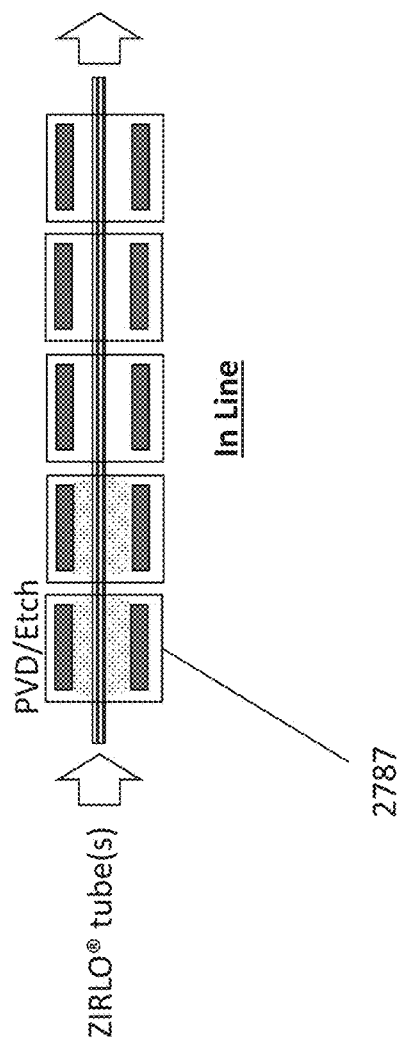
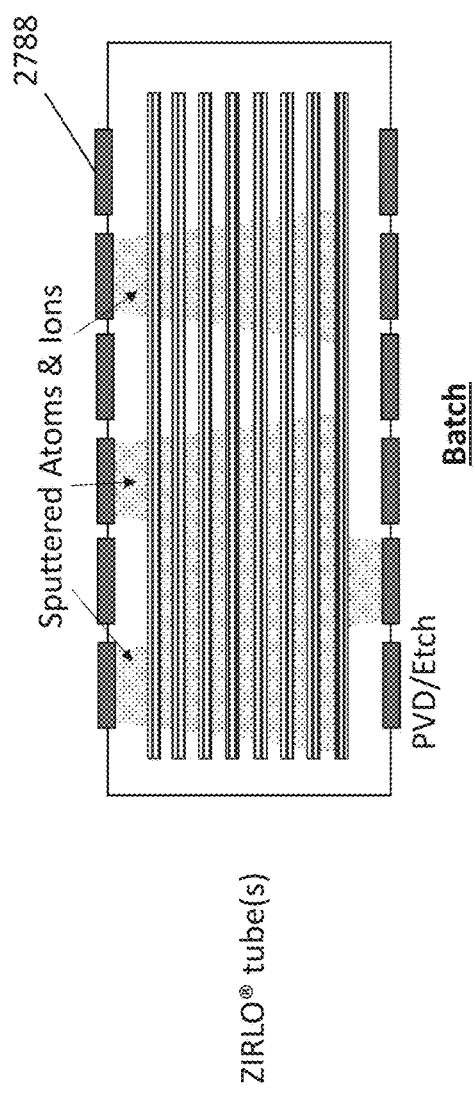
FIG. 28A
FIG. 28B

FIG. 34B
PRIOR ART
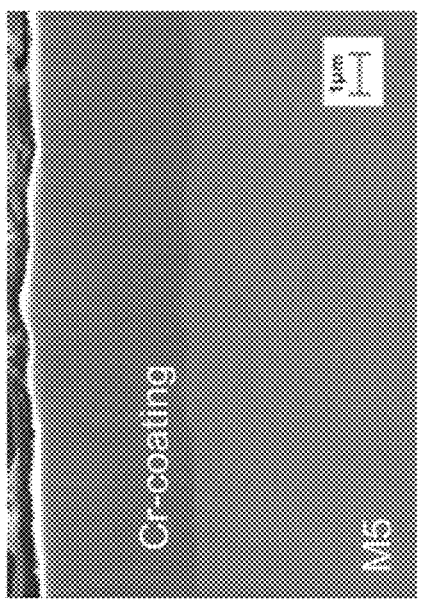
FIG. 34A
PRIOR ART
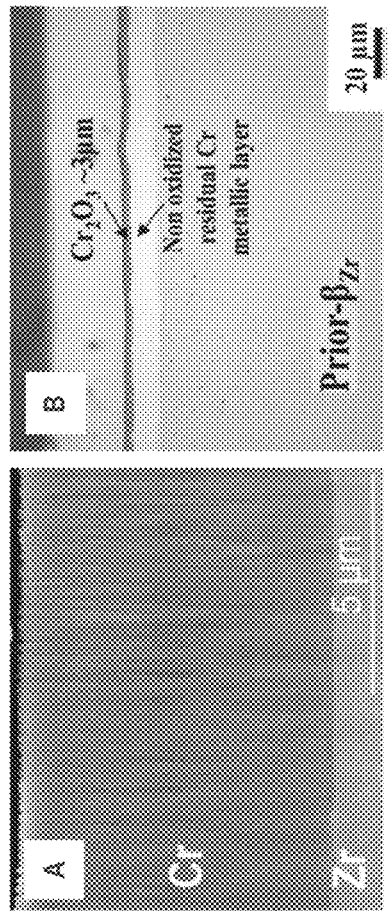
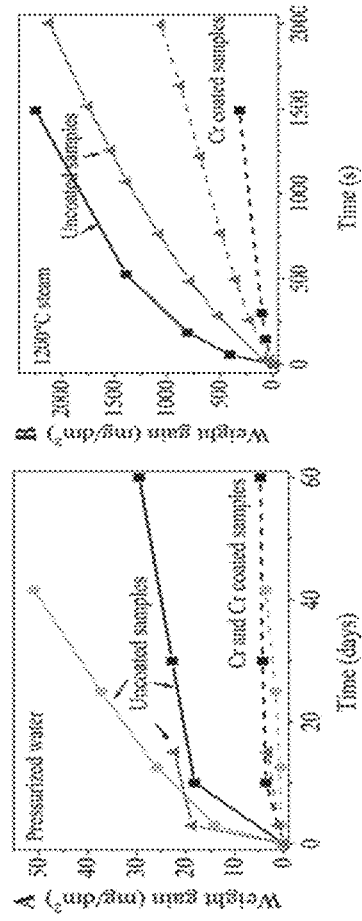

PRIOR ART

FIG. 38

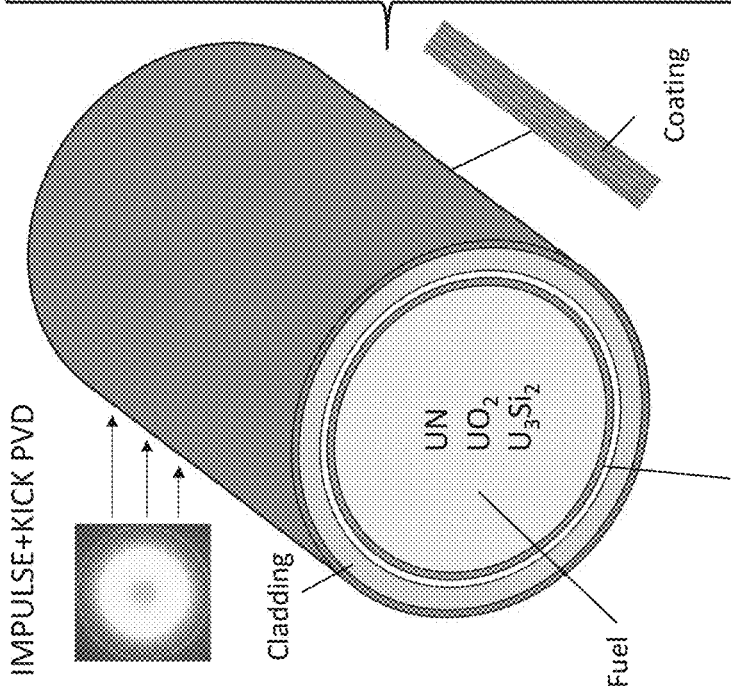

IMPULSE+KICK PVD

Cladding

Fuel (UN, UO$_2$, U$_3$Si$_2$)

Coating

Also For Anti-Fret/Gas Barrier Fuel Coating

Short Term Cladding (e.g. ZIRLO®) + Metallic Nb/Cr/Mo + Nitride Cap
- Tensile/Compressive Stress Management
- Diffusion Barriers/Stops, Low-Transport, Inhibit Zr-Cr, Zr-Mo Eutectic
- 10× Fracture Toughness vs. CS & CA (~10nm Scale)
- Arrest Crack Propagation @ High Temperature

Novel Inverted Cylindrical Magnetron For High Speed Manufacturing
- Mitigate Dust Particulates That Lead To Pinholes
- Magnetic Null Plasma Trapping, High Ion Capture Utilization
- IMPULSE + KICK = Clean, Etch, Mixing, Adhesion, Morphology Control

Medium Term New Fuel + Ceramics NbN/CrN/MoN, SiC/ZrC/Zr$^{11}$B$_2$
- Functionally-Graded Bilayers (Spatial Modulation)
- Improve CTE, Hoop Stress Management For Balloon/Burst
- Alternate Metal, Semiconductor and/or Insulator "Superlattice"
- Ultra-High Temperature Oxidation Resistance
- Add Stabilizers (ppm-1% levels), Diffusion Restricted

Long Term Extendable To Fuel Pellet Coatings & SiC/SiCf Cladding

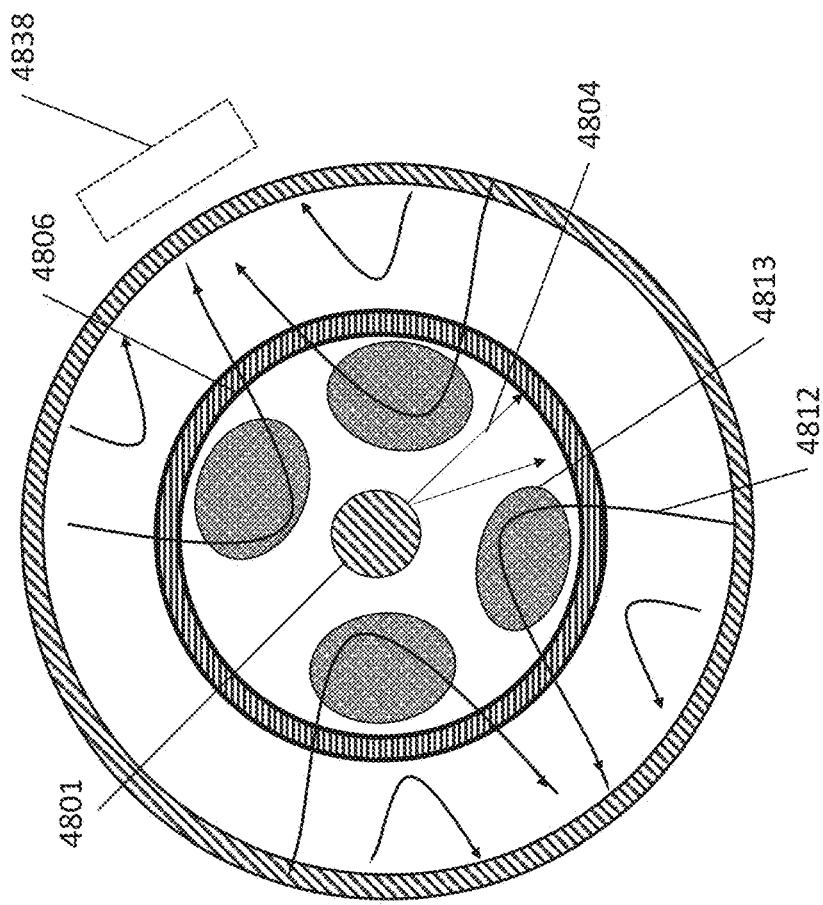
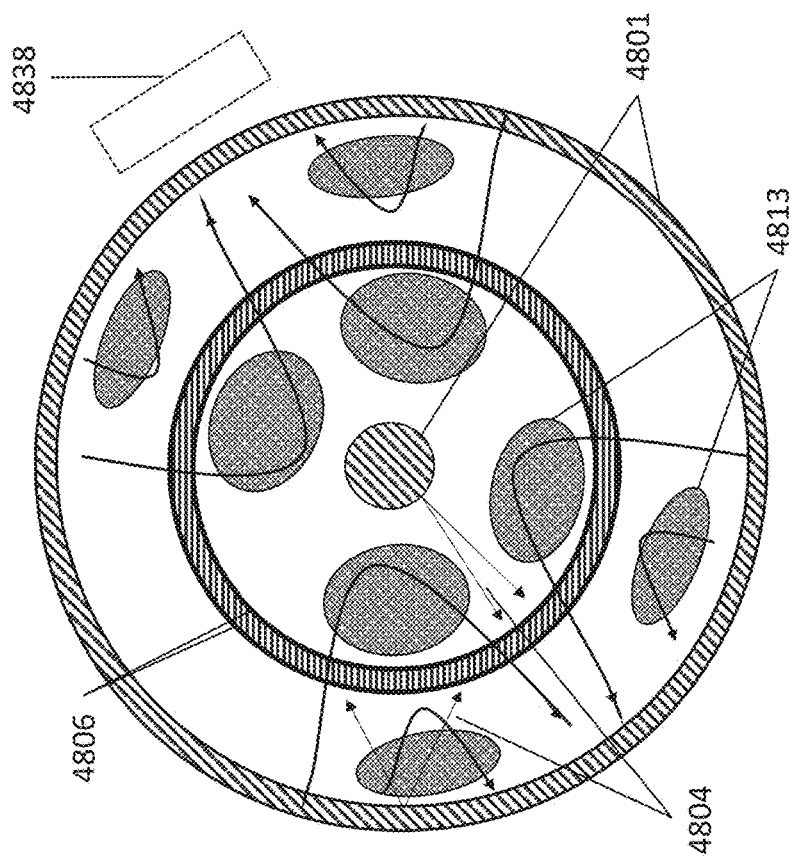
FIG. 48A
FIG. 48B

METHOD AND APPARATUS FOR METAL AND CERAMIC NANOLAYERING FOR ACCIDENT TOLERANT NUCLEAR FUEL, PARTICLE ACCELERATORS, AND AEROSPACE LEADING EDGES

CROSS-REFERENCE TO RELATED APPLICATIONS

This application is a nonprovisional of, and claims the priority of, U.S. Provisional Patent Application No. 62/810,230, filed on Feb. 25, 2019, entitled "METHOD AND APPARATUS FOR METAL AND CERAMIC NANOLAYERING FOR ACCIDENT TOLERANT NUCLEAR FUEL," the contents of which are hereby incorporated by reference in their entirety, including any references contained therein.

This application relates to U.S. Nonprovisional patent application Ser. No. 15/803,320, filed on Nov. 3, 2017, entitled "A COMPACT SYSTEM FOR COUPLING RF POWER DIRECTLY INTO RF LINACS," the contents of which are hereby incorporated by reference in their entirety, including any references contained therein.

This application relates to U.S. Nonprovisional patent application Ser. No. 16/006,357, filed on Jun. 12, 2018, entitled "PULSED POWER MODULE WITH PULSE AND ION FLUX CONTROL FOR MAGNETRON SPUTTERING," the contents of which are expressly incorporated herein by reference in their entirety, including any references therein.

TECHNICAL FIELD

The present disclosure generally relates to processes and apparatuses for rendering durable, high strength/adhesion coatings. More particularly, the disclosure relates to an improved apparatus and process for making/forming high-temperature oxidation resistant coatings for nuclear and aerospace applications.

BACKGROUND

A need exists for scalable manufacturing techniques for high-quality coatings for ATF nuclear fuel to provide: (1) enhanced safety during design basis and beyond design basis (>1200° C.) accident conditions, (2) provide better performance to enable higher linear heat (>7 kW/ft, >20% uprate) generation during baseline operation to enable more energy production from existing nuclear plants, (3) enable higher fuel burn up (>80 MWd/kg U) for less frequent fuel replacement, (4) be cost effective (+$30/cladding) and (5) integrate into existing production flow, inspection and certification.

Westinghouse's EnCore® fuel program features a suite of short-, medium- and long-term transitions to provide enhanced accident tolerance and improved fuel economics. Cold-sprayed Cr directly onto ZIRLO® is a favored short-term insertion point (>2020). Complete changeover to SiC/SiCf cladding is the favored long-term (>2030) transition point; however, SiC may be delayed by high fabrication costs and regulatory challenges. There are medium-term insertion possibilities for novel manufacturing technology that can provide superior Zr-based ATF solutions, as well as work with SiC down the road. Furthermore, there are opportunities for thin-film coating directly onto fuel pellets to improve pellet-clad interaction margin, reduce wash out in event of a fuel rod leak and reduce fission gas release in a transient scenario.

The technical approach is based on high-throughput fabrication method for nanolayered corrosion-resistant and fracture-resistant coatings using high-power impulse magnetron sputtering (HiPIMS) with a recent innovation. Starfire Industries' patent-pending Positive Kick™ technology provides a means to increase deposition rates, adjust coating micro/nanostructure, modify film stress and control morphology. The fabrication technique is suitable for coating ATF LWR cladding and pellets, as well as fast reactor fuels. Both metals and ceramics can be precision deposited with excellent adhesion, graded composite nanostructures and layering, radiation hardness, thermal shock- and oxidation-resistance.

The short-term path is to apply thin (<50 μm) coatings to existing Zr fuel cladding and fuel pellets for improved accident tolerance and performance. See excellent summaries: State-of-the-Art Report on Light Water Reactor Accident-Tolerant Fuels (OECD 2018, NEA 7317) and Light Water Reactor Sustainability Program Report (INL/EXT-12-27090).

Baseline constraints are inhibiting coolant-cladding chemical interactions under normal or design-basis accident conditions with negligible impact on neutron economy and thermal conductivity with low manufacturing cost. The problem is preventing coating delamination and improving tolerance to ballooning and burst (creep) as a function of temperature which is dependent on internal stresses, crack initiation sites and microstructural relief to prevent buckling and film separation. Once the oxidation-resistant barrier is compromised, the underlying Zr will be attacked leading to failure; therefore, engineering the coatings to manage fracture (inhibit crack formation and growth) and buckling (film stress) is paramount to ATF cladding design. Fracture toughness is related to microstructure, intrinsic material properties and effective geometric defect radius for crack initiation: $\sigma_{fracturestrength} \propto Y_{geometricscaling} \times K_{fracturetoughness} / \sqrt{\pi a_{defectsize}}$. The smaller the effective defect length scale ($a_{defectsize}$), the higher fracture strength of the material and resistance to thermal shock, expansion and swelling. Furthermore, grain boundaries/defect surfaces act as transport pathways for accelerated internal oxidation leading to oxide stress and coating spallation; controlling them is key.

Thermal and environmental barrier coatings are historically deposited by sol-gel, electrophoresis (EP), hot-pressing, thermal plasma spray, high-velocity cold spray (CS), laser sintering and physical vapor deposition (PVD). As to not affect the underlying bulk cladding temper and microstructure, all high-temperature processes are ruled out to retain ZIRLO® regulatory compliance and known long-term effects under irradiation. Low temperature processes, like EP, CS and PVD, are the favored approaches. However, each technique is fundamentally limited by the defect length scale from intrinsic to the technique. Electrophoretic deposition and cold-spray examples may exhibit "effective defect sizes" on order of 0.5-2 μm. Westinghouse is performing lead test rod exposures for CS-deposited Cr on 9.5 mm ZIRLO® for short-term ATF introduction.

In contrast PVD based on magnetron sputtering and cathodic arc are vacuum-based and grow films "atom-by-atom" through nucleation and energetic shot peening. Film quality is high and both metals and ceramics can be deposited. However, coating speed and cost are constraints. Such approach may achieve a ~3.3× improvement in fracture toughness over traditional cold-spray with the defect length scale reduction. High-temperature steam testing demonstrated very good oxidation resistance up to 1200° C. and minimal weight gain from a dense $Cr_2O_3$ barrier—surpassing EP and CS techniques.

The improved qualities have led to further pursuit of PVD processes to provide more ion energy to the surface for greater adhesion and to further improve film microstructure using HiPIMS. See, Wu, Journal of Nuclear Materials 504 (2018) 289-299. Areva (France) published results using metallic Cr coating on M5 alloy showing dense microstructure. See, Bischoff, Nuclear Engineering and Technology, 50, (2018) 223-228). HiPIMS can be a low-temperature process that does not modify the microstructure of the underlying zirconium substrate and forms a dense layer with no porosity at the Cr—Zr interface. Oxidation resistance >1200° C. and high-temp creep performance was improved showing that PVD is promising for a near-term ATF solution.

An advantage of PVD is the potential to combine materials during the deposition to functionally-grade a parameter, such as CTE, or form composite structures for stress control, crack inhibition, hoop stress relief, and corrosion stops. Westinghouse worked with researchers at Penn State using cathodic arc to generate 8-16 layered ~1 μm TiN/TiAlN coatings. Corrosion testing was successful passing autoclave for 90 days at 360° C. and 18.7 MPa. No crack or delamination/spallation was observed, indicating good corrosion resistance with thin nitride layers needed to prevent Al migration and boehmite formation. However, macroparticle inclusions from the cathodic arc process (with ~0.5-2 μm sized defects) are problematic at high temperatures. Layering provides improvement, but it is limited by the macroparticle size for effectiveness—similar to cold spray.

SUMMARY OF THE INVENTION

Illustrative examples are provided herein of a system comprising a sputter target and a magnetic element array including multiple sets of magnets arranged to have a Hall-Effect region that extends along a length of the sputter target. The elongated sputtering electrode material tube is interposed between the magnetic array and an object to be deposited with a sputtered material from the sputter target. During a direct current high-power impulse magnetron sputtering operation, the system is configured to perform a depositing on a surface of the object by generating and controlling an ion and neutral particle flux by: providing a vacuum apparatus containing a sputter target holder electrode; first generating a high-power pulsed plasma magnetron discharge with a high-current negative direct current (DC) pulse to the sputter a target holder electrode; and second generating a configurable positive voltage kick pulse to the sputter target holder electrode after terminating the negative DC pulse.

BRIEF DESCRIPTION OF THE DRAWINGS

While the appended claims set forth the aspects of the present invention with particularity, the invention and its advantages are best understood from the following detailed description taken in conjunction with the accompanying drawings, of which:

FIGS. 14A and 14B illustratively depict a structure facilitating rotation of the magnetic assemblies around the central axis or the physical rotation of the target electrode to move the dense plasma sputtering zone and target erosion around the inverted cylindrical magnetron sputtering system;

FIGS. 18A, 18B and 18C illustratively depict an example of an ultra-fast high-power pulsed sputtering and subsequent rapid plasma potential reversal to guide and capture a higher fraction of sputtered ions for conformal deposition on the substrate;

FIGS. 27A and 27B are photographs highlighting the Super Kick mode for extended plasma generation away from the magnetic field cusp and etching on substrates with a sample oscilloscope waveform showing 77kHz operation and extended Super Kick mode;

FIGS. 28A and 28B illustratively depict an In-Line and a Batch Fabrication Process using dedicated single inverted cylindrical magnetron sputter/etch stations with linear feed through multiple in-line stations or a batch mode with multiple deposition/etch heads operating in concert;

FIGS. 34A and 34B illustratively depict a prior art set of results for Cr on Zr and Zr-alloy materials using conventional sputtering+active substrate bias (left) and traditional HiPIMS+active substrate bias (right);

FIG. 38 highlights short-term cladding coatings using metallic Nb/Cr/Mo with a nitride capping layer, diffusion barriers, tensile-compressive stress management;

FIGS. 48A and 48B illustratively depict an illustrative example of the present disclosure to facilitate depositing a coating on and/or etching an interior surface of an object, and for an internal deposition and etching process combined with an external process;

DETAILED DESCRIPTION OF THE INVENTION

Figure 1:
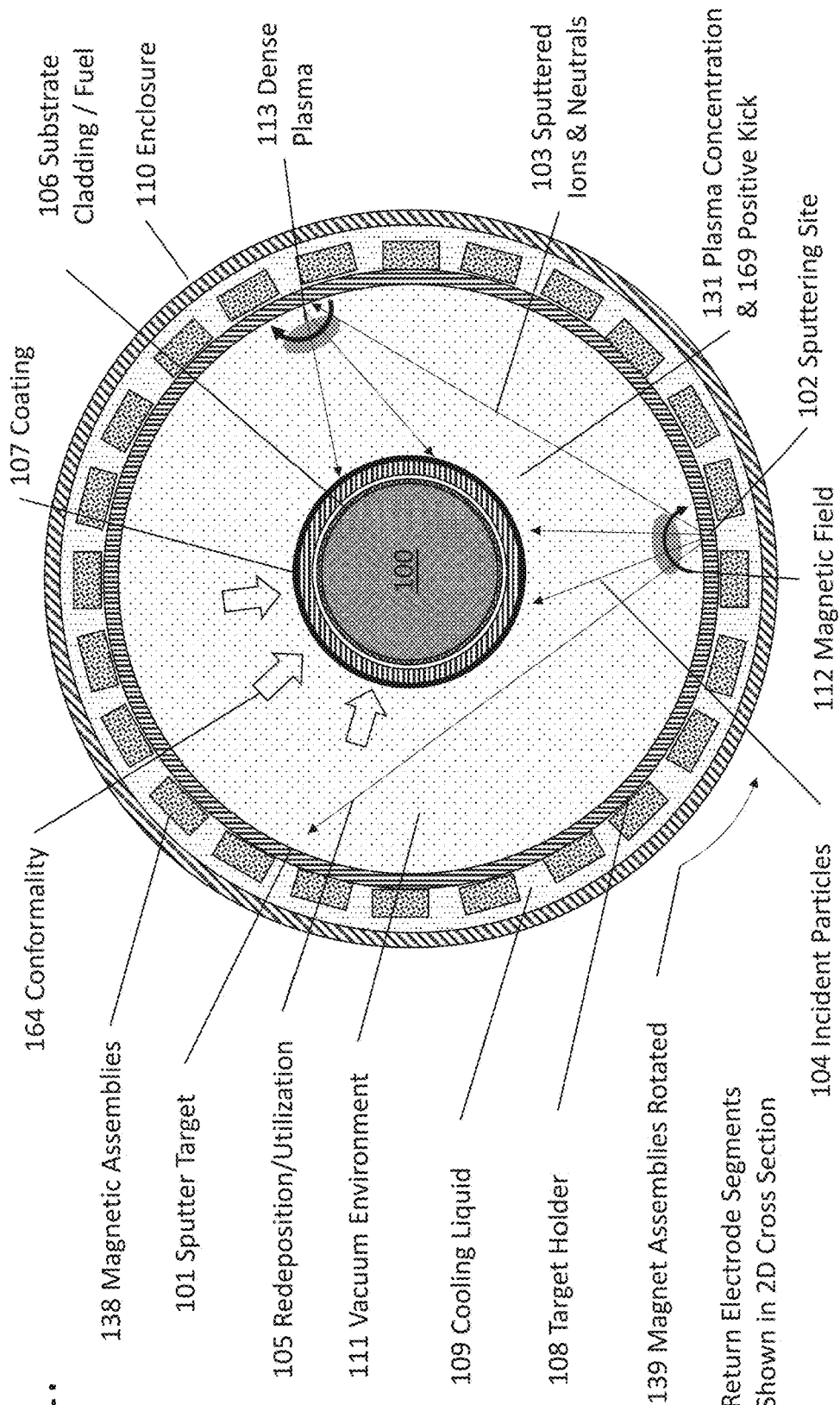
FIG. 1 illustratively depicts an inverted cylindrical magnetron plasma deposition and etching system utilizing magnetron sputtering.

Plasma sputtering with HiPIMS can achieve dense, adherent thin films due to the high fraction of ionization of sputtered target atoms. A system and process described herein provides an ultra-sharp pulsing to achieve >10 A/cm$^2$ current densities with microarc suppression. The process includes a positive kick pulse that reverses the polarity on the sputtering target after the high-current pulse to accelerate metal ions towards the substrate that would normally recycle to the target. The pulse amplitude, onset delay and length are controlled to customize the ion energy distribution function reaching the substrate to be coated. This control provides a powerful source of varying the process for the materials designer to fine-tune properties in thin layers—ion-beam assistance using the material you are depositing at high deposition rates (a win-win scenario). Stress control, preferential grain growth, densification, controllable ion energy allows deposition without need for a substrate bias, and selective etching. With the IMPULSE®, coatings can be deposited directly on insulating surfaces with controlled ion energy to tailor the film properties.

A HiPIMS solution, described herein in accordance with illustrative examples, is ideal for reactive sputtering applications of borides, nitrides, carbides and oxides. Using positive-kick with reactive HiPIMS, nanocomposite layers of (Nb/Cr/Mo, NbN/CrN/MoN, SiC/ZrC, SiC/ Zr$^{11}$B$_2$) and stabilizing materials (e.g. ppm La, Y) can be spatially modulated to build a functionally-graded superlattice with "engineered" maximum defect size and stress relief. Modulated nanolayers allow variation of hardness and elastic modulus for tradeoff in the stiffness vs. toughness factor important for managing thermal gradient. Hall-Petch strengthening, interface broadening and dislocation-slip impedances from each successive multilayer enhance the coating. Residual stress is influenced by the modulation ratio, material choice and energy deposition during deposition/epitaxy. Also, as CERN showed, the Starfire technique works on 3D shapes and deposits onto sidewalls and grazing-incidence surfaces, i.e. coat next-generation General Atomic SiC fiber cladding materials wrapped in a matrix.

A cylindrical magnetron sputtering system, e.g. post-type or inverted-type, in accordance with examples of carrying out embodiments of the present disclosure, employs a "serpentine" or "Greek key" magnetic raceway to have one continuous E×B Hall Drift region that zig-zags along the length of the sputtering chamber. The length of the cylindrical magnetron is a variable for manufacturing. For example, small systems 5 cm in length have been created. With smaller (less than 3cm and larger greater than 30 cm diameters contemplated). Also, longer systems are contemplated (with greater than 1 m length of the magnetron tube).

In a particular illustrative example of such sputtering system for depositing high-deposition rate coatings on the interior of RF accelerator and superconducting cavities for high-quality films, a greater than 1 meter long sputtering electrode material tube surrounds a magnetic array consisting of multiple sets of magnets arranged to have Hall-Effect regions that go up and down the length of the greater than 1 meter long sputter target and makes approximately 8 passes in a Greek key fashion on a 1.5-cm diameter sputtering target tube. The magnetic assembly is inside the target material tube and filled with cooling liquid to keep the target and magnets cool. The sputter target rotates relative to the magnets for achieving a very high target utilization (e.g. greater than 90%). The compact geometry of the illustrative sputtering system facilitates sputter deposition in small tubes, cavities and complex 3D structures.

Such a cylindrical configuration is used, for example, to coat RFQ accelerator vanes and bonding locations within vacuum chambers. The above-referenced/described HiPIMS facilitates/enables energetic bombardment, good interface mixing and well adherent films that effectively seal welds, small porosity and plating defects.

The inverted magnetron physical configuration of the present disclosure flips a typical sputtering source/target orientation such that the object to be coated is in the near-geometric center and a larger sputtering target cylinder is located on an outer radius. A magnetic structure is distributed around the outer cylinder with appropriate cooling, rotation and fixturing. Since hall-effect regions are on the outer radius, there is more distance to travel and more magnetic material required. However, there is more active plasma wetted area available with more cooling. Thus, higher electrical power can be delivered to increase deposition rates (e.g., 3 times higher than rotary or planar outward configurations). The above-described inverted configuration also captures sputtered material that misses the object to be coated and is reclaimed for re-sputtering. The above-described inverted sputtering configuration increases target utilization further and helps lower cost of sputtering/coating material.

In an example for providing a high-throughput nanolayering, a production setup is provided where a ZIRLO tube is fed in one side and passes via a set of rollers or a transport rod through multiple cylindrical sputtering zones (e.g., rings) that deposit successive layers of a particular material, alloy or ceramic. For example, depositing a Nb base layer, followed by Cr and Mo layers could have a tube pass first through a Nb zone, then into a Cr zone and then into a Mo zone so there is uninterrupted flow of the process and continuous inline production can be accommodated.

Another option includes having anode electrodes or corresponding target sections that serve as the return electrode path for a HiPIMS current and provide ground reference for floating ion potential and sheath propagation for ion energy control.

One option is to have linear target materials positioned in a hexagon or polygon axially down the length of the sputtering chamber with individual addressing to each target for active cathode and anode. This allows re-sputter material to collect on the corresponding electrode for collection and reuse. Movable shields can be used in such a scenario. The simplest arrangement, including a linear feed through multiple cylindrical ring zones has a greatest potential with ZIRLO rod passing through. Batch processing of multiple tubes can be accommodated with this technique with several tubes suspended in the inverted magnetron configuration for coating.

Alternatively, a more conventional approach using rotary sputtering targets or planar targets can be used for sputtering on a planetary tube fixturing device to rotate in/out multiple tubes for continuous layer deposition and uniformity by rotating.

One potential benefit is actinic multilayer inspection using soft-x-rays for Bragg reflection to gauge layer thicknesses and interface quality for rapid screening of film quality in addition to thickness. X-Ray Fluorescence and other non-destructive inspection meanscan also be used in material composition and elemental ratio analysis.

HiPIMS layers can inhibit the formation of eutectics that are detrimental for Zr alloys. Nb/Cr/Mo layered structure may be provided for inhibition of the 1333° C. Zr—Cr & 1576° C. Zr—Mo eutectic at a ZIRLO® interface.

Advanced ceramic nanolayer formulations, concepts and functionally-graded coating architectures can be made that provide oxidation-resistance, corrosion-resistance, improve stiffness, provide diffusion barriers and rate limiting steps for degradation.

The reactive-HiPIMS with a positive kick pulse allows tailored ion energy control and annealing of the films, promotion of certain phase, nanocrystallinty, etc.

Nanocomposite layers of (Nb/Cr/Mo, NbN/CrN/MoN, SiC/ZrC, SiC/Zr$^{11}$B$_2$) and stabilizing materials (e.g. ppm La, Y) can be spatially modulated to build a functionally-graded superlattice with "engineered" maximum defect size and stress relief. Modulated nanolayers allow variation of hardness and elastic modulus for tradeoff in the stiffness vs. toughness factor important for managing thermal gradient. Hall-Petch strengthening, interface broadening and dislocation-slip impedances from each successive multilayer enhance the coating. Compositional gradients to eliminate abrupt transitions in thermal, elastic and plastic mismatch across interfaces to markedly reduce thermal and residual stress at critical crack nucleation sites. Stoney formula coating adherence through the thermal gradient. Improved sliding contact may be achieved by stopping indentation and herringbone frictional sliding.

Using precision control of ion and neutral particle flux, energy, direction and fluence to treating a substrate allows the coating designer the ability to functionally-grade a region such that that as that region experiences thermal stress from temperature increasing, the film gets stiffer. Alternatively, the tensor coefficient of thermal expansion (CTE) can be better matched so that there is less thermal stress over a greater range of operation. Thin and thick engineered films can be deposited to provide a structural element for holding cladding or a fuel pellet tighter to limit ballooning and bursting under accident conditions or higher fuel burn up. Another implementation is to provide a structure to slowdown creep with HiPIMS film and grain size and grain morphology; nano composite layers can have less creep by design.

The proposed sputtering systems is highly adaptable to various particular manufacturing needs. Multiple sputter electrodes (guns) may be used to coat and grow film. The system is adapted to facilitate changing pulse rate, conditions to grade a material composition to add an alloy, add a stabilizer, or change process condition on the fly. As will be detailed later, an important and desirable aspect in processing is limiting the time between processing steps to minimize contamination and introduction of defects into the underlying film, interfaces and deposition.

The system is adapted to apply thin layers for rescission stops, etch stops, and/or crack propagation stops. The system can also provide chemically engineered barriers for diffusion and migration. The system is adapted to make superlattice layers of alternating semiconductor/metal so affect the electro-migration potentials and diffusion-transport driving potentials to slow them down for oxygen migration under high-temperature locating. Take advantage of Seebeck/Thompson effects for restorative potentials to limit movement of ions.

In a particular application of the improved coating provided by the apparatuses and processes described herein, the system provides enhanced coating performance and improvement under accident/fault conditions to enable a nuclear power plant to operate at higher linear heat generation rate. The Westinghouse AP1000 reactor is NRC licensed at 5.7 kW/ft. The reactor balance of the system is capable of handling much higher values. However, limits are set based on accident tolerance and fault conditions. As stipulated in 10 CFR 50.46, under a loss of cooling accident (LOCA) the peak cladding temperature cannot exceed 1204 C, oxidation less than 17% of cladding thickness, H$_2$ generation is less than 1 percent hypothetical maximum and viable cooling geometry must be maintained. Uncoated Zr-claddings are oxidized by high-temperature steam and undergo ballooning and burst above 700° C.—this is the limiting factor and the 5.7 kW/ft linear value is set based on the reactor trip time, thermal response and probability for cladding failure. However, advanced multilayer metallic/ceramic cladding provided by a Starfire IMPULSE™ and Positive Kick™ technology, could take oxidation resistance greater than 1300° C. and greatly slow cladding failure, provide greatly improved thermal stress and fracture toughness, add compressive strength to minimize ballooning/bursting, and enable higher linear heating values. Values greater than 7 kW/ft are not unreasonable with such accident tolerant fuel design and this equates to a greater than 25% increase in power generating capacity for existing commercial nuclear power plants with minimal change in infrastructure.

The material sputtering systems and methods described herein provide a pathway for further improvement in stress management affecting the entire balloon/burst, LOCA scenario for linear heat generation (power uprating) value proposition, etc.

Currently pending U.S. application Ser. No. 16/006,357, filed on Jun. 12, 2018, entitled "PULSED POWER MODULE WITH PULSE AND ION FLUX CONTROL FOR MAGNETRON SPUTTERING," (the contents of which are incorporated herein by reference in their entirety, including any references contained therein) describes a high-power impulse magnetron sputtering (HiPIMS) that enables high-throughput deposition of high-quality metallic and ceramic films. The described technology facilitates corrosion-resistant, wear-resistant nanocomposite and multilayer films for improved adhesion, stress control and fracture toughness. The voltage reversal feature (referred to as a Positive Kick™), increases deposition rate and provides a production process control (variable/feature) for adjusting an ion energy to control film micro/nanostructure and morphology onto any substrate—including insulating or temperature-sensitive materials. Starfire's IMPULSE™ can deposit nanoengineered metallic/ceramic layers that offer 3-10× improvement in managing thermal stress and resisting fracture. The technology works well in reactive sputtering environments for coating ceramic materials with low-cost metallic feedstocks and can leverage additional innovation in target utilization for a targeted cost of ownership that can meet the nuclear industry's price point of $30/unit ZIRLO™ tube. The Starfire HiPIMS+KICK technology is also transferrable onto future SiC ATF cladding concepts, such as General Atomics SiGA™.

Compared to other electrochemical techniques, cold spray and plasma thermal deposition techniques and conventional PVD, examples of the disclosure provide for greater control, conformality, and ability to tune processes at the nanoscale to milliscale.

Turning to FIG. 1, a high-level illustration is provided of an exemplary configuration (cross-section view) for treating a target object 100 in accordance with the disclosure. An outer enclosure 110 contains an array of magnetic assemblies 138 arranged around a sputter target material 101 within a vacuum environment 111. The array of magnetic assemblies 138 is immersed a cooling liquid 109, such as water, to provide a high capacity heat sink to facilitate maintaining a desired temperature of the magnets during operation of the system. The magnets of the magnet assemblies are, by way of example, high-strength NdFeB permanent magnets. A target holder 108 may serve as a thermal conduction path between the cooling liquid 109 and the sputter target material 101, and the target holder 108 may also serve as the barrier for the vacuum environment 111 to allow low-pressure and controlled flow of gas to provide production environmental control. The magnetic assemblies 138 can, by way of example, be rotated within the outer enclosure 110 to provide positional alteration of a magnetic field represented by a magnetic field lines (e.g. line 112 representing a magnetic field) over the sputter target 101 to shift sputtering sites (e.g. sputtering site 102) under dense plasma regions (e.g., dense plasma region 113) that generate sputtered ions and neutral particles 103 used in deposition and etching of the target object 100. A substrate 106 of the target object 100 is located within the vacuum environment 111 and is subject to bombardment from incident ions and neutral atoms 104, immersion in secondary concentrated plasma 131, controllable-energy energetic ions 169 from the Positive Kick and high-capture efficiency ions 164 resulting in conformality of deposition and thin-film coating 107. The inverted cylindrical magnetron depicted, by way of example in FIG. 1, allows for redeposition (see e.g., redeposition path 105 of material from source sputtering site to a secondary sputtering site) and increases utilization of the sputtered target material 101 for extended processing lifetime before needing change out of sputtering material for manufacturing.

High voltage electrical pulses are provided from an external power module, i.e. the IMPULSE®+Positive Kick directly to the sputter target 101 through application-suitable insulation and low-impedance connections (that will vary by manufacturing application). By enabling rotating of the magnetic assemblies 138, low-impedance electrical connections to the sputter target holder 108 may be provided for efficient power transfer and coupling. Rotating the magnetic assemblies 139 moves the sputtering sites 102 azimuthally around the sputtering target 101, thereby improving a deposition uniformity of the coating 107, managing wear on the sputter target 101 for extended lifetime, and minimizing the recycling of sputtered neutrals and ions 103 locally at the sputtering site 102. The magnetic fields 112 form magnetic nozzle/cusp like features (not shown) that result in plasma concentration 131 towards the center of the vacuum environment 111 to enhance sputtered neutral 103 subsequent ionization to become incident particles 1014 with the application of a Positive Kick 169 or DC bias voltage onto the substrate 106. The physical/structural configuration of elements illustratively depicted in FIG. 1 provides/facilitates a controlled deposition and etching in a single plasma processing reactor by promoting plasma immersion, magnetron sputtering, plasma immersion, highly-energetic ion etching, and conformal engineered coatings on substrates 106 such as nuclear fuel cladding materials.

Figure 2B:
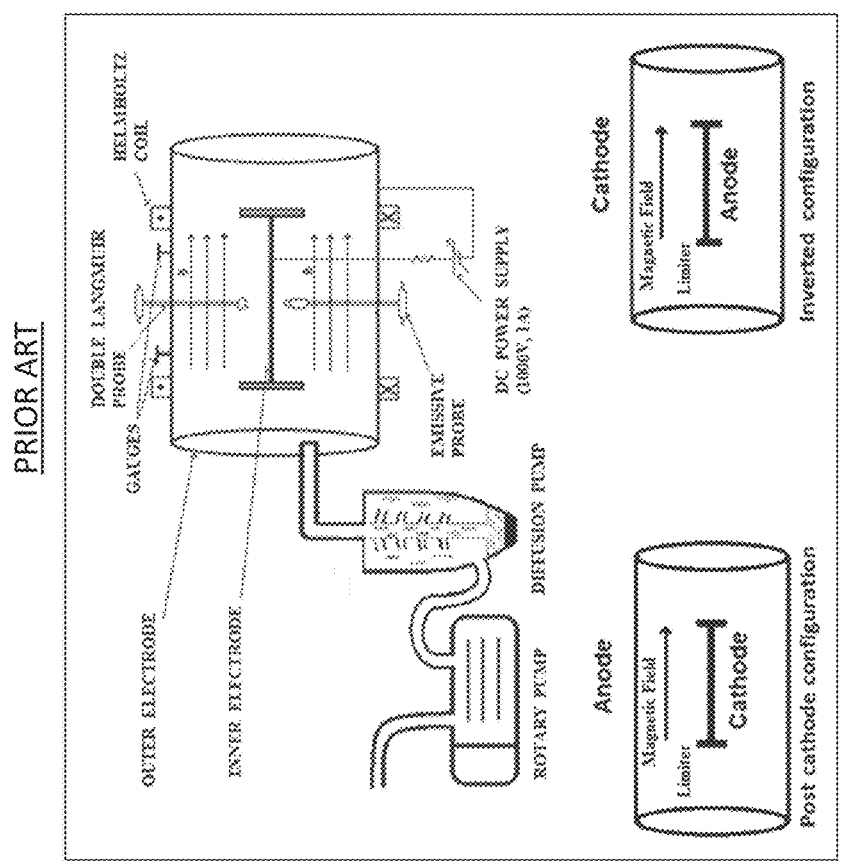
FIGS. 2A and 2B illustratively depict a prior art basic planar magnetron, inverted cylindrical magnetron with a single anode configuration and a post cathode configuration for sputtering.
Figure 2A:
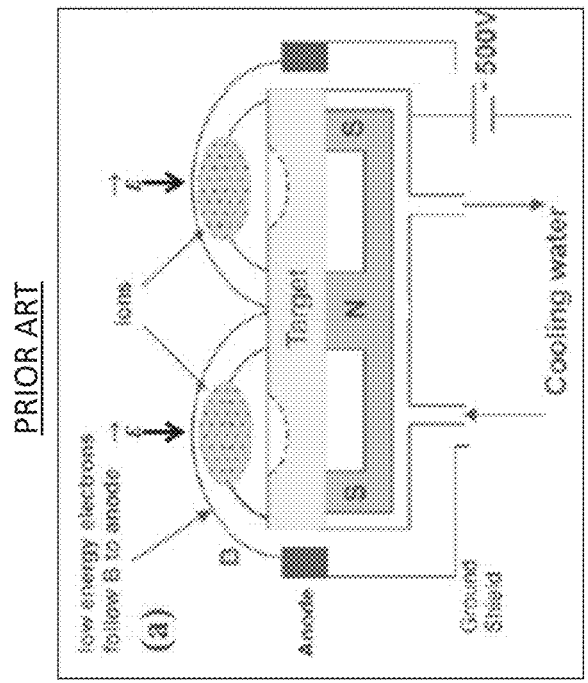

There is considerable background for magnetron sputtering and physical vapor deposition techniques, including cathodic arc, for the deposition of thin-films. FIG. 2A shows prior art for the basic planar magnetron highlighting the magnetic field confinement zone, plasma generation areas, target and magnetic pole pieces used to setup the plasma with the application of a negative voltage to the target electrode. For small sputter sources, permanent magnets are typically used to generate the resulting magnetic field. FIG. 2B highlights the basic cylindrical magnetron configurations using a post-type cathode or an inverted cylindrical setup with an axial magnetic field in a solenoid configuration driven with an external power supply.

Figure 3B:
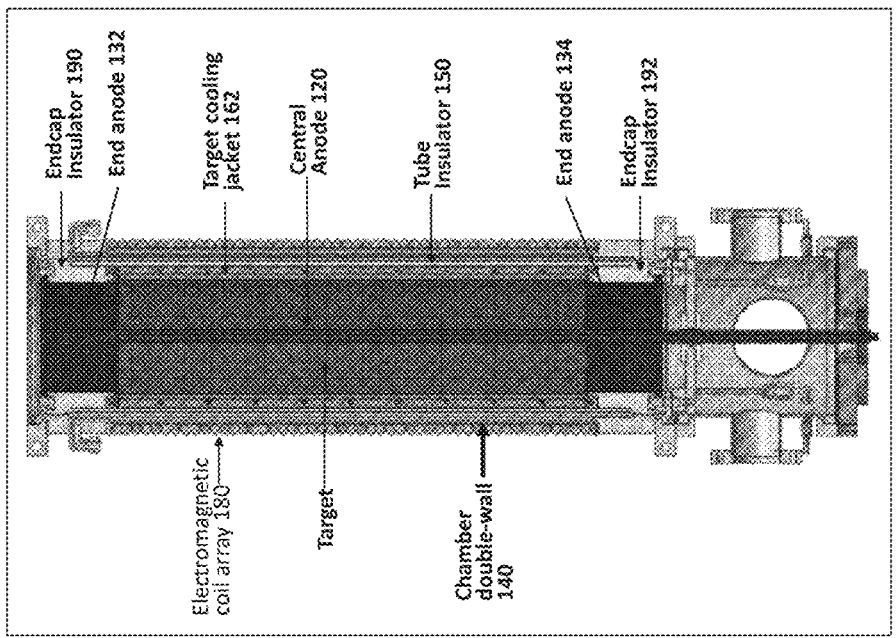
FIGS. 3A and 3B depict a prior art structure for an inverted cylindrical magnetron configuration.
Figure 3A:
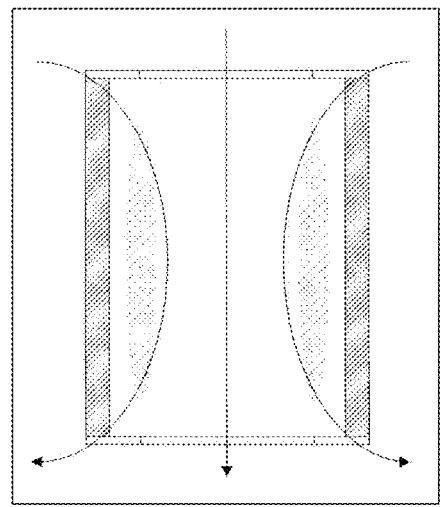

FIG. 3A shows the prior art by Glocker et al. for an inverted cylindrical magnetron with a central target electrode and two anode electrodes on either side separated by a limiter. The system utilizes two axial magnetic fields with electromagnetic coils. The hardware was commercialized by the Kurt J. Lesker company into the VIPR optical coating platform. FIG. 3B shows the three-anode system by Tianzong Xu et al. with externally-wrapped solenoidal electromagnetic coils. This system includes a third central anode running the entire length of the sputtering chamber. The system was commercialized by Vactronix Scientific for coatings for medical applications, i.e. in-vivo medical coils and wires. These systems are intended for conventional physical vapor deposition (PVD) sputtering with low ionization percentage and mostly sputtered neutral atom deposition with sputtering plasma distributed over the entire circumference versus a highly localized distribution of sputtering plasma as provided in the arrangement illustratively depicted in FIG. 1 due to local magnetic assembly concentration suitable for ultra-fast HiPIMS and positive voltage reversal.

Figure 4:
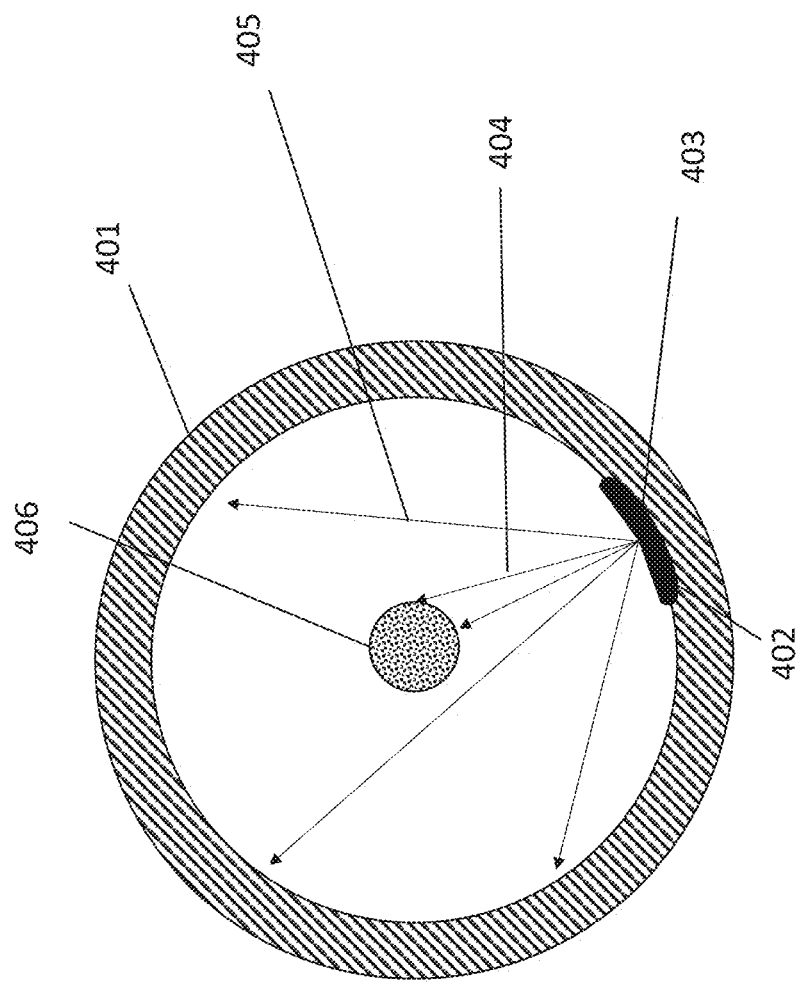
FIG. 4 illustratively depicts, in a transverse cross-section, details of an aspect of illustrative examples of the present disclosure for providing high-target utilization and resputter capture on opposite sides of the ICM target region.

FIG. 4 details an aspect of the present disclosure. A high-target utilization and resputter capture on opposite sides of the ICM target region are illustratively depicted. A sputtering target 401 has a local dense plasma formation and ion sputtering over sputtering location 402 resulting in the emission of sputtered ions and neutral particles 403. A portion of the ions and neutrals (e.g. ones following a path 404 to the target object surface) will be incident on the substrate 406 placed inside the vacuum environment. A remaining portion of the ions and neutrals are directed onto other regions of the sputtering target 401 for recapture (e.g. ion/neutral particle path 405). This results in efficient material utilization since material is efficiently reused—especially for long inverted cylindrical magnetron tubes where the length of the sputter target 401 is considerably more than the diameter from an aspect ratio perspective. For the inverted cylindrical magnetron sputtering system depicted in FIG. 4, the target electrode 401 has, for example, a target holder (not shown) that provides efficiency thermal contact with the target material in the vacuum environment and the cooling water on the outside environment. The target holder has, for example, O-rings, vacuum seals and insulators suitable for electrical attachments and preservation of the vacuum integrity.

Figure 5:
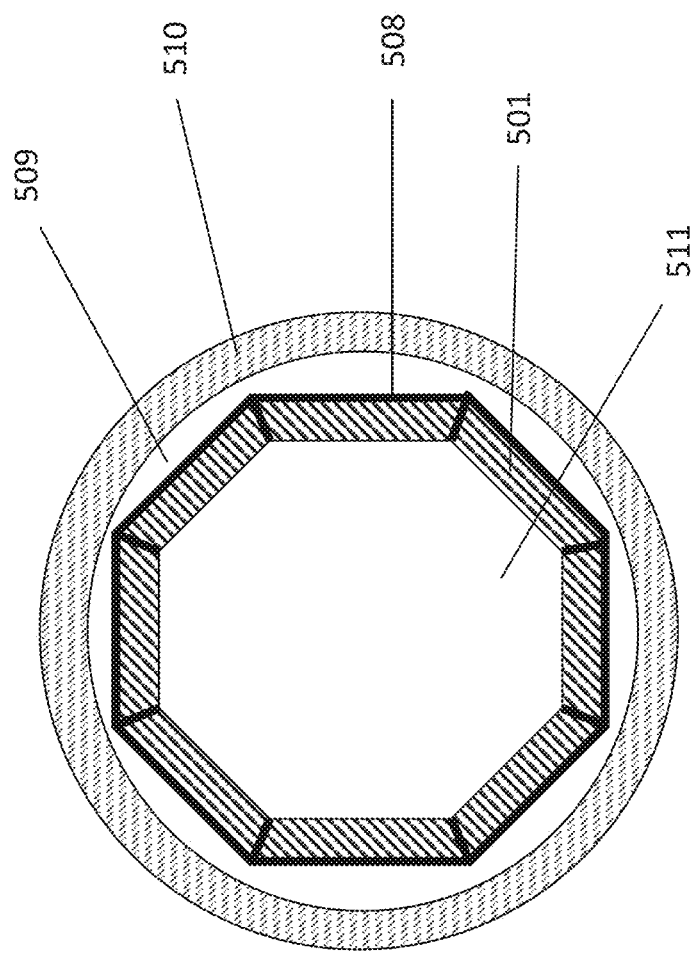
FIG. 5 illustratively depicts a configuration of an inverted cylindrical magnetron where the target electrode is comprised of individual segments that can be easily fabricated and joined together into a quasi-cylindrical shape.

FIG. 5 illustrates an embodiment of an inverted cylindrical magnetron where the sputter target electrode 501 is made up of a set of individual segments. The individual segments are, for example, fabricated and then joined together into a quasi-cylindrical shape of the sputter target electrode 501. A target holder 508 serves as a structural base/platform to: aid assembly of individual segments forming the sputter target material 501 into a quasi-cylindrical shape, maintain a vacuum seal for the vacuum environment 511, allow contact with the liquid cooling 509 environment, and aid positioning the sputter target electrode 501 in the enclosure 510. Using individual segments for the sputter target material 501 is a desirable manufacturability feature since inverted cylinders of expensive target material may be hard to obtain and it is easier to work with planar-like pieces. However, many configurations of the sputter target material 501 structure are possible.

Figure 6B:
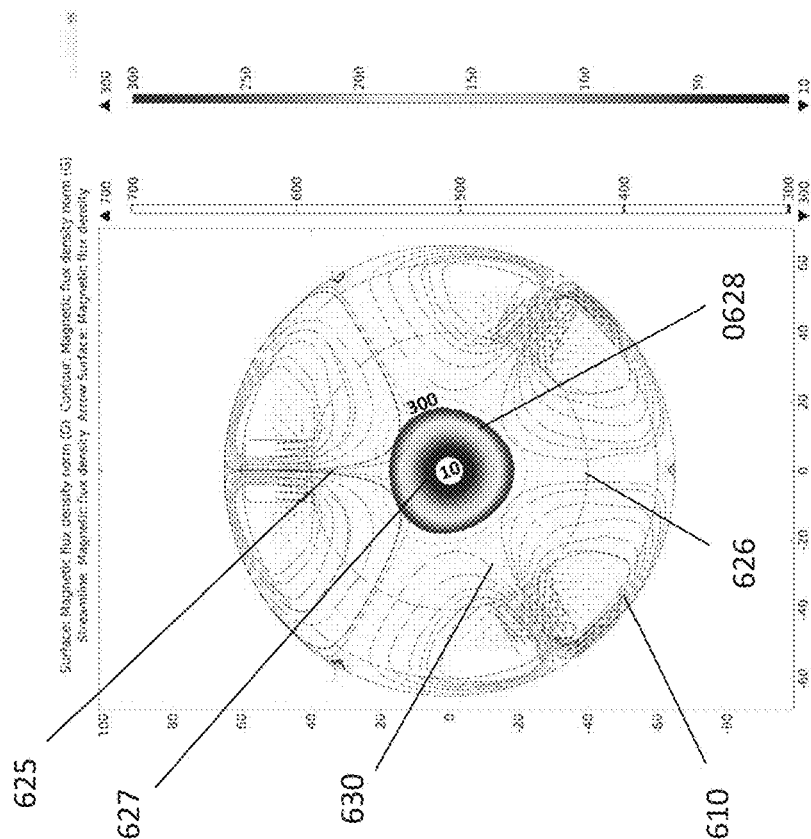
FIGS. 6A and 6B illustratively depict another aspect of the present disclosure where radial magnetic fields are used to establish both the magnetron effect for plasma formation and electron Hall Effect transport but also to form a magnetic null in the center of the inverted cylindrical magnetron for plasma.
Figure 6A:
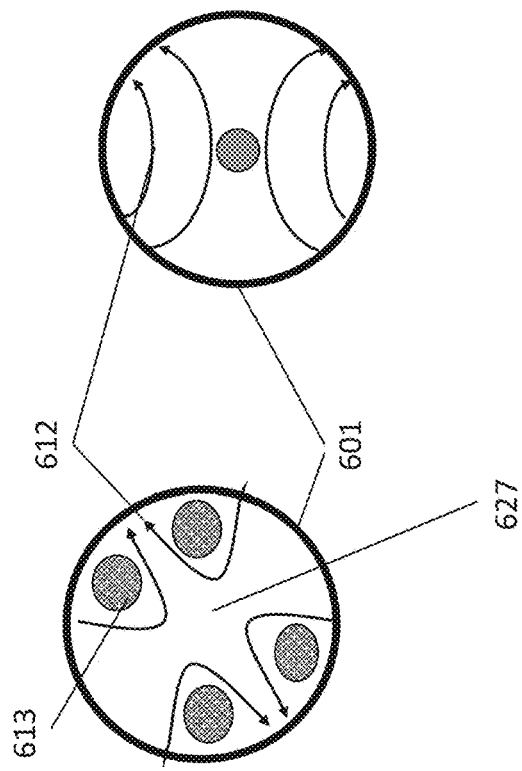

An aspect of the present disclosure is illustratively depicted in FIG. 6A. The inverted cylindrical magnetron configuration is established using radial magnetic fields that are used to establish the localized magnetron effect for plasma formation and electron Hall Effect transport. However, the inverted cylindrical magnetron configuration also facilitates/enables: forming a magnetic null in the center of the inverted cylindrical magnetron for plasma accumulation for higher ionization, utilizing sputtered material, and immersing substrates to be coated for superior formed surface conformality. Magnetic field lines 612 define regions for high density plasma 613 at several locations around a sputtering target 601. The magnetic fields 612 are poled such that they generate a magnetic null or minimum 627 on the centerline as a place to allow secondary plasma accumulation and additional ionization. In operation of the system, low-temperature electrons in the vicinity of the magnetic null 627 are weakly confined retarding ion transport through ambipolar diffusion. This combination of resulting features serves to provide plasma immersion and concentration to any substrates in the magnetic null or minimum 627 region. In the case of the diagram where there is not a central null, the magnetic field lines there generate a continuous large area raceway for electrons terminated at the ends by either magnetic bottle (with high B) or by large volume low density plasmas in low B by means of accelerated raceway electrons and ions.

FIG. 6B is a COMSOL model highlighting magnetic B-field polarization 625 from three magnetic assemblies position azimuthally around an enclosure 610. An opposite B-field polarization 626 is seen in the magnetic flux return paths alternating between the magnetic assemblies. A magnetic nozzle/cusp effect 630 is generated in multiple locations reinforcing the magnetic null or minimum 627 in the center of the system. Magnetic contours 628 are highlighted in the color shaded legend varying from 300 Gauss to less than 10 Gauss over the region. The magnetic null or minimum 627 provides a source for additional plasma generation, concentration and localization to assist with sputter deposition and etching of the substrate for thin-film processing particularly when coupled with the ultra-fast HiPIMS plasma generation process with the IMPULSE® and the Positive Kick rapid voltage reversal for directed ion energy and conformal plasma sheath development.

Figure 7:
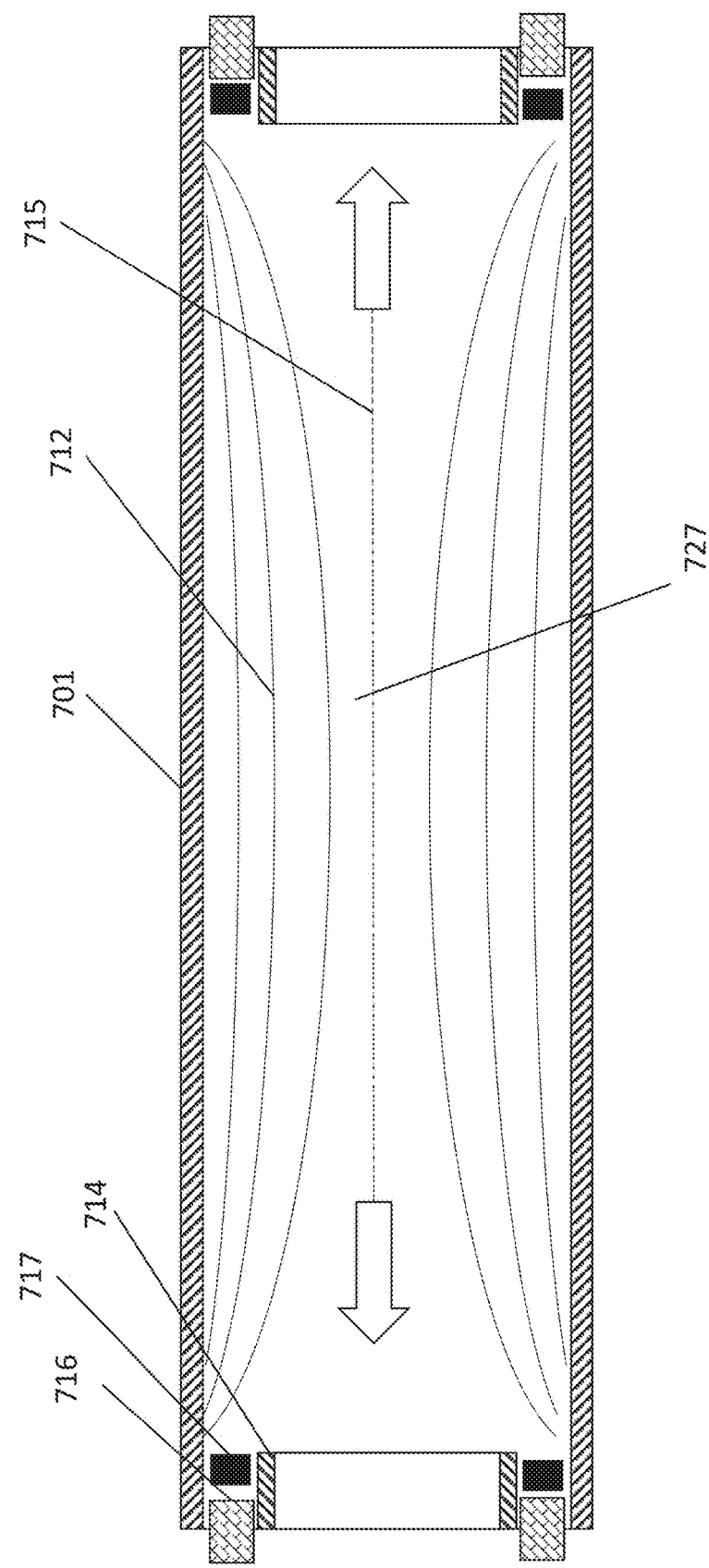
FIG. 7 illustratively depicts a cross-sectional side view of an example of the present disclosure showing the magnetic field concentration near the target electrode sidewalls and centerline magnetic minimum.

FIG. 7 illustratively depicts a longitudinal cross-section (i.e., side) view of the structure shown in a transverse cross-sectional view in FIG. 1 of an apparatus in accordance with the present disclosure. FIG. 7 shows a magnetic field concentration near the target electrode sidewalls and centerline magnetic minimum for plasma accumulation to form a low-impedance virtual anode and path to commute pulse current to the return electrodes located on either end of the cylindrical structure depicted in FIG. 7. A sputter target electrode 701 has 1 or more magnetic assemblies (not shown) providing radial and axial magnetic field lines 712. A magnetic null or minimum 727 near the centerline of the cylindrical structure creates a virtual electrode 715 for low-impedance current return along the axis to a set of return electrodes 714 located at the ends of the apparatus depicted in the longitudinal cross section view in FIG. 7. The return electrodes 714 are isolated from the sputter target electrode 701 by insulators 716 that are in turn protected against deposition by shields 717. The shields 717 can be replaced during programmed maintenance cycles at target electrode 701 change out. During intense ultra-short pulsed plasma operation using IMPULSE HiPIMS with the magnetic cusp effect from the magnetic field 712 there is a considerable plasma generated on axis and concentrated to yield a virtual electrode 715 current path to complete the electrical circuit. This eliminates a need for a physical electrode running down the centerline axis.

Figure 8:
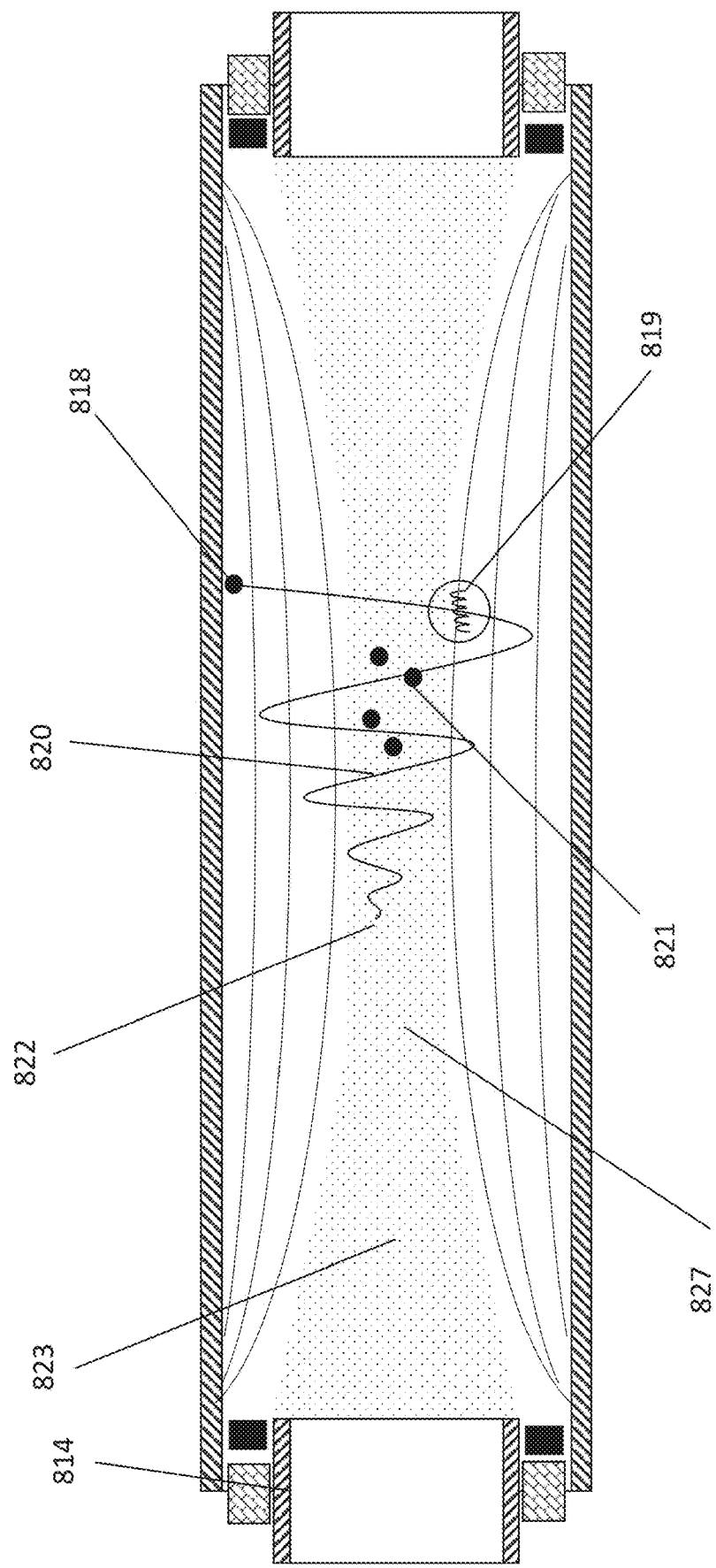
FIG. 8 illustratively depicts an improved plasma accumulation and power utilization achieved, in accordance with the disclosure, by harnessing electron reflexing energy transfer for enhanced ionization and plasma generation on axis.

FIG. 8 further expands on the features discussed herein above with reference to FIG. 7. In particular, FIG. 8 illustratively shows plasma accumulation and power utilization by harnessing electron reflexing energy transfer for enhanced ionization and plasma generation on axis for lower pressure operation, improved ion fraction, conformal deposition and target utilization during operation of the disclosed apparatus. Secondary electrons 818 liberated from the sputtering target surface or the dense plasma region (not show) are accelerated away from a sputtering target towards the virtual electrode along the centerline executing Hall trajectories as illustratively depicted by a path 819. Because of the inverted cylindrical magnetron setup, the electrons (e.g. electron 818) reflexes off the opposite side of the chamber (as indicated by 820) and collide with background gas, sputtered metal and ions causing further ionizations 821 and a local bulk plasma generation 823 near the centerline. The additional bulk plasma 823 is located in the magnetic null or minimum 827 and has a low-impedance path to the return electrodes 814 to complete the electrical circuit. The electron reflexing (indicated by 820) is analogous to the hollow cathode effect for DC discharge devices except that it feeds the bulk plasma on the centerline in the magnetic null or minimum 827 to support the virtual electrode 715 illustrated in FIG. 7.

Figure 9:
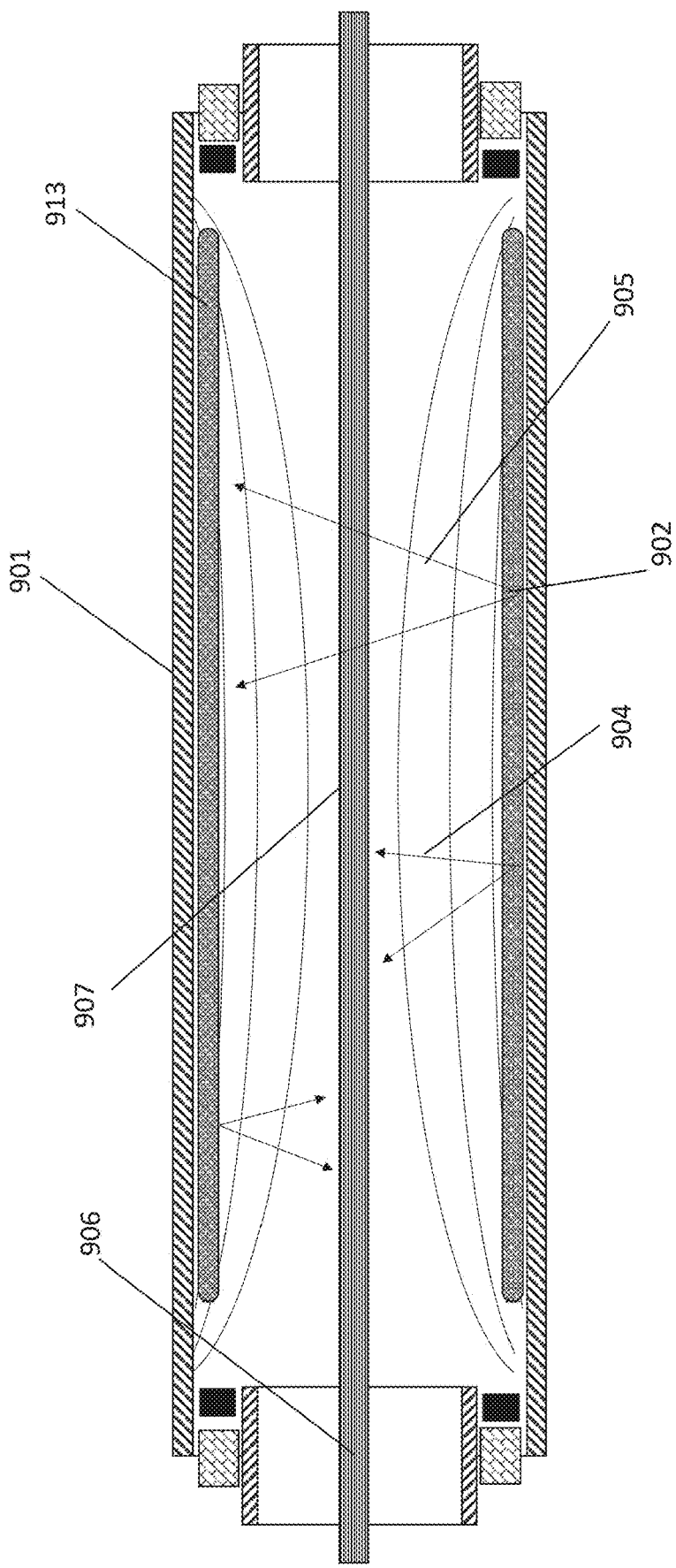
FIG. 9 illustratively depicts an inverted cylindrical magnetron processing module with center-fed substrate(s) passing along the axis highlighting the 360-degree coating process and resputter utilization.

FIG. 9 further expands on the features depicted in FIG. 8. In particular, FIG. 9 illustratively details the inverted cylindrical magnetron processing module with center-fed substrate(s) passing along the axis highlighting the 360-degree coating process, dense plasma region for sputtering, and resputter utilization suitable for nuclear fuel cladding coating manufacturing. The ultra-short IMPULSE HiPIMS voltage-current pulse generates a dense plasma layer (region) 913 near a magnetic field assembly (not shown) proximal to a sputter target 901. Ions from the dense plasma region 913 impact the sputter target 901 at a location 902 and generate a sputtered ions and neutrals 903 that either are incident (as indicated by 904) onto a substrate 906 or are resputter captured (as indicated by 905) onto a different location of the sputter target 901. Due to the ultra-fast pulsed nature of the plasma generation and HiPIMS process in the dense plasma layer 913, the applied voltage onto the sputter target 901 is localized adjacent to the dense plasma layer 913. The plasma potential drop is sustained because of the time required for the electric potential to diffuse across the magnetic field lines and the impedance difference between the return electrode and virtual electrode highlighted in FIG. 7. Applying the Positive Kick pulse similarly takes advantage of the impedance and diffusion timescales to commute potential across magnetic field lines. The substrate 906 is subsequently coated with thin-film 907 on the surface. The substrate 906 is, for example, fed into and through the inverted cylindrical magnetron reactor via an application-suitable conveyor/holder/actuator apparatus. The substrate 906 can also be connected to a bias power supply for the application of a DC or pulse bias for additional charge collection and ion impact energy for deposition or etching.

Figure 10:
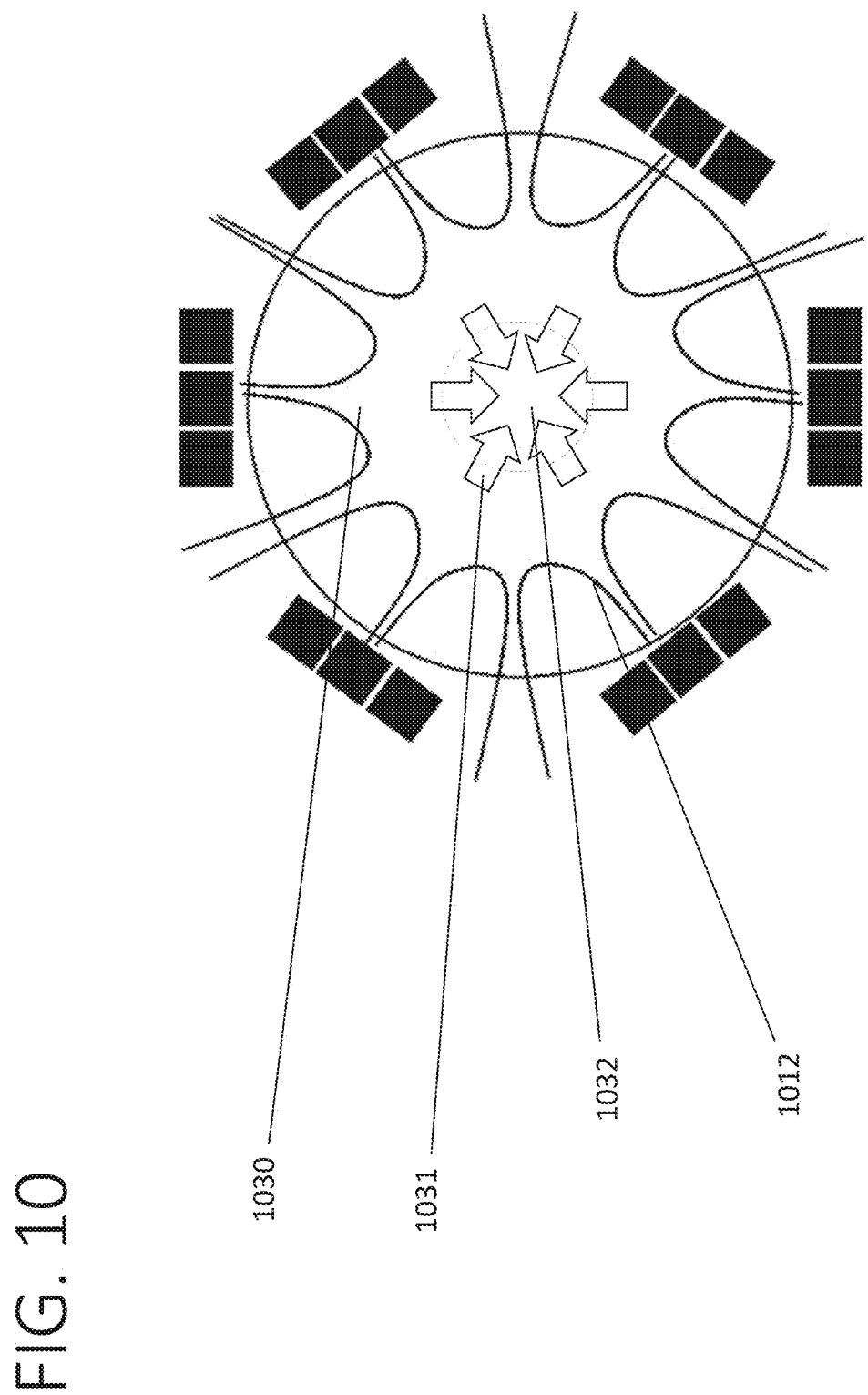
FIG. 10 illustratively depicts an aspect of the disclosure of utilizing magnetic cusps to direct low-temperature plasma onto the centerline to obtain a high fraction of ions captured onto the substrate from an ambipolar well.

The symmetrical nature of the illustrative configuration of the inverted magnetron sputtering system is detailed in FIG. 10 that illustrates another aspect of the disclosure—utilizing magnetic cusps to direct low-temperature plasma onto the centerline of the chamber to obtain a high fraction of ions captured onto the substrate from an ambipolar well. Magnetic fields 1012 are shaped and arranged for a magnetic nozzle/cusp effect 1030 that generates a Grad B force term that focuses/propels electrons away from the higher magnetic field region. The nozzle/cusp effect 1030 has the result of plasma concentration 1031 in the magnetic null or minimum 1027 located. The net effect is an additional ionization of background gas, sputtered neutral metal and additional charge used for Positive Kick effects and conformal deposition or etching on the substrate immersed in the region.

Figure 11:
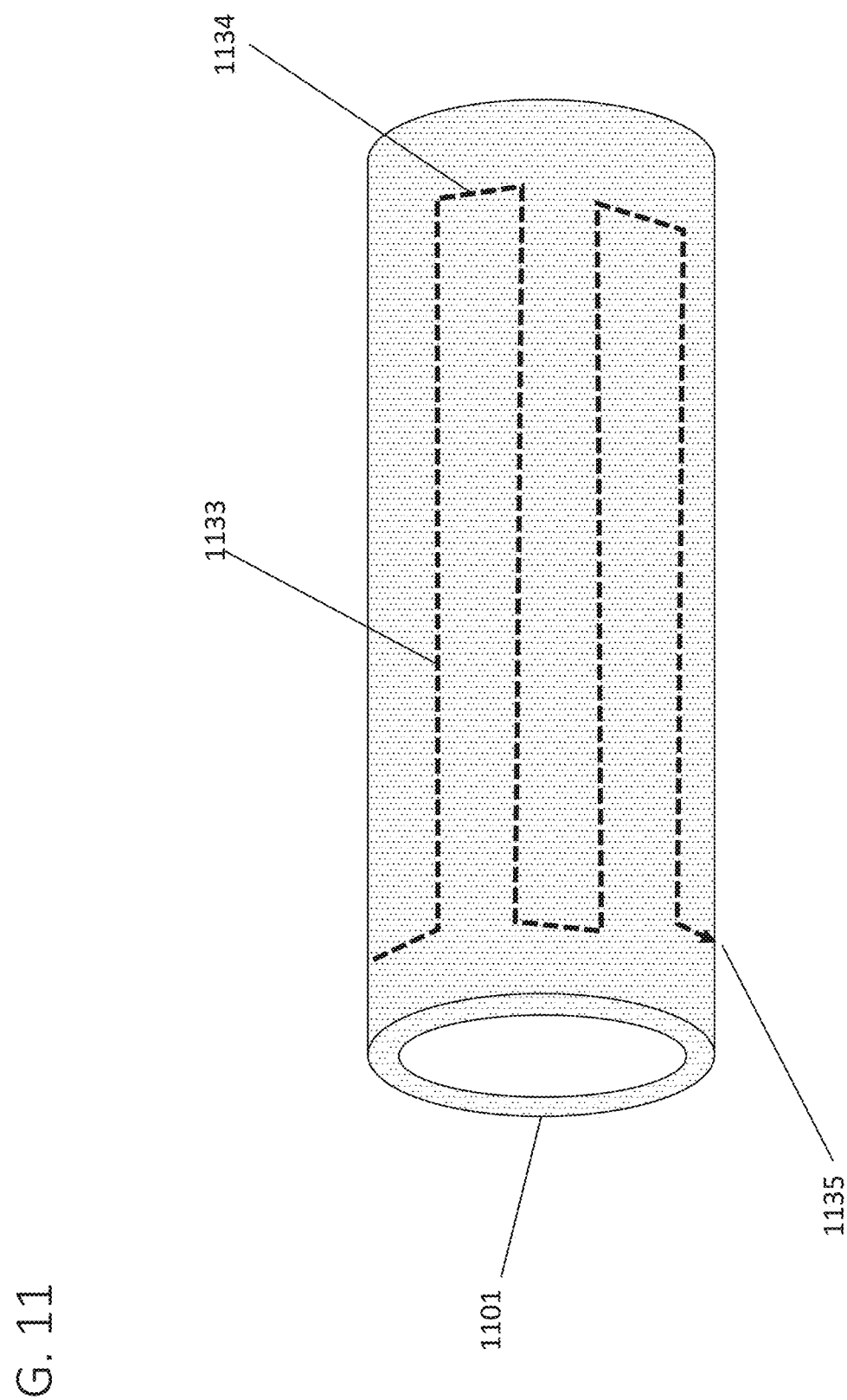
FIG. 11 illustratively depicts an example of using a single continuous serpentine magnetron path that goes around the target electrode, e.g a Greek Key shape path.

Another aspect of the present disclosure, illustratively depicted in FIG. 11, involves using a single continuous serpentine magnetron path 1133 extending around and surrounding a sputter target electrode 1101, e.g. a Greek Key shape 1134. The continuous loop 1135 allows electrons to and discharge current to balance around the entire inverted cylindrical magnetron. The spacing of the Greek Key shape 1134 enables a customization for determining an amount of plasma coverage over a surface of the sputter target electrode 1101. In the configuration shown in FIG. 10 with six (6) magnetic assemblies resulting in 12 distinct dense plasma regions, the effective HiPIMS instantaneous coverage on the surface of the target is between 33-50 percent. There is a trade off in engineering design between plasma coverage percentage area (i.e. length of 1134 section vs. circumference of the sputter target 1101), versus peak current densities for ionization fraction percentage, versus thermal heating and capacity of the target material, and the magnetic nozzle/cusp plasma concentration effect.

Figure 12:
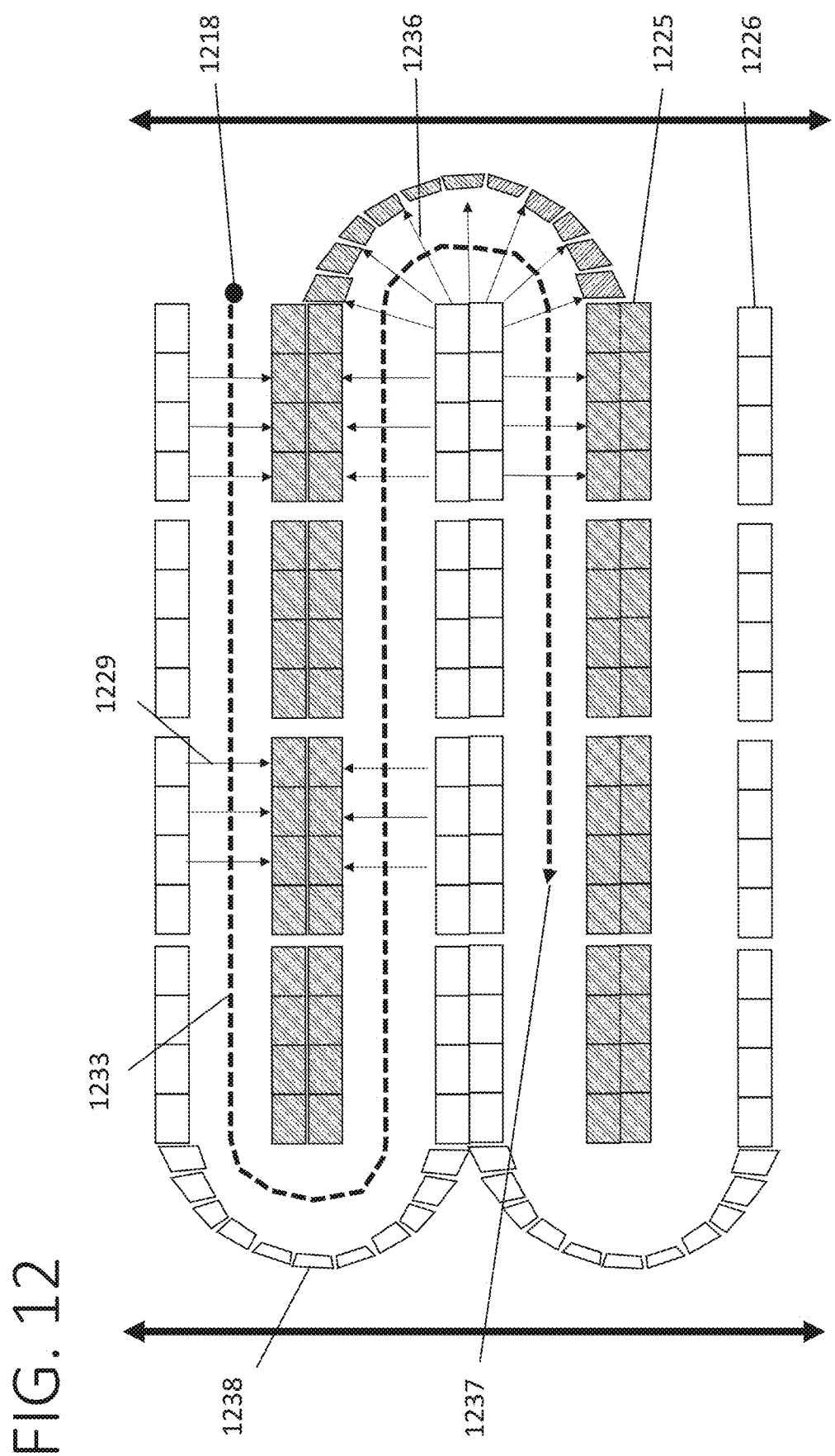
FIG. 12 illustratively depicts, in greater detail, a magnetic pack geometry to facilitate the serpentine magnetron path that will generate the B-field.

Turning to FIG. 12, further details are provided regarding an illustrative example of a construction geometry and arrangement of magnetic assemblies within the overall magnetic pack to facilitate the serpentine magnetron path that generates the B-field for electron Hall-Effect drift, plasma generation, sputtering and tailored end curvature for target erosion uniformity. In FIG. 12 an electron 1218 follows a Hall trajectory along a magnetron racetrack (as indicated by a path 1233). Magnetic assemblies are poled in one direction in first poled assembly 1225 and paired with an oppositely poled assembly 1226 to generate a desired/required magnetic field for the ExB Hall Effect drift direction 1229 and confinement necessary to sustain the potential drop across the sputter electrode. To account for longer Greek Key sections to spread out the serpentine continuous racetrack, turnaround profile magnetic assemblies (e.g. turnaround assembly 1238 is magnetically tailored (as indicated by the directed indicator arrow 1236) to produce a desired plasma density change relative to a centerline of the main closed racetrack (indicated by 1237) over the axial sections. The entire magnetic pack is, for example, immersed in a liquid coolant, situated proximal to the sputter target electrode and any target holder and can be arranged to potentially be rotated relative to the target material surface to improve uniformity and operational stability.

Figure 13B:
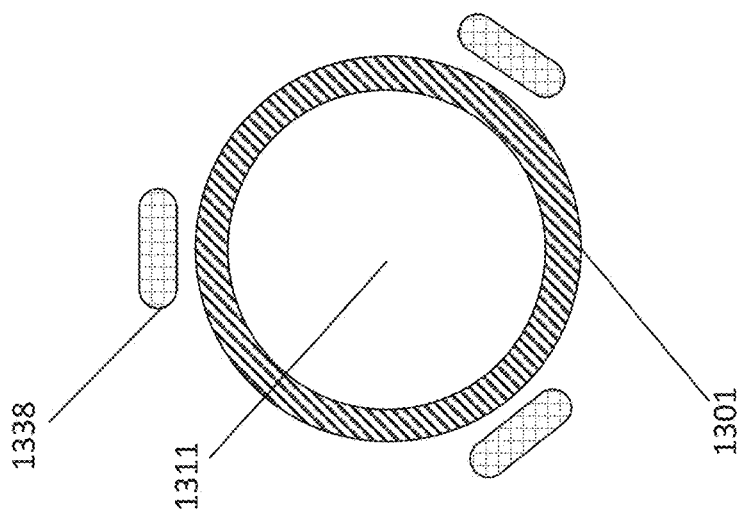
FIGS. 13A and 13B illustratively depicts an example of the disclosure with 1 or more (3 shown here) circular, rectangular or other continuous loop is utilized to generate magnetic fields above the target electrode.
Figure 13A:
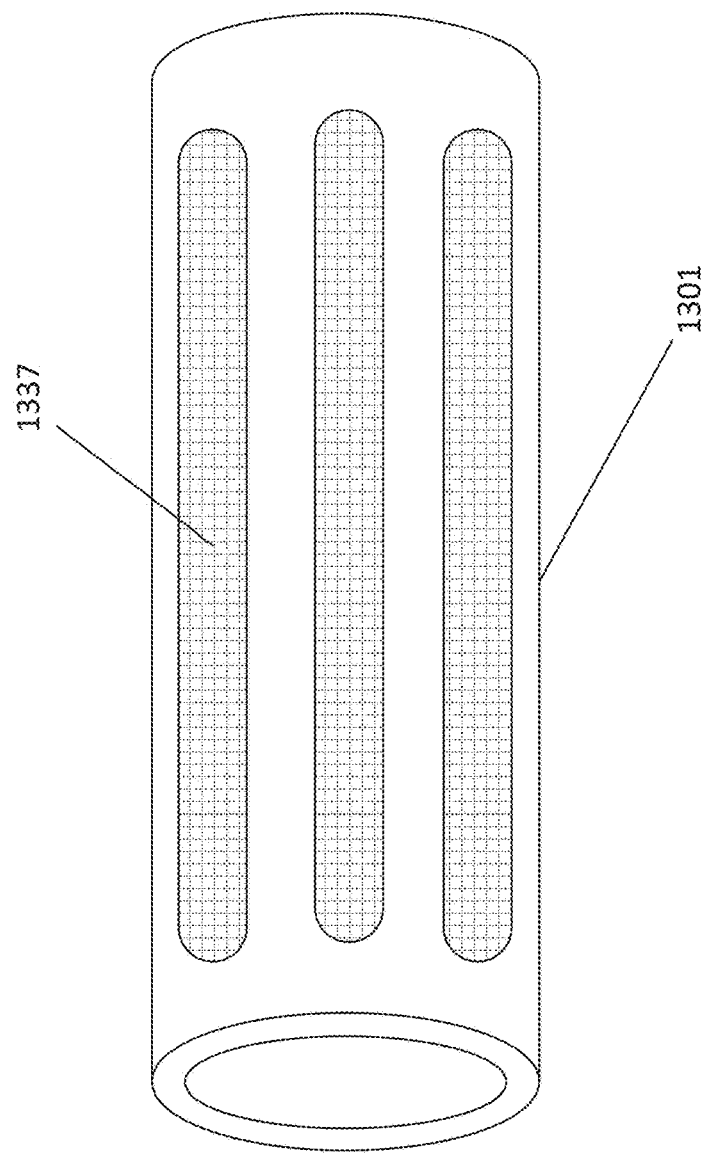

FIGS. 13A and 13B provide a further illustrative example of the disclosed apparatus described herein, that includes 1 or more (3 shown here) discrete closed loop racetracks (e.g. rectangular or other closed loop) that do not travel around the cylindrical magnetron—acting as a separate sputter source(s) that are uncoupled. A standalone magnetic assembly 1338 is utilized to generate magnetic fields above a sputtering target 1301 (electrode). Each discrete closed racetrack 1337 is positioned relative to others in the system to achieve the desired magnetic effect inside the vacuum environment 1311. This scenario is desired for one or two high-power magnetic assemblies 1338 suitable for high-power IMPULSE currents and dense plasma generation with some magnetic null or minimum on the centerline for Positive Kick deposition, immersion and etching while balancing power and thermal loading onto the sputtering target 1301. In one scenario less than 33 percent of the sputtering target surface would be covered with plasma allowing very high instantaneous current densities greater than 5 A/cm2 with high duty factor operation.

Further expanding on the description/disclosure of FIGS. 13A and 13B, FIGS. 14A and 14B illustratively depict how rotating the magnetic assemblies around the central axis or the physical rotation of the target electrode moves the dense plasma sputtering zone and target erosion around the inverted cylindrical magnetron sputtering system to achieve substantially greater than 50 percent target utilization, increased longevity and to keep the target sputtering more uniform. This is another aspect of the disclosure. In particular, as the magnetic assembly 1438, comprising a magnet field poled N 1425 connecting to magnets poled S 1426, rotates relative 1439 to the sputter target or the sputter target is rotated relative 1440 to the magnetic assembly 1438, the dense plasma zones 1413 sputter material from the target leaving target erosion 1441 and sweep an erosion profile azimuthally to generate erosion an spread 1442.

The effect of the rotation 1439 or 1440 is three fold. It spreads the wear on the sputter target 1401. It moves the dense plasma zones 1413 around to change the direction and source of sputtered ions and neutrals for more uniform substrate processing. It also minimizes the geometrical V groove on target electrodes that affects HiPIMS process stability over time.

FIGS. 14A and 14B illustratively depict an unbalanced magnetic configuration where the magnetic assembly 1438 is poled N-S and placed opposite another magnetic assembly that is oppositely poled (i.e. S-N). This has the effect of guiding some magnetic field lines 1412 through the center of a vacuum environment 1411 providing a pathway for plasma to commute across the device and bring additional ions to the substrate located in the center of the vacuum environment 1411.

Figure 15B:
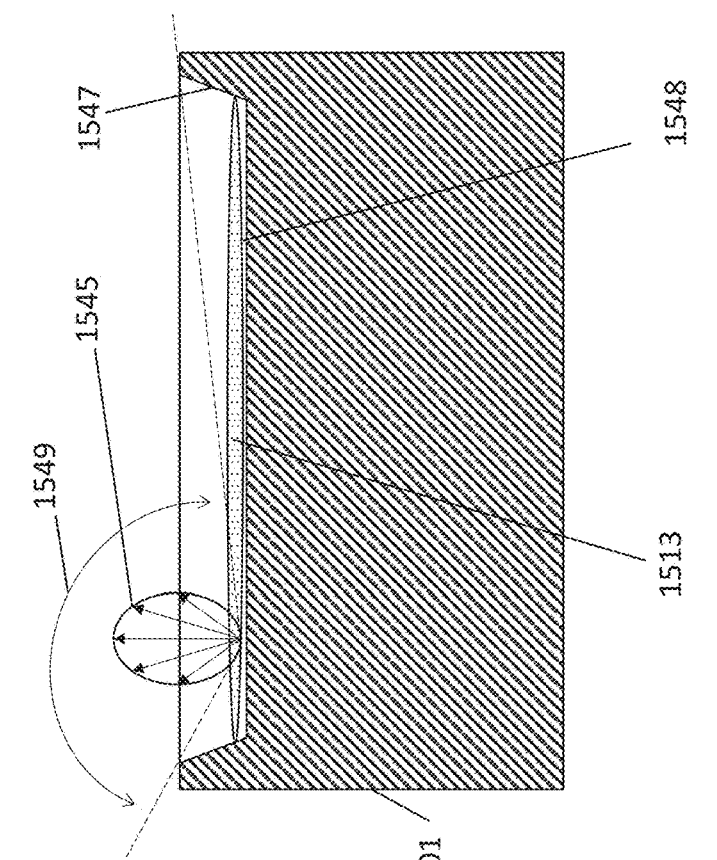
FIGS. 15A and 15B illustratively depict a negative aspect of conventional HiPIMS sputtering.
Figure 15A:
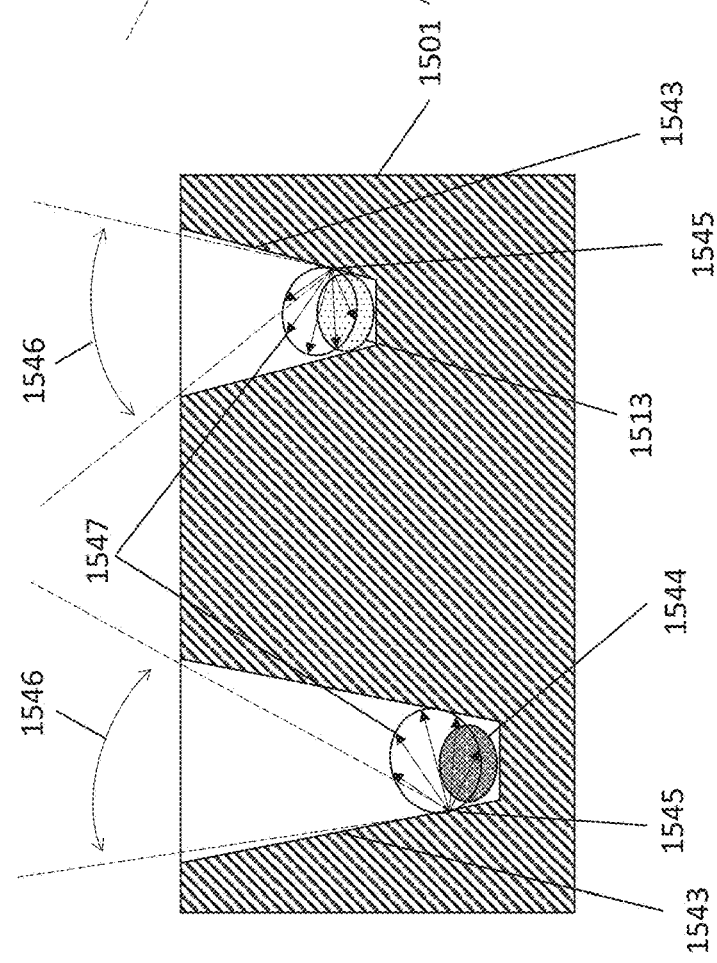

Expanding on the V groove effect, FIGS. 15A and 15B illustratively depict an effect exhibited in conventional HiPIMS sputtering on stationary targets—i.e. formation of deep V grooves which leads to higher target recycling, loss in efficiency and changing deposition parameters as the sputtering target ages. The disclosed apparatus and corresponding operation thereof, avoids the deep V grooving, maintains high solid angle acceptance minimal recycling and higher deposition rates, and improves process stability over time.

FIG. 15A depicts a sputter target 1501 subject to non-uniform erosion resulting in the formation of deep erosion V grooves (e.g. V groove 1543). The magnetic assemblies are located behind the target electrode 1501 and have correspondingly higher B-field deeper in the erosion V groove 1543. Once the V groove 1543 gets slightly deeper than another groove, the resulting plasma density will increase to be a very high density (as indicated by 1544) relative to the shallower neighbor density (as indicated by 1513). As a result, more plasma current flows in the deeper V groove 1543 resulting in more sputtering and more local erosion relative to other locations on the sputter target 1501. The sputtered material trajectory distribution 1545 will resemble a cosine to cosine$^2$ distribution depending on local factors and plasma conditions. As the V groove 1543 becomes relatively deeper in relation to a width of the groove 1543 (as indicated by 1545) the escape solid angle for sputtered neutrals and ions 1546 will get smaller and smaller from 2 pi steradians. This increases the recycling 1547 of sputtered material onto the sidewalls that leads to further reinforcing the deep V groove 1543 growth, limiting deposition rate, increasing power deposition in the deep groove 1543 and heating on the target electrode 1501. Traditional HiPIMS processes have higher sputtered atom recycling back to the target electrode and decreased deposition rates compared to DC magnetron sputtering. The decreased escape solid angle 1546 effect is just one aspect of process variation over the lifetime of a sputter target 1501.

In FIG. 15B, the same sputter target 1501 is illustratively depicted in a configuration that utilizes a rotating magnetic pack or rotating target electrode to shift the dense plasma zone 1513 distribution azimuthally around the target electrode has shown in FIGS. 14A and 14B. The dense plasma zone 1513 rotation spreads the erosion track 1542 and minimizes the height of any V grooving into a more uniform erosion profile 1548. In the inverted cylindrical magnetron setup with long axial length and small diameter, the end effects are small compared to the azimuth, leading to almost normal sputtered material trajectory distributions 1545 with very large escape solid angle 1549 with less material recycling 1547. This is another aspect of applying the disclosure to HiPIMS and high-current pulsed sputtering. The more uniform erosion 1548 results in less process variation, greater stability for deposition and improved performance in target utilization.

Figures 16A, 16B:
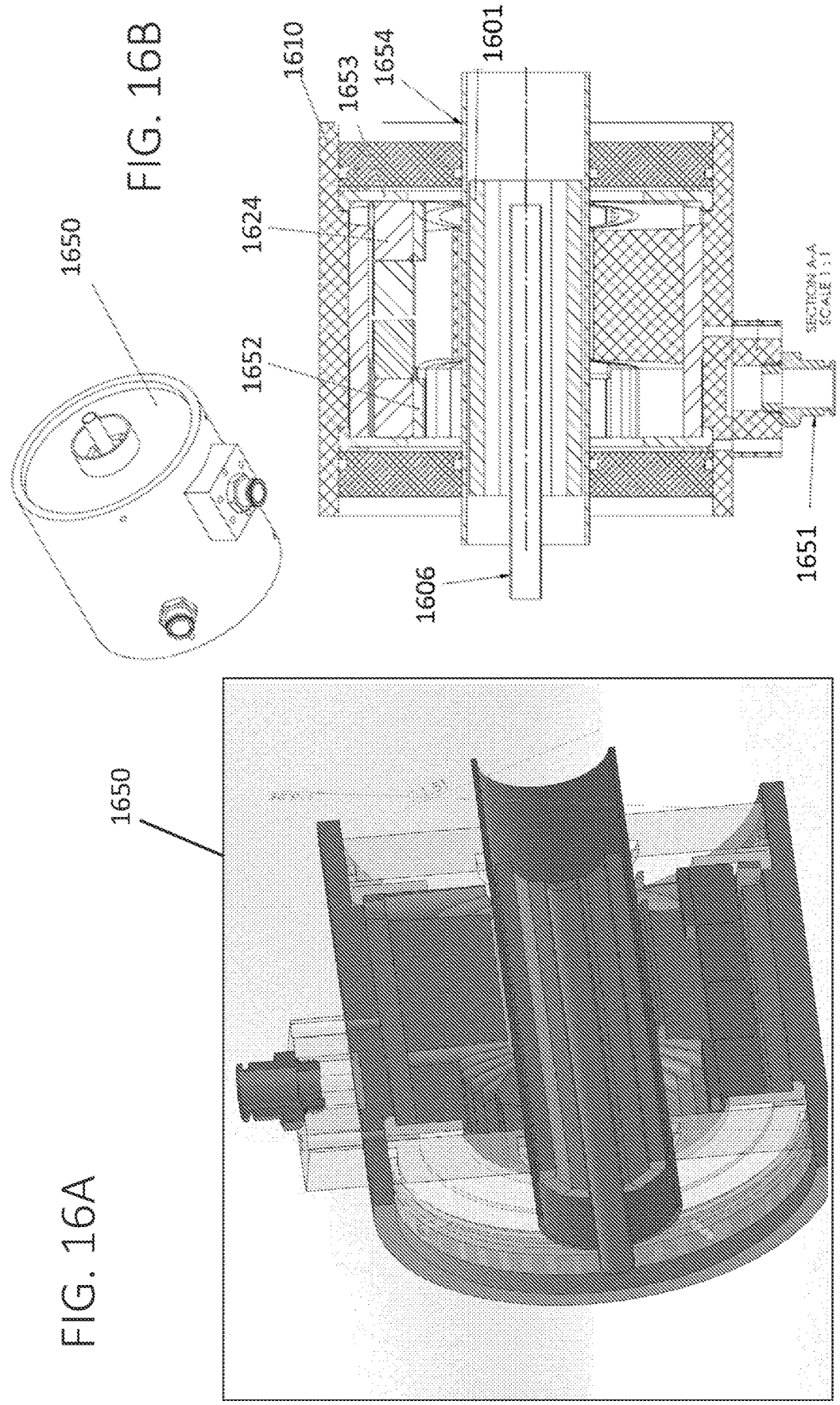
FIGS. 16A and 16B illustratively depicta cross-sectional solid model and cross-sectional view showing an example of the inverted cylindrical magnetron structure disclosed herein.

FIG. 16A is a CAD model and FIG. 16B is a cross-sectional view showing an illustrative example of the inverted cylindrical magnetron apparatus with water flow dually used to cool the hardware and drive the rotation of the magnets for target sputter uniformity. An inverted cylindrical magnetron head 1650 comprises an outer enclosure 1610 containing a vacuum chamber 1554 that also serves to mount a sputter target 1601 with its holder surrounding a substrate 1606 that is axially fed through a magnetic assembly region 1624 that is mounted to an impeller 1652 to drive the rotation of the magnets with water flow through ports 1651. Physical mounting and high-voltage insulation is provided by 1653 and integrated with the enclosure 1610. This embodiment represents close coupling of the magnetic assembly 1624 for small diameter vacuum environments.

Figure 17:
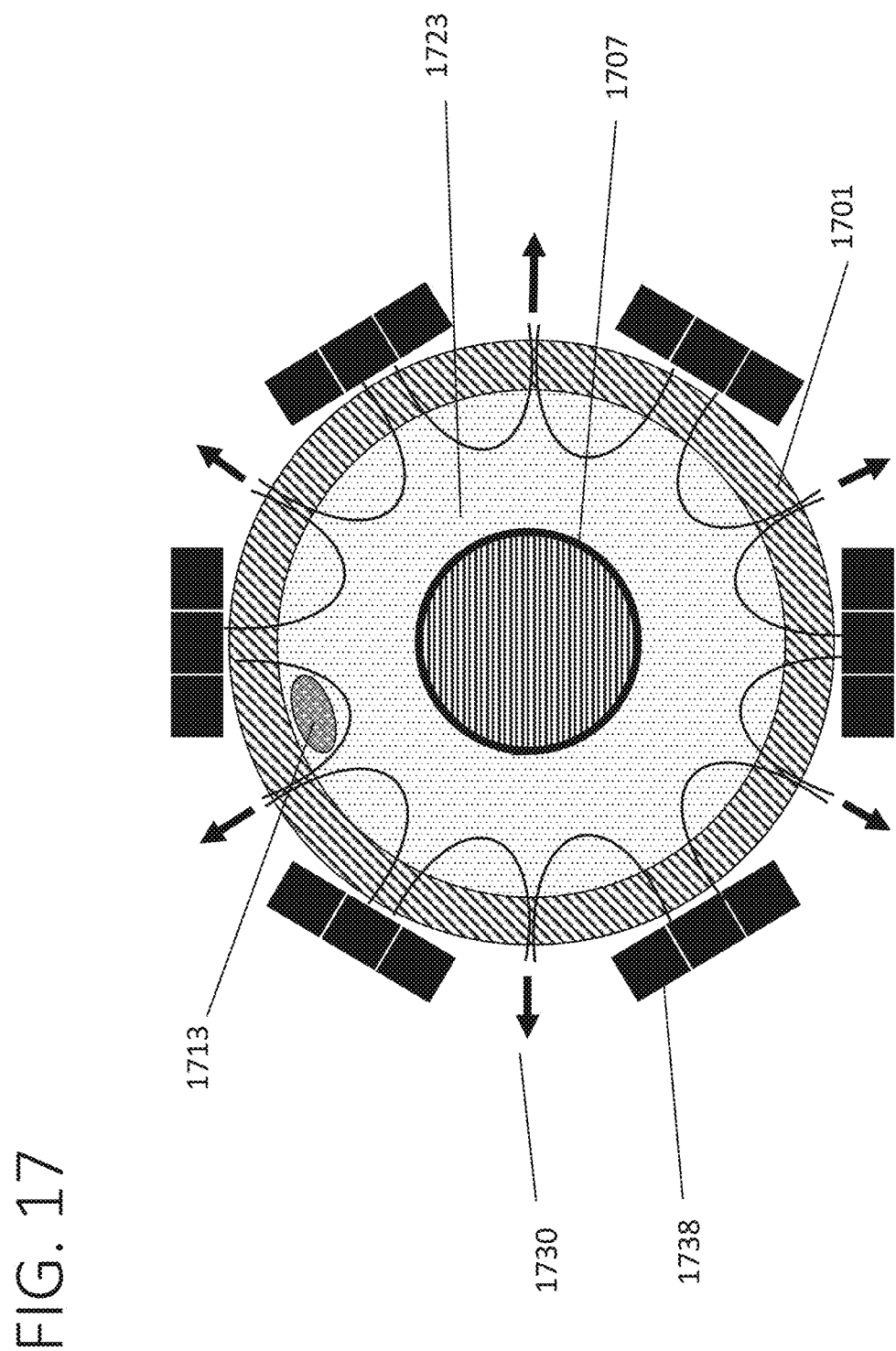
FIG. 17 illustratively depicts a view showing that close coupling is possible using a multi-cusp magnetic geometry to generate dense plasma regions for sputtering near the target electrode while generating a strong secondary plasma near the centerline for substrate immersion.

FIG. 17 illustratively demonstrates that close coupling (less than 4 inch diameter) is possible using a multi-cusp magnetic geometry 1730 to generate dense plasma regions (e.g. dense plasma region 1713) for sputtering near the target electrode 1701 while generating a strong secondary plasma region 1723 near the centerline for substrate immersion, low-pressure operation for metal mode operation, improved sputtering efficiency and high ion capture efficiency onto a substrate 1707 for surface processing and coatings. The high-strength multi-cusp geometry from multiple magnetic assemblies (e.g. magnetic assembly 1738) allow for high B-fields near the target electrode 1701 with a large magnetic null along the centerline for close coupling of the inverted cylindrical magnetron.

FIGS. 18A, 18B and 18C, in combination, illustratively depict using an ultra-fast high-power pulsed sputtering and subsequent rapid plasma potential reversal to guide and capture a higher fraction of sputtered ions for conformal deposition on the substrate. The basic operating principle of the IMPULSE HiPIMS systems is to generate a large amplitude negative voltage pulse 1855 applied to a target electrode 1801. The rapid electrical potential change drives a formation of a plasma region in the high B-field magnetic confinement zone over a surface of the target electrode 1801. The plasma rapidly builds in intensity as ions sputter the target electrode and release multiple secondary electrons that make subsequent ionizations and bootstrap into a dense plasma zone 1813. After sufficient sputtered atoms are liberated from the target electrode 1801 surface, the dense plasma zone 1813 becomes "metal dominated" as the number of sputtered metal target atoms dominates over other gas species. This is reflected in a HiPIMS current waveform 1858 with a peak and roll off as the plasma becomes metal dominated and saturates. Typical neutral energies of a few eV and ion energies of 2-20 eV are present as evidences from measurements of HiPIMS plasmas and a transit time 1861 of a few selected species are shown in the table for a 3" distance at 2 eV and 20 eV, on the order of 10-40 μsec. The effective metal plasma time is approximated from the peak and roll off in the current waveform 1858 plus the transit time 1861. A main negative voltage pulse 1855 is terminated and a positive voltage reversal is applied to drastically affect the potential structure within the vacuum environment going from negative 1865 to positive 1866. Transiting ions and subsequently ionized neutrals 1862 are now accelerated towards a substrate 1806 due to the presence of a retarding positive potential at the target electrode 1801. The Positive Kick has the net effect of funneling ions and plasma inside the inverted cylindrical magnetron towards the substrate 1806 for improved metal deposition and ion energy 1862 flow to the substrate that is controlled by the amplitude of the Positive Kick 1866. Note there are two distinct regions of the Positive Kick, a Short Kick 1856 and a Long Kick 1857. The Short Kick 1856 accelerates ions from the dense plasma region 1813 away from the target electrode 1801. The Long Kick 1857 deals with an evolution of a plasma potential into a bulk plasma region towards the substrate and return electrodes (not shown). The Short kick 1856 and the Long Kick 1857 is evident in the current waveform 1858 with distinct humps. Variations to the shape/duration of the short kick 1856 and the long kick 1857 to tailor and tune the desired ion and neutron fraction, etching vs. deposition, instantaneous particle (thermal) loading and effective ion energy. Such variations include changes to a peak current in the HiPIMS waveform 1858, onset of metal mode 1813, ion/neutral transit time 1859, deposition rate, short 1856 and long positive kick 1857 amplitude, any onset delay 1860 in the positive kick to separate ion acceleration from the dense plasma region 1813 vs. the bulk plasma region, pressure, power, magnetic field strength and number of cusps, etc. The IMPULSE+Positive Kick provides additional process variables for optimization of substrate and thin-film processing.

An effective strategy to utilize the present invention is to adjust the voltage waveform 1855 higher in magnitude to achieve peak current waveforms 1858 that represent greater than 1 A/cm2 effective current density on the sputter target and have a sufficient metal mode region 1813 in the waveform that ensures a high population of sputtered metal ions in the plasma and then a rapid transition into the short positive kick 1856 with minimal delay 1860 to accelerate as many ions towards the substrate 1801 as possible. The pulse repetition rate is then maximized to deliver as many positive kick pulses as possible to the substrate up to the thermal limitations of the system. The more positive kick pulses, both short and long, results in more ion flux 1862 being delivered to the substrate 1806, more dense plasma generation 1813 and ion multiplication in the bulk plasma 1823 to enhance immersion of the substrate 1806.

Figure 19B:
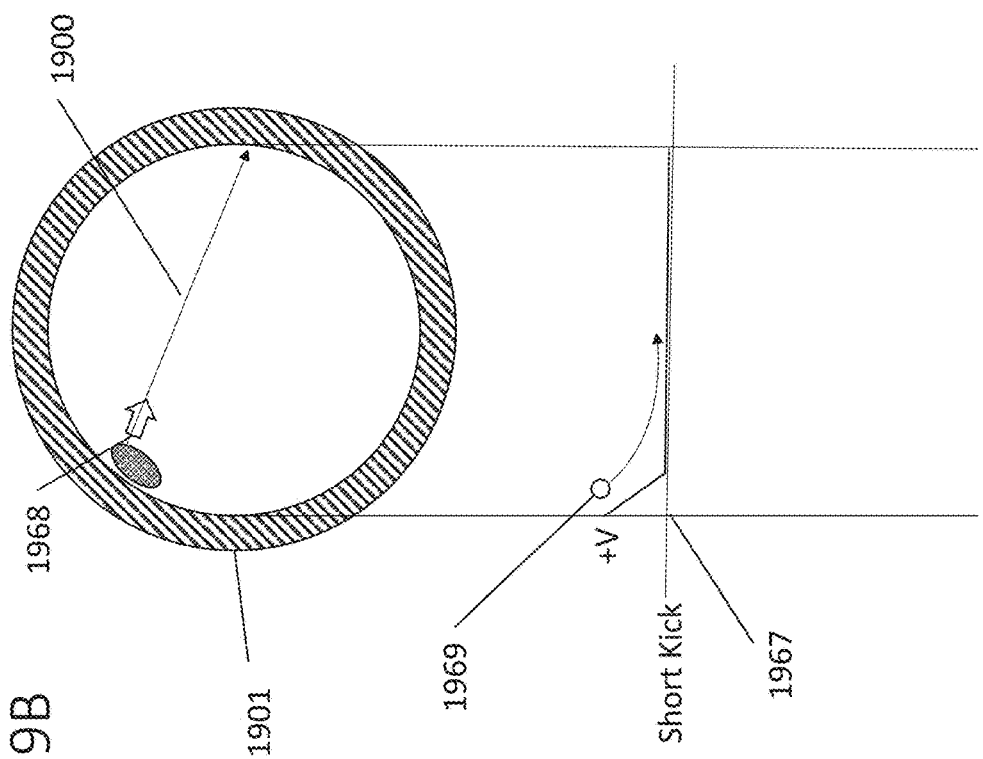
FIGS. 19A and 19B illustratively depict an advantage of a short kick pulse to accelerate ions from the dense plasma region near the sputtering target and subsequent deposition based on tunable energy given to the ions.
Figure 19A:
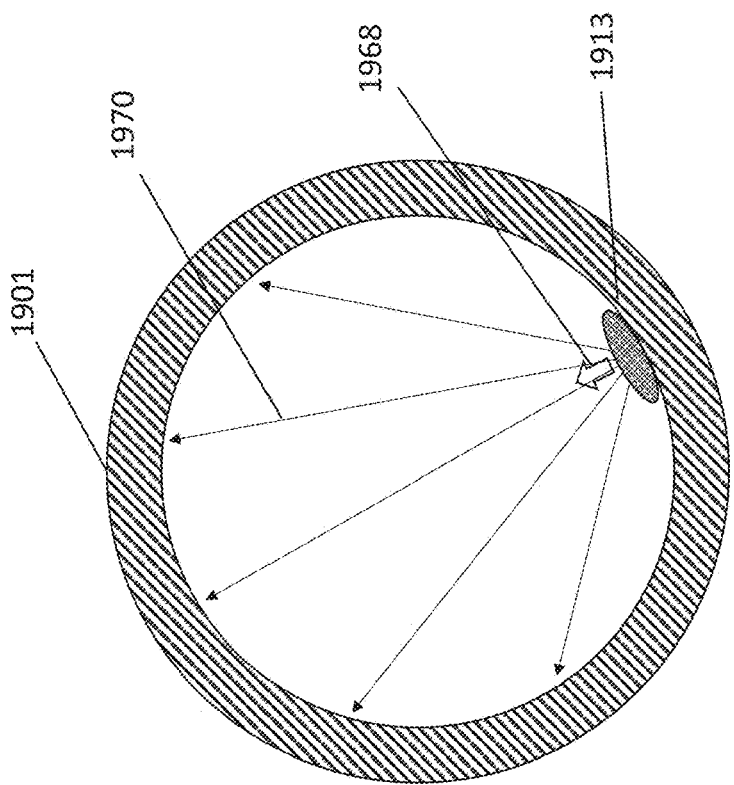

FIGS. 19A and 19B further expand on FIGS. 18A, 18B and 18C by highlighting the nature of a short kick pulse 1967 to accelerate ions 1970 from a dense plasma region 1913 near the sputtering target 1901 and subsequent deposition based on tunable energy given to the ions. The amplitude of the short kick 1967 leads to accelerated ions from the dense plasma region 1913 with a controllable energy 1969. If the Positive Kick pulse is terminated quickly, only the ions near a magnetic confinement zone 1968 will be accelerated away. The trajectories of these short-kicked ions is approximately perpendicular to the B-field resulting in a spread of ions on trajectories 1970. These ions will transit the vacuum environment and impact the opposite side or interact with a substrate for surface modification. A benefit of the Positive Kick pulse is that an energetic redeposition mitigates dust formation on a surface of a sputter target 1901 by forcing bonding and implantation. This minimizes loosely bound dust particles and their migration that can fly off and land on substrates forming pinhole defects on deposited thin-films that can affect performance.

Figure 20:
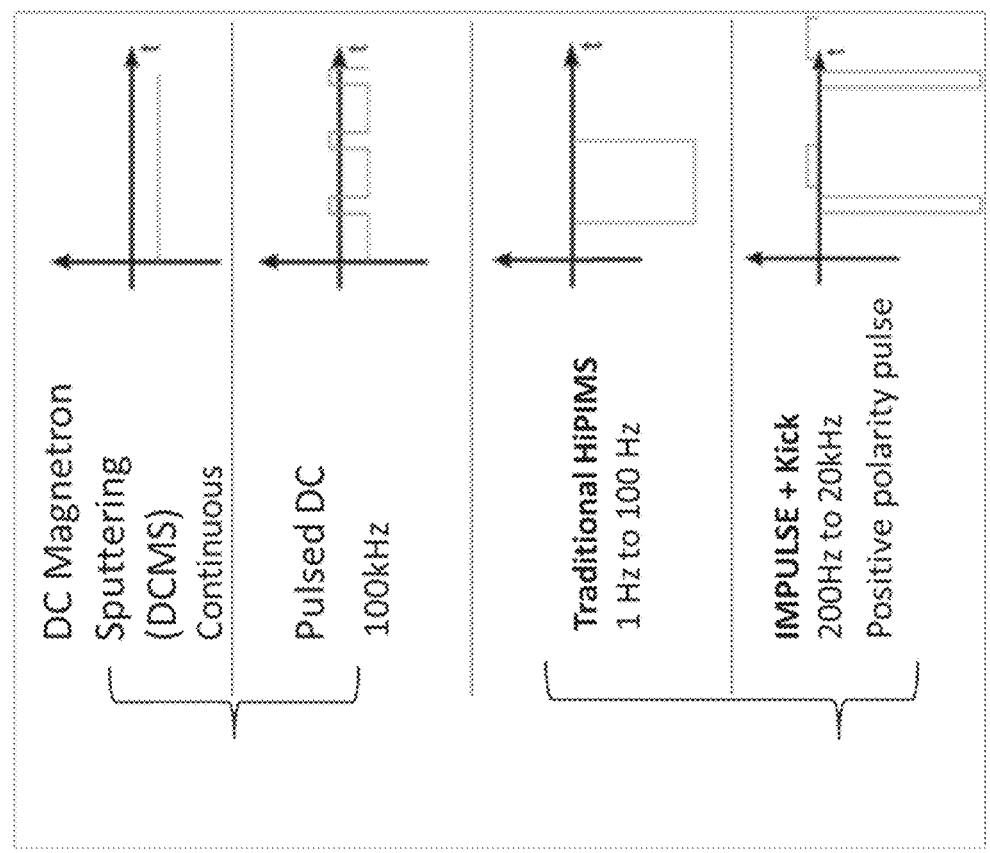
FIG. 20 highlights the distinctions between an IMPULSE+Positive Kick and prior art power supply signal.

FIG. 20 illustratively depicts a comparison of traditional DC magnetron sputtering (low current, low ionization), pulsed DC (lower current, low ionization but better for reactive gases), traditional HiPIMS (high current, high ionization but low deposition rates), and IMPULSE+Positive Kick (high current, higher ionization rates and higher deposition rates). Typically HiPIMS plasma current densities are ~0.3 A/cm2. Using an ultra-fast impulse followed by a Positive Kick pulse can exceed 3 A/cm2 with good film properties and is used as a factor in designing the inverted magnetron structure for high peak powers for more intense ionization, conformal plasma etching and deposition.

Figure 21:
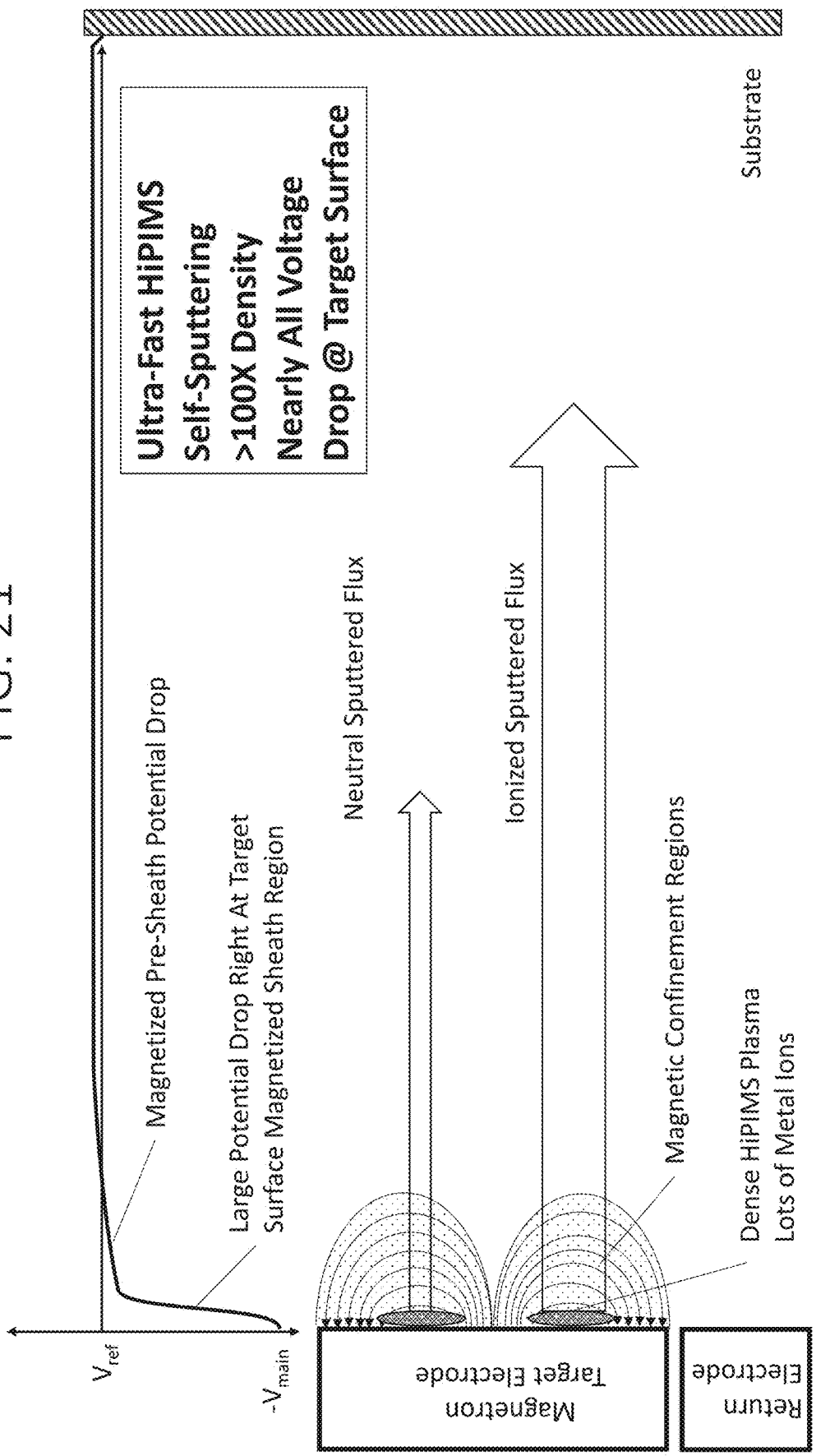
FIG. 21 illustratively depicts an ultra-fast high-power impulse magnetron sputtering and the potential distribution between the sputter target and the substrate.

FIG. 21 is adapted from US20180358213A1 and illustratively depicts an ultra-fast high-power impulse magnetron sputtering and the potential distribution between the sputter target and the substrate.

Figure 22:
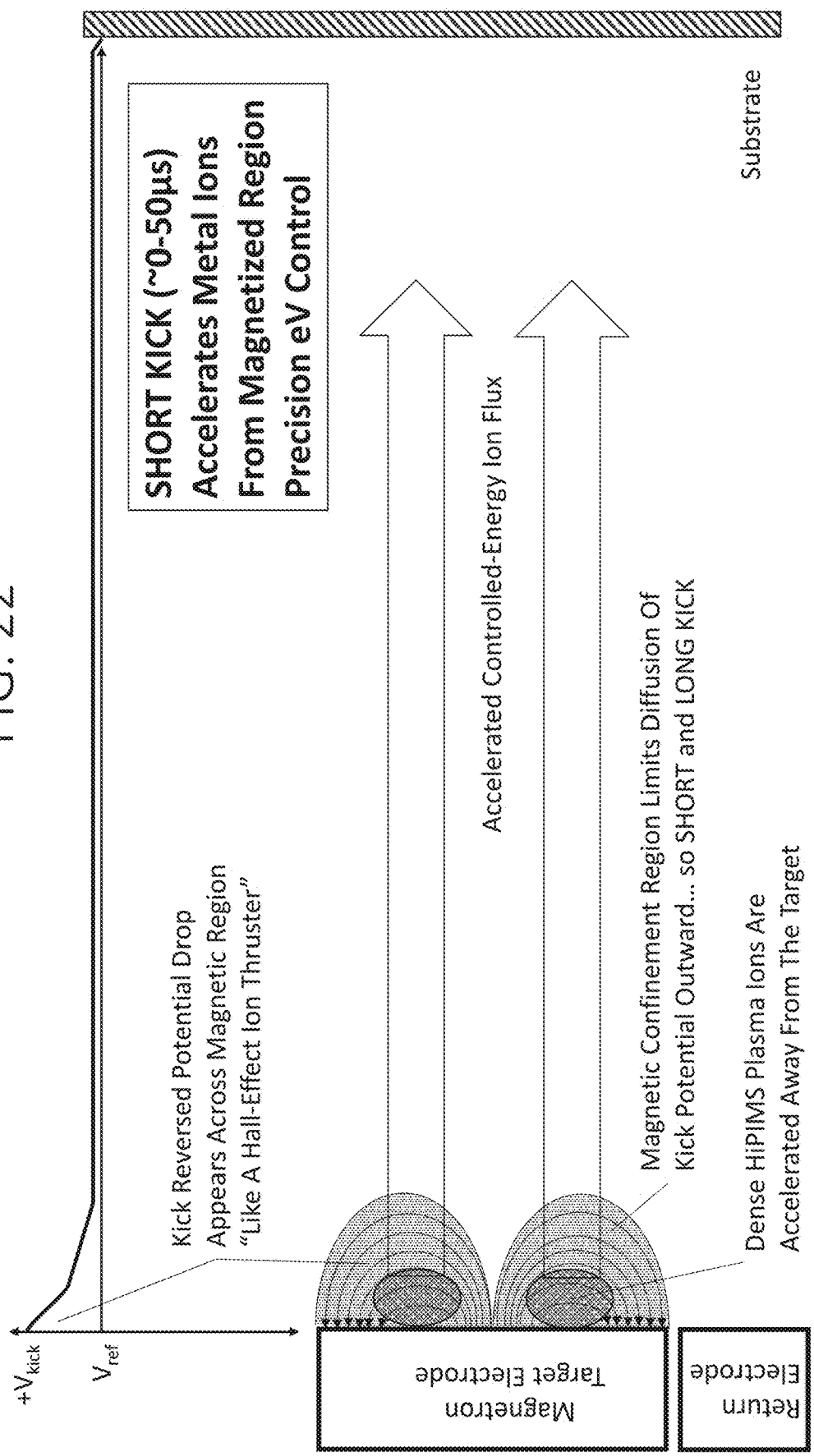
FIG. 22 illustratively depicts an ultra-fast switching and positive voltage reversal on the target electrode to a positive voltage and the evolution of the potential distribution across the magnetic confinement region near the target electrode.

FIG. 22 is adapted from US20180358213A1 and illustratively depicts anultra-fast switching and positive voltage reversal on the target electrode to a positive voltage and the evolution of the potential distribution across the magnetic confinement region near the target electrode—the Short Kick accelerating ions from the dense HiPIMS plasma region away from the target electrode typically perpendicular to magnetic field lines along grad B.

Figure 23:
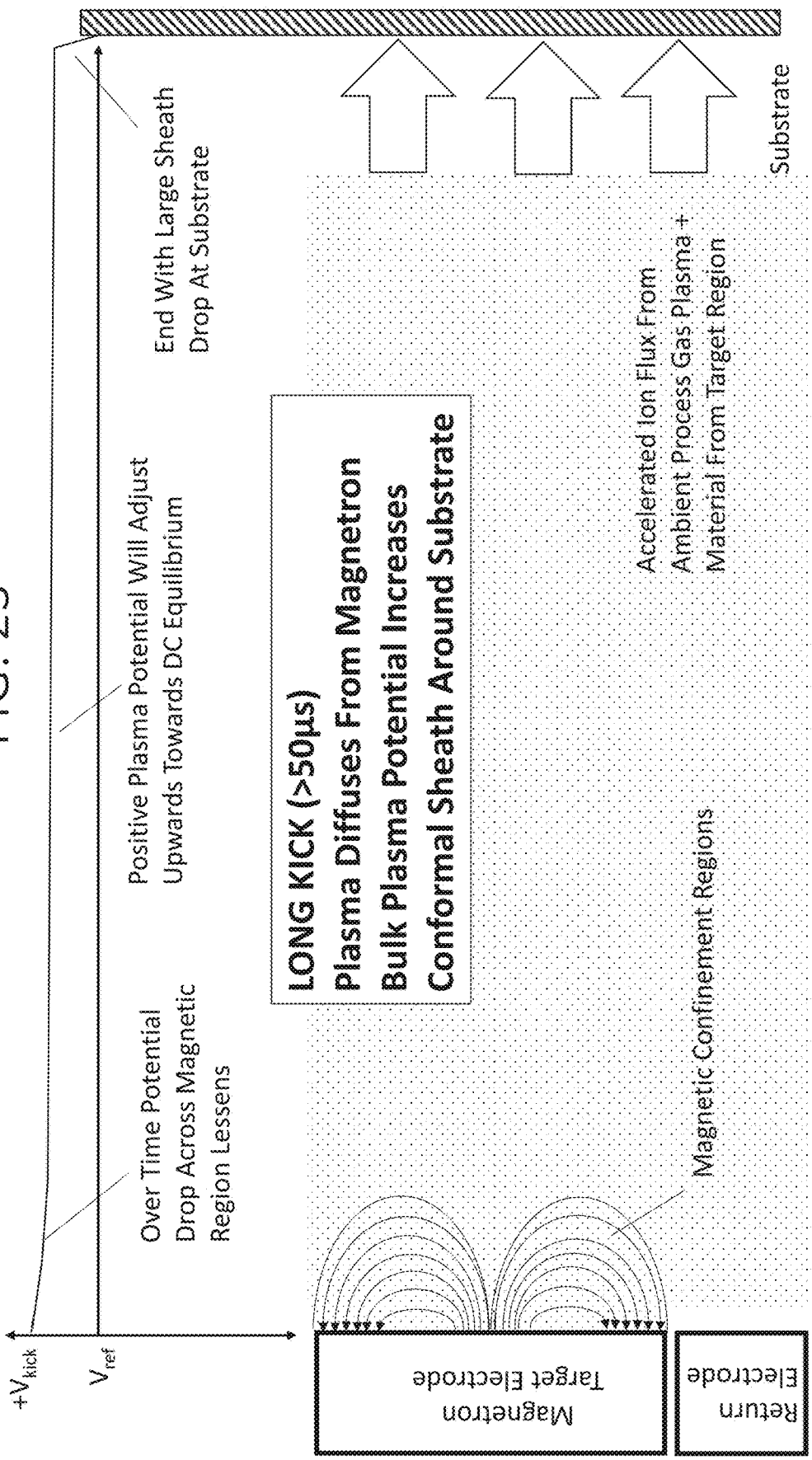
FIG. 23 illustratively depicts a positive potential evolution into the Long Kick phase where the plasma potential of the bulk is increased and conformal sheaths form on the substrate and other surfaces when the bulk plasma is commuted.

FIG. 23 is adapted from US20180358213A1 and illustratively depicts a positive potential evolution into the Long Kick phase where the plasma potential of the bulk is increased and conformal sheaths form on the substrate and other surfaces the bulk plasma is commuted.

An aspect of the disclosure provided herein is the ability to control, during operation of the apparatus described herein, the flux and energy of ions deposited/impacted onto substrates for the preparation and deposition of thin-films with engineered properties. A high level of customization afforded with the combination of ultra-fast high-current pulsing with rapid positive voltage reversal with the inverted cylindrical magnetron configuration enables superior and novel films, including advanced nanolayer composites and functionally-graded materials with specific attributes, including oxidation resistance, thermal fracture toughness, crack arresting features, diffusion barriers and anti-wear, anti-corrosion, ductile vs. stiffness, lubricious properties, etc.

Figure 24:
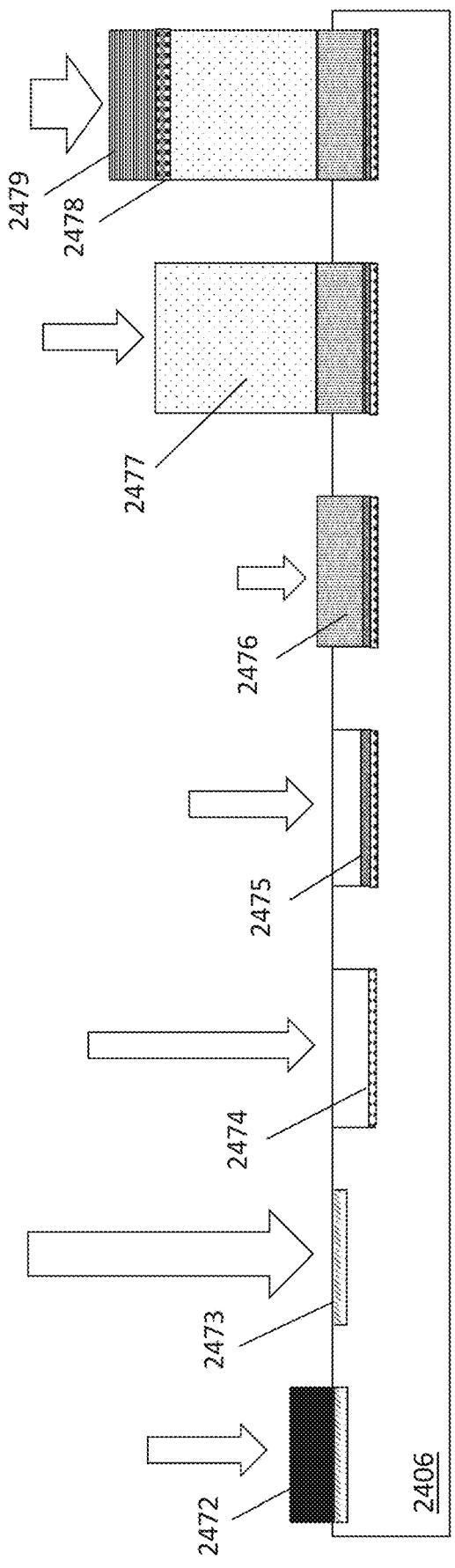
FIG. 24 illustratively depicts an aspect of the disclosure where substrates are processed using the IMPULSE+Positive Kick to perform a variety of processing steps with a single processing system with seamless transition from one mode to the next.

FIG. 24 illustratively depicts a central advantage in terms of combining cleaning, etching, ion implantation, adhesion control, stress management and reactive/alloy depositions. With precision ion energy control, the ultra-fast IMPULSE with positive kick voltage reversal can remove surface contaminants, etch near-surface damage, develop a mixing interface for a good adhesion layer, to support stress-controlled layer(s)s that enables bulk films to be grown with suitable interface and capping layer(s).

The above-mentioned operations can be performed with a single processing system with seamless transition from one mode to the next to eliminate dead time, handling, dust/particle generation (pinholes defects) and adsorbed contaminants from interfering with the film quality. At high vacuum conditions of 2e-6 Ton ultimate pressure, the rule of thumb is one monolayer of material sticks to the surface of the substrate in 1 second. For a conventional plasma processing with discrete stations that separate cleaning, etching and deposition, the simple act of transfer between stations that may take upwards of 30 seconds could result in many layers of contaminants and undesired materials on surfaces that can interfere with chemistry, surface adhesion and film growth.

FIG. 24 provides one illustrative example of a continuous processing timeline 2471 that demonstrates a capability of a system incorporating the present disclosure to instantly and seamlessly transition between cleaning, etching, implantation and deposition without breaking vacuum or staging to have a significant impact on thin-film quality. A substrate to be coated 2406 is initially treated with plasma cleaning at timeline 2471 t0 to remove surface contaminants 2472 using low-to-medium plasma and ion energy to break surface bonds, but not drive contaminants into the subsurface. The treatment changes at timeline 2471 t1 to energetically ion etch near-surface imperfections and impurities from prior processing steps 2473 using very high plasma and ion energy to physically remove surface layers and etch down to bulk substrate material or underlying film coating. The treatment changes at timeline 2471 t2 to energetically deposit a metal mixing layer with preferred orientation 2474 using high-energy ion energy through combination deposition/etch. The treatment changes at timeline 2471 t3 to deposit a fully dense adhesion layer using energetic medium energy ions. The treatment changes at timeline 2471 t4 to deposit stress control layer(s) 2476 using variable ion energy and pulse timing. The treatment changes at timeline 2471 t5 to deposit the bulk film layers 2477 using variable ion energy and pulse timing in concert the stress control layer(s) 2476. The treatment changes at timeline 2471 t6 for the final processing steps to deposit any interface or diffusion barrier layers 2478 and/or capping layers 2479 using high density plasma and reactive ion bombardment for the formation of nitride layers or alloy compositions. For various processes to achieve their technical requirements, some of the process steps outlined above can be omitted or repeated in any required combination.

The scenario depicted in FIG. 24 is just one example of a sequential, seamless transition—there are many different combinations that are possible. The key point is that moment there is one ion energy and ion flux to the substrate surface and in less than a second the process has completely changed to a different set of parameters without introduction of impurities, contamination, particles and artefacts from staging.

Figure 25:
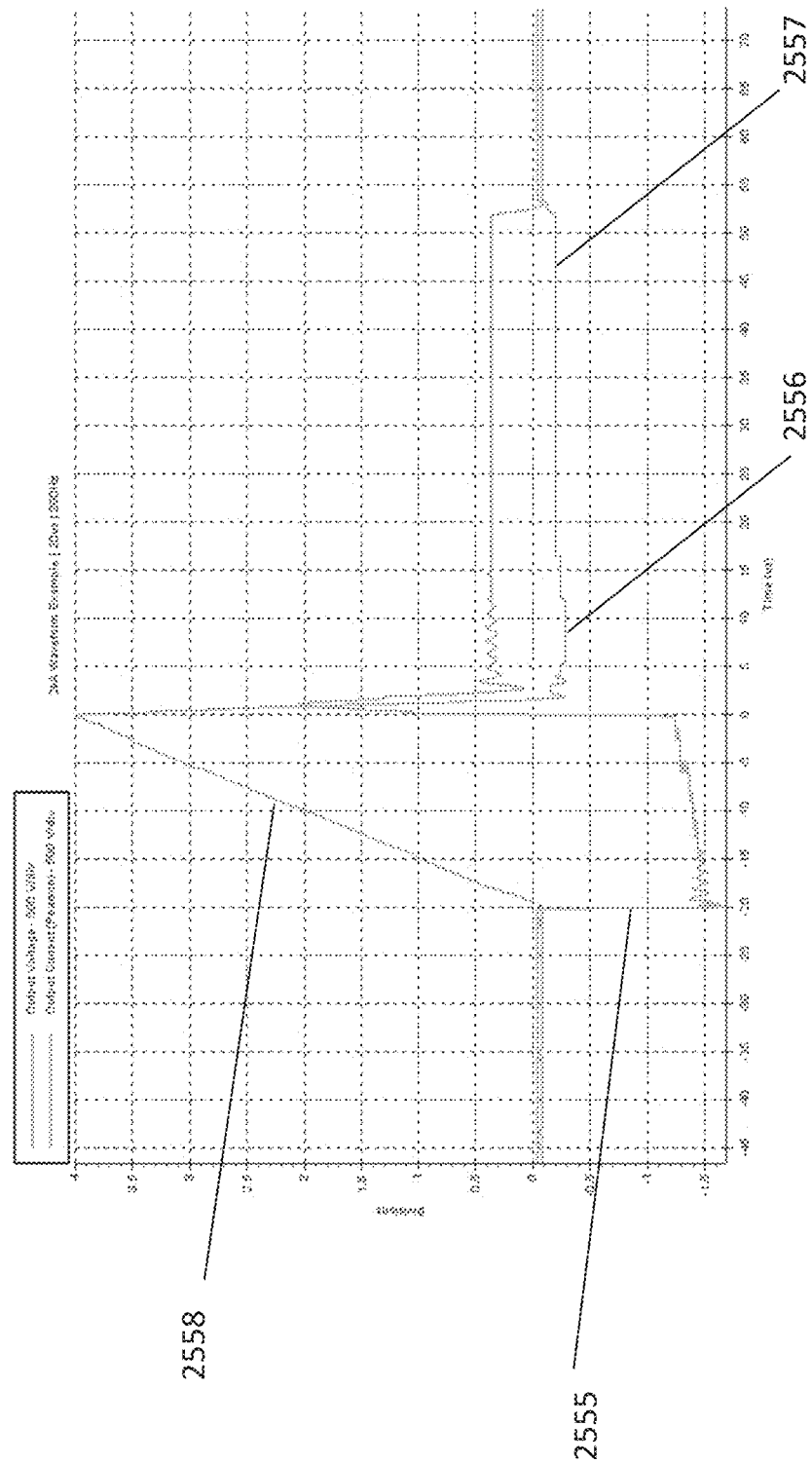
FIG. 25 illustratively depicts a sample IMPULSE+Positive Kick Pulse Waveform highlighting the main negative sputtering pulse and Short and Long Kick phases.

FIG. 25 illustratively shows an example voltage waveform 2555 and a current waveform 2558 for a −750V, 2 kA peak current HiPIMS pulse achieving a plasma current density of 5 A/cm2 on the cylindrical magnetron with a copper sputtering target with a positive kick pulse of +200V, 125A peak current highlighting a short kick 2556 and a long kick 2557. The impulse technology described herein drives plasma generation at high dI/dt to achieve rapid ionization for subsequent voltage reversal and positive kick to accelerate ions and plasma into substrates for superior cleaning, etching, preferred-orientation deposition and deposition with stress and morphology control. The technology also allows for synchronization with pulsed DC bias supplies for time windowed acceleration into the substrate for additional control as taught in US20180358213A1.

Depending on local factors such as preionization, target material, magnetic field, pressure, geometric curvature, sputtering gas, surface chemistry, adsorbed gases, etc, the main negative pulses on the voltage waveform 2555 are typically in the range of −400V to −1200V. Using the ultra-fast switching topology typical high-current pulse widths are less than 100 usec, with a typical range of 20-50 usec. The positive kick amplitude on the voltage waveform 2555 are typically in the range of +0-600V. For users who do not want the short kick ion population group to be accelerated away from the sputter target, shown in the current waveform for the short kick 2556, the onset delay in the positive kick would be set to after this time period typically set at 20-40 usec. The ionization rate and plasma density near the sputtering target is highly coupled with the effective current density. Effective current densities are in the range of 0.1-10 A/cm2.

Figure 26:
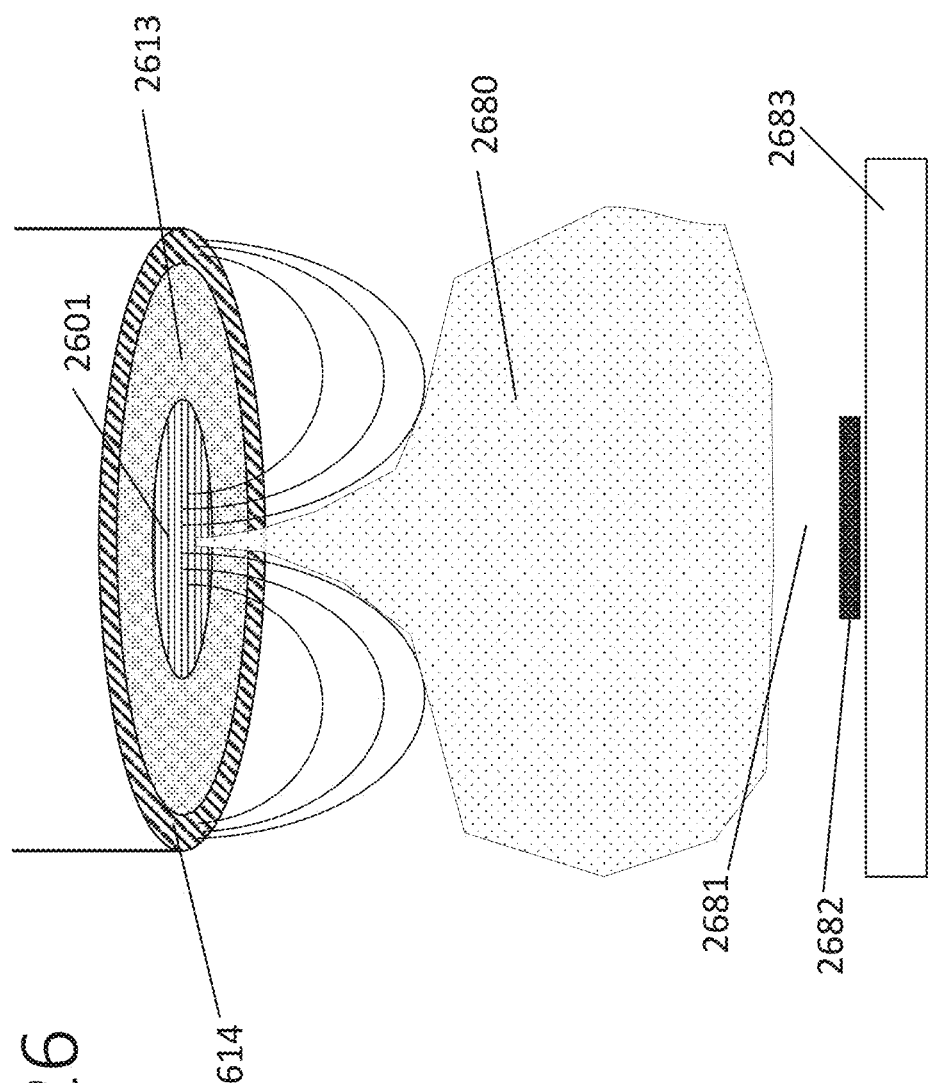
FIG. 26 is a photograph of a conventional planar magnetron operating with ultra-fast IMPULSE deposition and etching with the Super Kick RF-like modulation of the Positive Kick.

FIG. 26 is a photograph of a conventional planar magnetron operating with ultra-fast short main pulse for deposition and subsequent RF-like modulation of the positive kick pulse to generate and sustain a secondary plasma with positive potential relative to the substrate for etching. Each pulse cycle would be a combination of deposition and etching—in the case with a copper sputtering target to achieve preferred orientation copper deposition such as Cu(211) vs. Cu(111) vs. Cu(100). The etching parameters are adjusted for preferred orientation and epitaxial growth conditions. A sputter target 2601 is processing both a negative main pulse and an RF-modulated positive pulse. The dense plasma region 2613 over the racetrack is brilliant white-green from the Cu I and Cu II optical emission lines. A central plasma region 2680 excited by the RF-modulation of the positive voltage is colored pink from Ar I and Ar II excitation. The central plasma region 2680 extends all the way down to an insulating substrates 2682 exhibiting combination for deposition and etching a surface 2683. A conformal plasma sheath 2681 extends down to the insulated substrates 2682. Using the combination for deposition and etching preferred orientation films can be deposited.

FIGS. 27A and 27B are photographs highlighting the Super Kick mode for extended plasma generation away from the magnetic field cusp and etching on substrates with a sample oscilloscope waveform 2786 (FIG. 27A) showing 77 kHz operation, current waveforms 2758 for the RF-like oscillation and voltage waveforms of an RF-like voltage application 2785. The photograph in FIG. 27B shows a bare target electrode 2701 without the bright visible emission from the racetrack region. The absence of any dense plasma region shows there is no sputtering of the target occurring. A bright central plasma region 2780 follows the magnetic cusp into the target electrode and is a commuted to a target electrode 2701 at elevated positive potential. The resulting etching plasma extends down to a substrate 2784 with a visible plasma sheath 2781 conforming on the samples. The super kick mode can be indefinitely sustained under a range of operational conditions for direct etching. The super kick can also be used in conjunction with a negative DC bias on the substrate for additional flexibility in materials processing.

Now that we have the inverted cylindrical magnetron system coupled with the ultra-fast pulsing and polarity reversal capability and capability to real-time adjustment of deposition and etching conditions, we turn to the integrated processing system for the production of nuclear fuels and cladding material coatings. FIGS. 28A and 28B illustrate an in-line process (FIG. 28A) versus a batch fabrication process (FIG. 28B) using dedicated single inverted cylindrical magnetron sputter/etch stations 2787 with linear feed through multiple in-line stations or a batch mode with multiple deposition/etch heads 2788 operating in concert.

Figure 29:
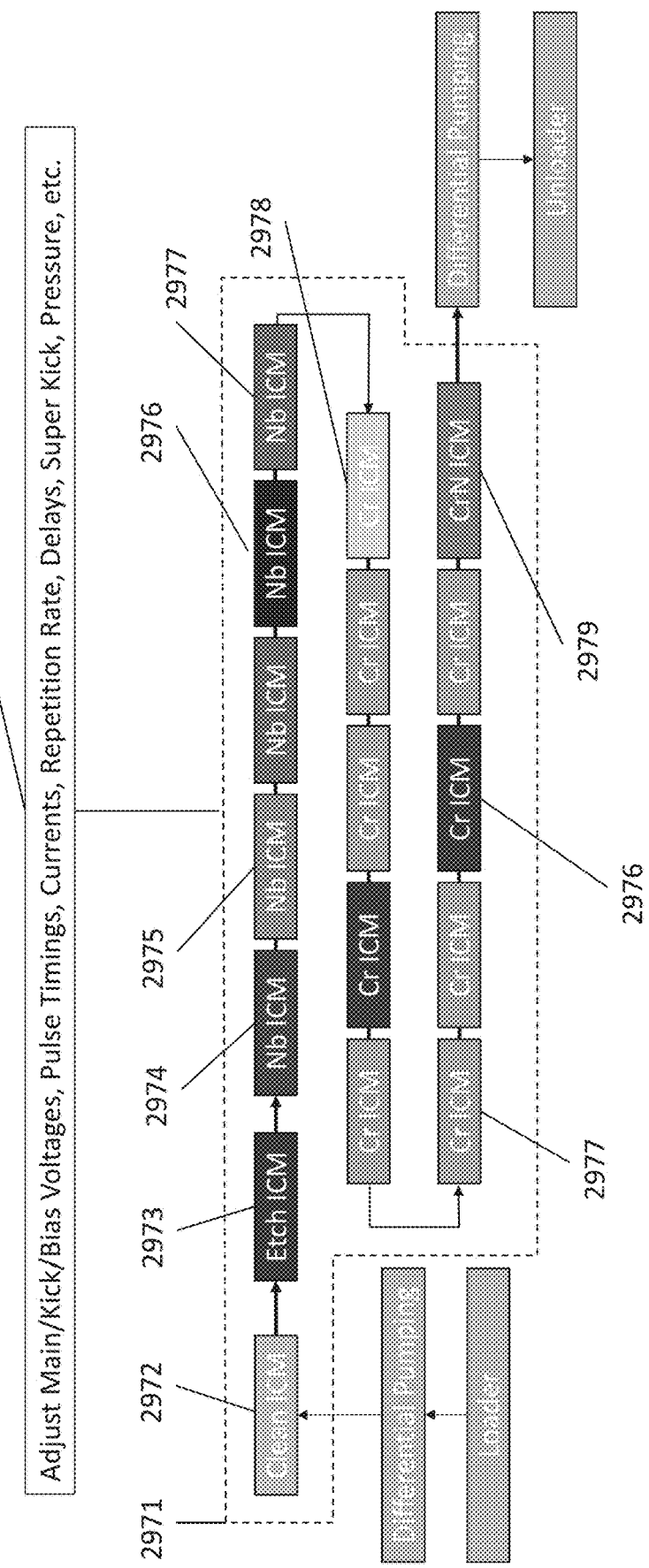
FIG. 29 illustratively depicts an exemplary process workflow for an in-line inverted cylindrical magnetron (ICM) fabrication process for thin-film multilayer coatings on nuclear fuel cladding.

FIG. 29 illustratively depicts a process workflow for an in-line ICM fabrication process suitable for processing thin-film multilayer coatings on nuclear fuel cladding. In the in-line station approach there would be one continuous vacuum processing line with pumping and material handling between various stages. Each ICM station would be optimized for a particular process and the nuclear cladding material would be fed at a constant linear rate through each ICM station as it continually processed 2971 from t0, t1, t2, t3, etc. Multiple sputter/etch stations clean 2972, etch 2973, intermix 2974, adhere 2975, stress manage 2976, bulk deposit 2977, add diffusion barriers and/or interfacing materials 2978 and capping layers 2979, such as a reactive nitride deposition. The parameters are controlled according to the process customization variables identified in a box 2991 to affect thin-film properties. A loader could insert one or multiple fuel cladding sections that would process through differential pumping, bakeout degassing and transition through the continuous timeline 2971.

Figure 30:
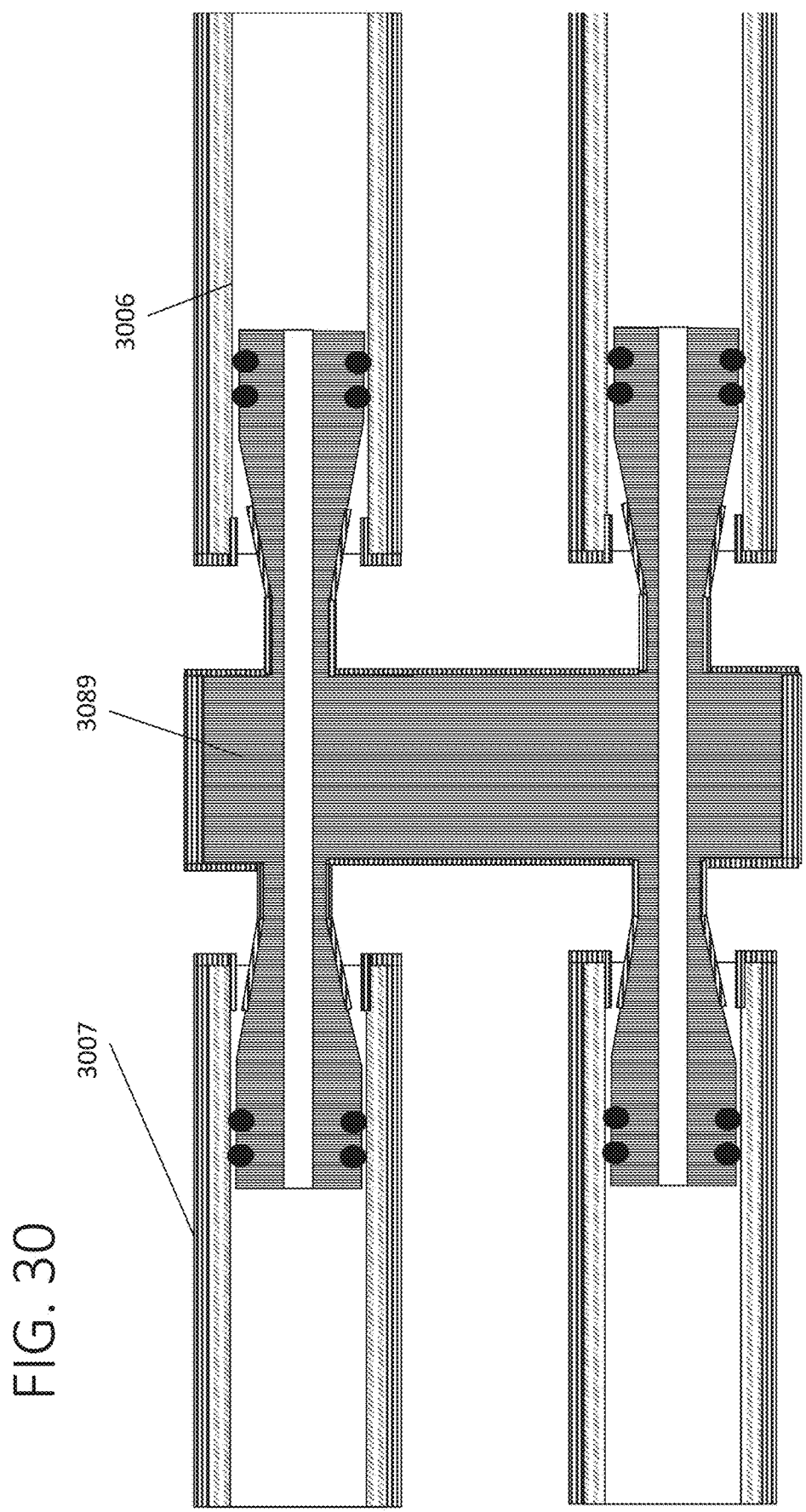
FIG. 30 illustratively depicts a continuous feed system with adapter plugs to feed one or more nuclear fuel cladding tubes through the ICM in-line deposition/etch system in a continuous fashion.

There are several technical challenges with a continuous feed system. One challenge is linking each fuel cladding section, allowing independent bias voltage and current pathways through each substrate, providing means to remove heat from the fuel cladding to not exceed the thermal limitations of the underlying ZIRLO material to alter the structural and physical characteristics of the material, such as ductility, strength, stress, etc. Because the fuel cladding sections are approximately 400 cm long and 1 cm in diameter with a large aspect ratio, continuous feed adapters for support, fixturing, transport, electrical and fluid connections can be used. Committing 40 cm of linear real estate is only sacrificing 10% of the total processing length. of there is an inherent attractiveness to the in-line approach. FIG. 30 illustrates a continuous feed system with adapter plugs 3089 to feed one or more nuclear fuel cladding tubes 3006 through the ICM in-line deposition/etch system in a continuous fashion for coating 3007. An example is shown in FIG. 30 with an adapter plug supporting 2 connections with internal fluid transport; multiple variations are possible.

Figure 31B:
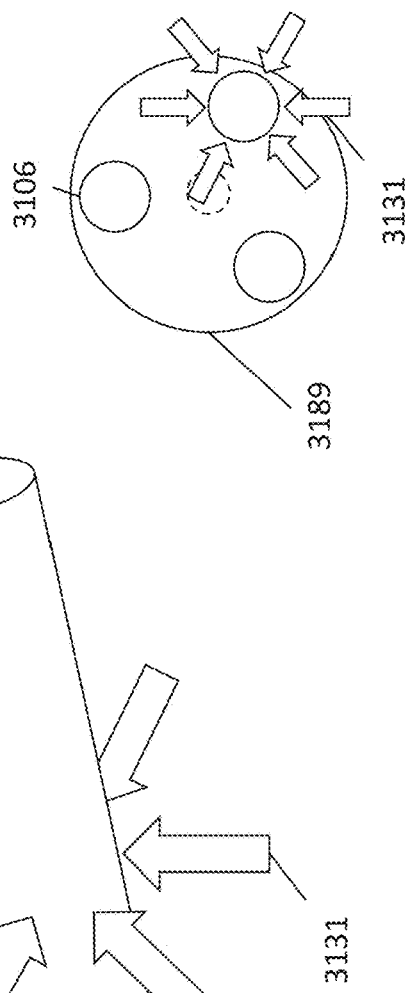
FIGS. 31A and 31B illustratively depict an adapter plug supporting multiple substrates and highlighting the ICM with magnetic null ambipolar focusing with high density plasma generation will lead to plasma immersion and conformal deposition on multiple substrates.
Figure 31A:
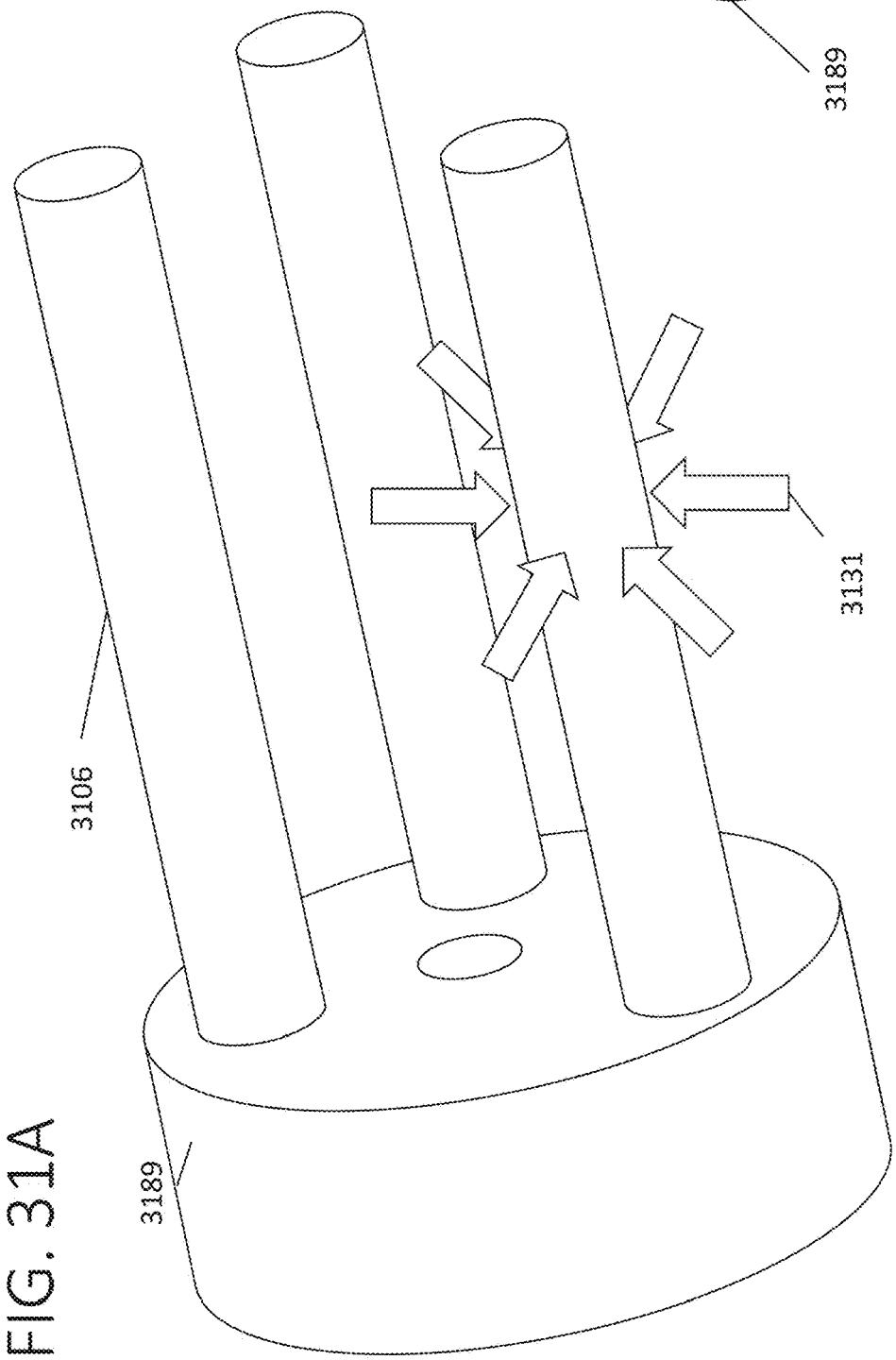

A variant is shown in FIGS. 31A and 31B illustrating using an in-line adapter plug 3189 supporting multiple substrates and highlighting using the ICM with magnetic null ambipolar focusing with high density plasma generation will lead to plasma immersion and conformal deposition 3131 on multiple substrates. With magnetic rotation on the sputter target (not shown) and the plasma immersion effect from the magnetic geometry combined with the positive kick pulse, there is sufficient open volume around the substrates for conformal deposition without need for rotation of the substrates. This is useful for hybrid in-line, small batch processing with 1, 3, 4, 6 or more substrates while still taking advantage of the inverted cylindrical magnetron additional plasma concentration and immersion effects on the centerline and ion transit time windows for deposition and etch.

Figure 32:
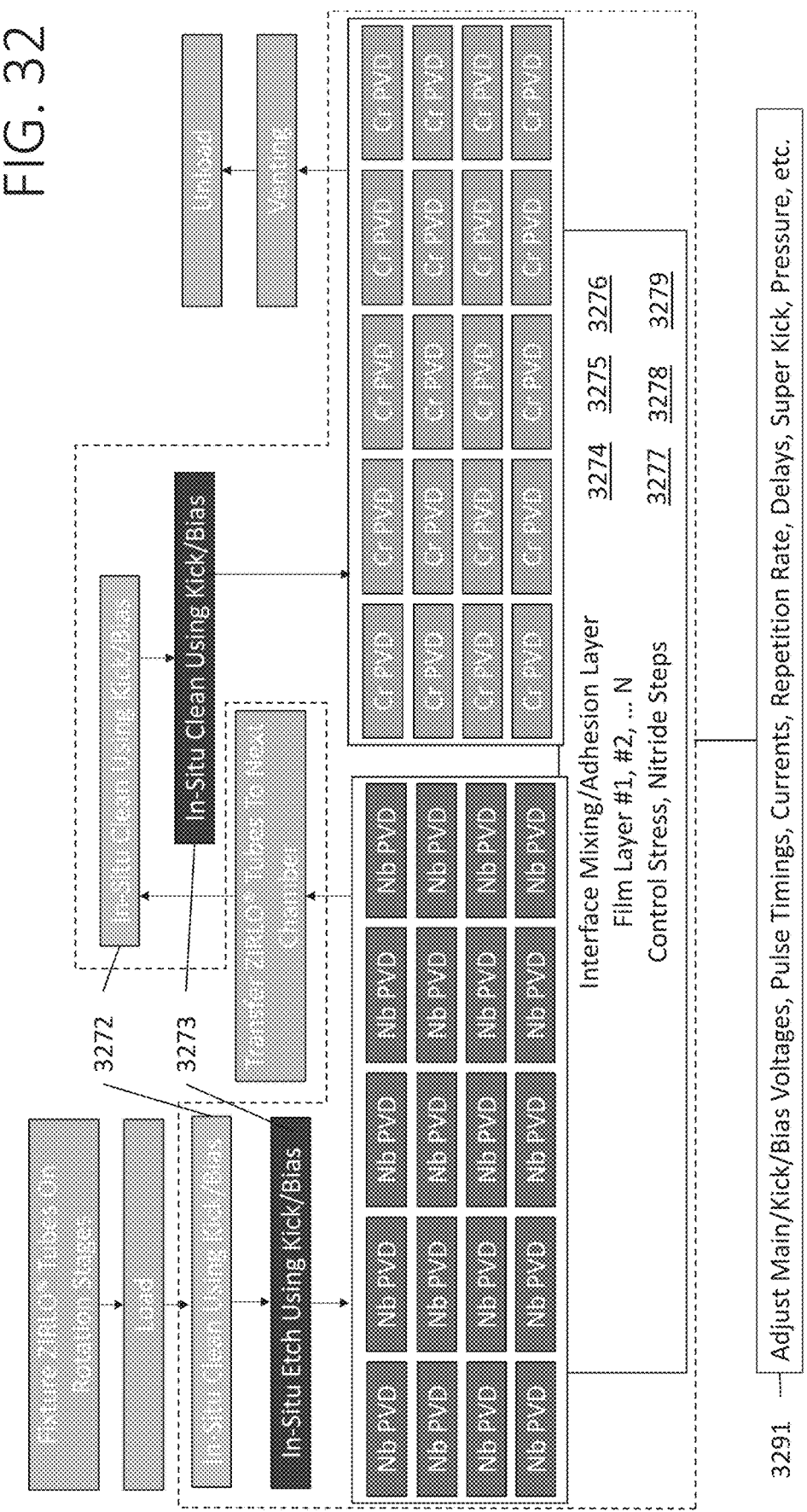
FIG. 32 illustratively depicts a typical process workflow for a batch ICM or more conventional PVD/etch system for thin-film coatings using the IMPULSE+Kick procedure for ultra-fast pulsing.

FIG. 32 illustrates a typical process workflow for a batch processing system on a large chamber constructed with conventional PVD/etch systems or large-diameter ICM devices connected in series and operated asynchronously or synchronously with ultra-fast IMPULSE and positive kick and/or bias. Two large vacuum chambers supporting many nuclear fuel cladding tubes would be co-processed in parallel using multiple sputter electrodes for clean, etch, mix, adhere, stress manage and bulk deposit. Additional chambers are needed for each change in base material type to keep only one main element in each large vacuum chamber, i.e. Nb, Cr, Mo, etc. Additional specialty diffusion barriers, interfacing materials and non-nitride capping layers could require a separate chamber with clean and etch preparation steps prior to deposition to obtain high-quality films. The parameters can be controlled to affect thin-film properties. it continually processed 3271 from t0, t1, t2, t3, etc. Multiple sputter/etch units in parallel would clean 3272, etch 3273, intermix 3274, adhere 3275, stress manage 3276, bulk deposit 3277, add diffusion barriers and/or interfacing materials 3278 and capping layers 3279, such as a reactive nitride deposition. The parameters can be controlled 3291 to affect thin-film properties.

Figure 33:
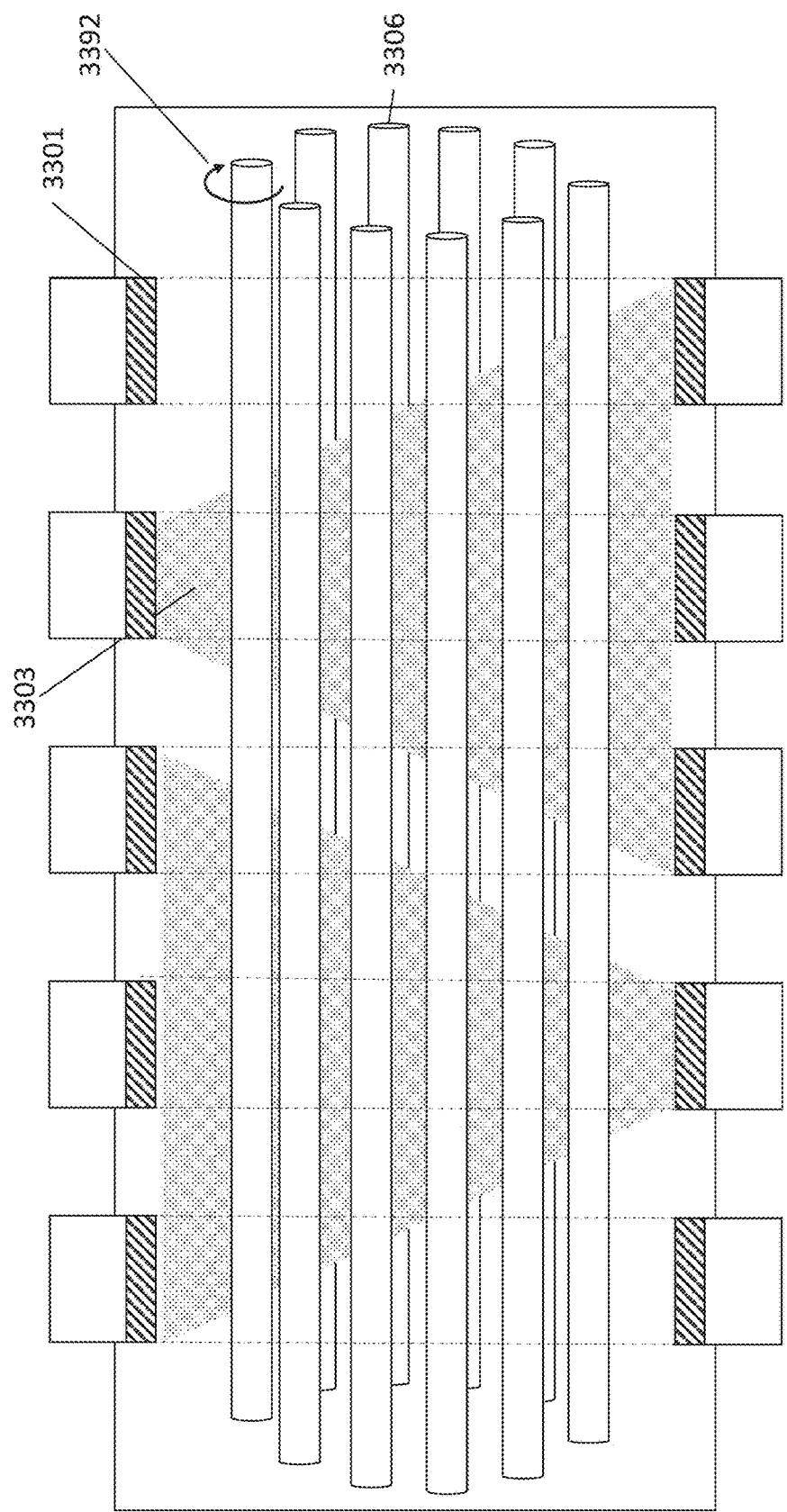
FIG. 33 illustratively depicts a conventional batch substrate rotation in an extended plasma field.

FIG. 33 highlights conventional batch substrate rotation in an extended plasma field using multiple large-diameter inverted cylindrical magnetron cathodes operating in series-parallel. Multiple sputter targets 3301 are azimuthally encircling multiple substrates 3306 along the centerline of the vacuum environment. Rotating magnetic assemblies can be used and/or rotation of individual substrates 3392 for deposition and etching uniformity. With a larger chamber diameter the magnetic null effect will be decreases and overall plasma density lower as power is spread over a larger volume; however, the ion and neutron transit times are larger across the bigger diameter allowing for efficient capture of ions using the positive kick positive potential adjustment and/or pulsed DC bias directly onto the substrates 3306. The ion and neutral emission 3303 will permeate through the intra-substrate space and still provide opportunity for conformal deposition on the substrates 3306. Adding multiple ICM modules onto the same vacuum chamber would allow higher total pulsed power for the given volume and larger area to extract power. Sputtering target raw material costs and fabrication into quasi cylindrical geometries are possible.

FIGS. 34A and 34B show prior art for Cr on Zr and Zr-alloy materials using conventional DC sputtering+active substrate bias. FIG. 34B shows prior art for HiPIMS deposition of Cr-coating directly onto M5 Zr-alloy materials using an active substrate bias. Note the difference in film morphology from a columnar, fibrous growth with some vertical voids and grain boundary separation for FIG. 34A and the dense Cr layer on the M5 material in FIG. 34B.

Figure 35B:
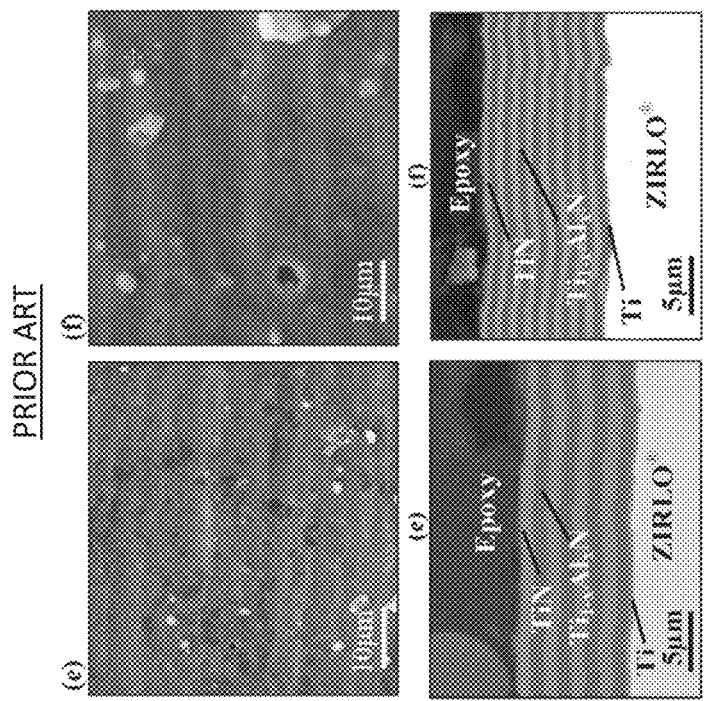
FIGS. 35A and 35B illustratively depict prior art methods and results for cathodic arc deposition of TiN and TiAlN multilayers for nuclear cladding coatings.
Figure 35A:
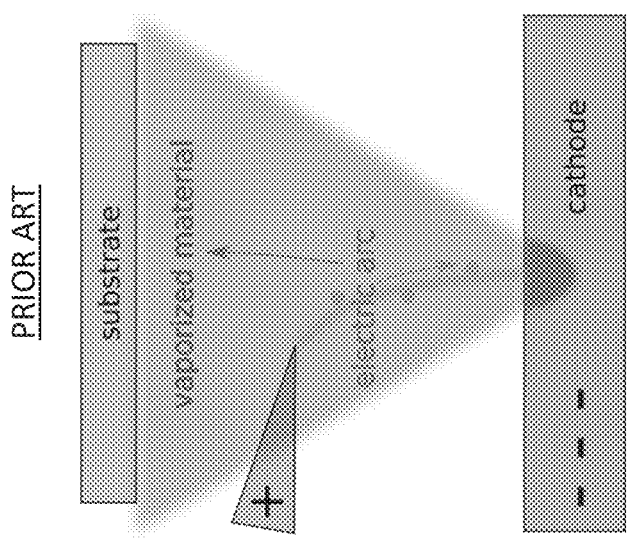

FIG. 35A illustrates the cathodic arc process. FIG. 35B shows prior art for cathodic arc deposition of TiN and TiAlN multilayers for nuclear cladding coatings. Note the large amount of macroparticle debris and pinhole defects on the film.

Figure 36C:
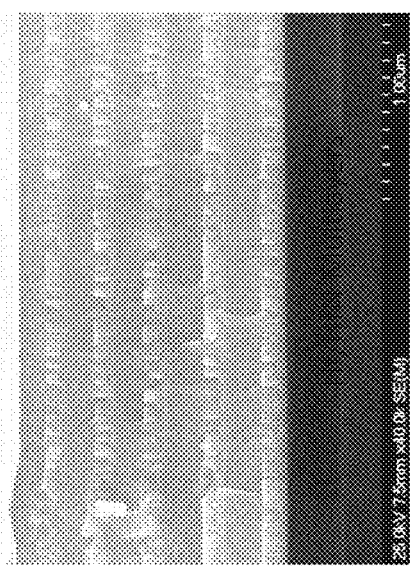
FIG. 36A, 36B, 36C and 36D show scanning electron microscope images of fracture cleaved multilayer stacks using the ultra-fast IMPULSE+Positive Kick including Cr/CrN, Hf/HfN, Zr/ZrN (with the same sputter target and Ar vs. Ar+N2 reactive deposition) and Nb/Cr layered materials with two independent sputter targets in a single vacuum chamber.
Figure 36D:
Figure 36A:
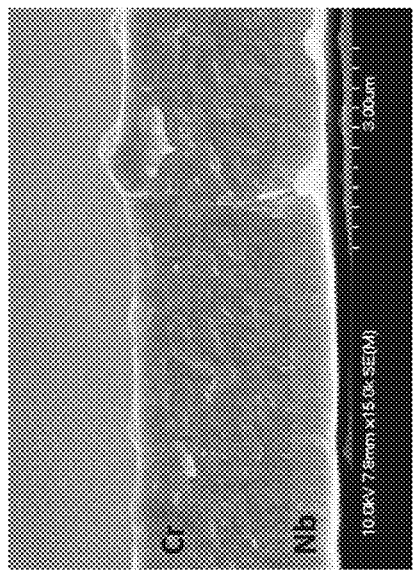
Figure 36B:
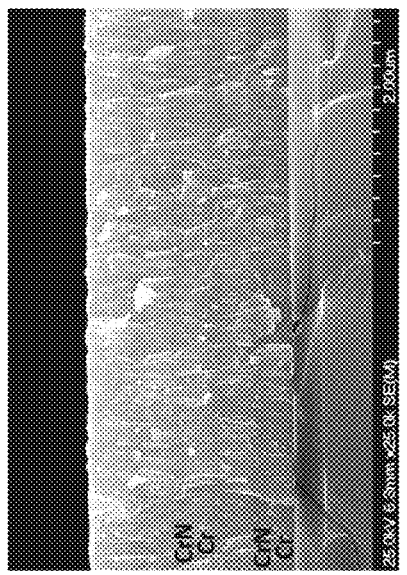

FIGS. 36A, 36B, 36C and 36D show scanning electron microscope images of fracture cleaved 2-3 μm thick multilayer stacks deposited on coupons using the ultra-fast IMPULSE HiPIMS+Positive Kick system. FIG. 36A is a Nb/Cr layered material utilizing two independent sputter targets in a single vacuum chamber. FIG. 36B is a Cr/CrN 5 bilayer stack using a single Cr sputter target and deposition with Ar gas for the Cr layer and deposition with pure $N_2$ gas for the nitride layers. FIG. 36C is a Hf/HfN 5 bilayer stack using a single Hf sputter target and deposition with Ar gas for the Hf layer and deposition with Ar+N2 admixture for the nitride layers. FIG. 36D is a Zr/ZrN 5 bilayer stack using a single Zr sputter target and deposition with Ar gas for the Zr layer and deposition with Ar+N2 admixture for the nitride layers. Note the ductility of the bilayers.

For material exposure to high-temperature oxidative environments, oxidation protection coatings can maintain functionality and integrity while being subjected to various extreme conditions of thermal shock, thermal cycling, and high mechanical loading, and while being exposed various environmental effects (e.g. steam, water, chemicals, salt, sand, particulate erosion, etc.). An example is nuclear fuel undergoing an accident scenario including loss of coolant, exposure to steam, extreme temperatures, low-temperature coolant quenching, etc. These operating conditions can lead to defects on a surface which will, in the case of a single-layer coating, lead to a total degradation of the coating properties, and coating annihilation. The accumulation and growth of defects can be halted by nanolayering the thin-film structure. In a nanolayered composite film, thin multilayer coatings are deposited in layers such that the effective defect length scale is controlled and minimized to a small value, thereby ensuring the film integrity, suppression of cracks and effective management of thermal stress. These nanolayered composite films can be used for enhanced oxidation resistance in a high-temperature environment, thereby enabling the use of materials that might otherwise be incompatible with a high-temperature oxidative environment.

Figure 37:
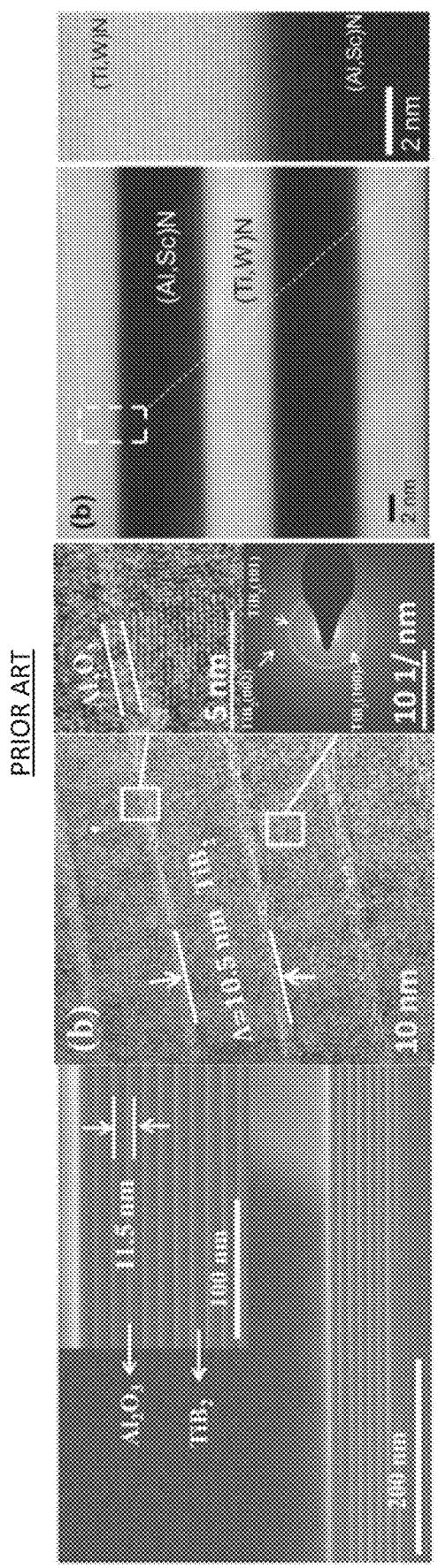
FIG. 37 shows prior art for Functionally-Graded Nanolayer Composites that could similarly be grown using IMPULSE+Kick.

FIG. 37 shows prior art for Functionally-Graded Nanolayer Composites that could be deposited using the present invention for high-volume manufacturing with precision control and thick film stacks. For high-temperature oxidation resistance, deposition of at least two thin material layers in alternating layers ranging from 1 nanometer to 10 micrometer thickness arranged in combinations to make well defined modulation length scales that define a "characteristic defect length" scale. The thin material layers are small enough that the layer periodicity order is shorter than the wavelength of photons that will be emitted via blackbody spectra for emissive cooling, e.g. a bilayer pair is 100 nm and the light wavelength is 1000 nm (10× smaller). The characteristic defect length sets a minimum crack distance before encountering another material plane and crack inhibiting interface thereby improving the fracture toughness. The inhibition of cracks will prevent the growth of very thick oxide scale that lower the emissivity of the material and cause further localized heating and runaway crack growth and destruction of the film. Using the ultra-fast HiPIMS pulsing can makes layers that are smooth for reduced friction. The nanolayers allow the use of ultrahigh temperature ceramic material selected from the group comprising XB2, XO2, XN, or XF.

FIG. 38 is an illustration highlighting short-term cladding coatings using metallic Nb/Cr/Mo with a nitride capping layer, diffusion barriers, tensile-compressive stress management, improved fracture toughness and thermal stress management with novel inverted cylindrical magnetron with magnetic null trapping for high ion capture utilization, mitigation of dust particles, superior erosion control and process stability, and IMPULSE+KICK integration for clean, etch, mixing, adhesion, reactive layers and morphology control. Longer term are nanocomposite and functionally-graded layers (Spatial Modulation), improved CTE matching and hoop stress management, superlattice structures for ultra-high temperature oxidation resistance, stabilizers and diffusion arresters, and extendibility for fuel pellet coatings, interior of cladding for gas barrier control and anti-fretting, and SiC materials.

Figure 39:
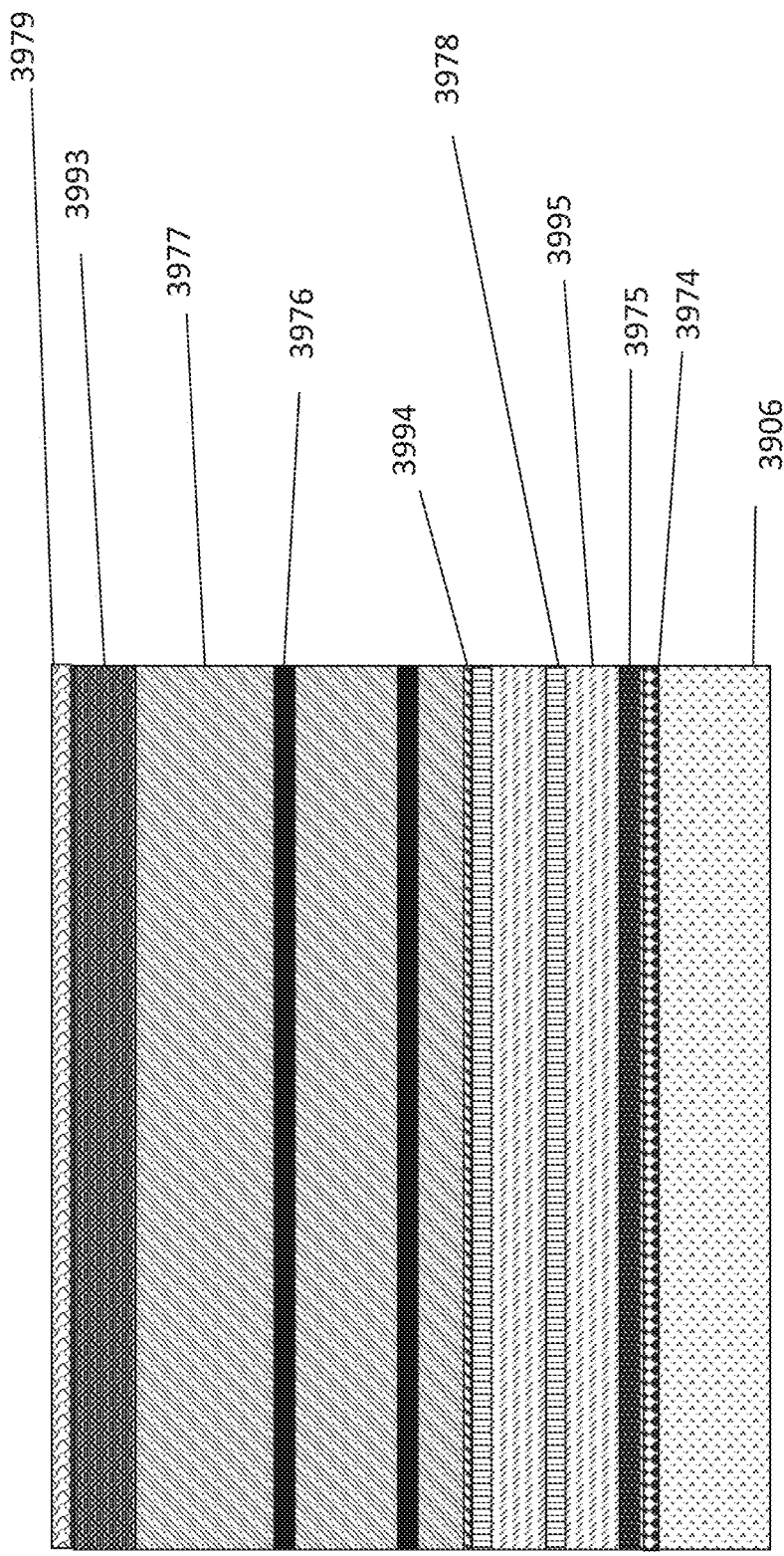
FIG. 39 illustratively depicts an implementation of the disclosure to provide a multi-layered coating including: anti-wear layers, anti-corrosion layers, crack inhibition layers, ductile (springiness) construction in the engineered multilayer thin-film composite strategy.

Expanding on the ideas in FIG. 38, FIG. 39 illustratively depicts an engineered multilayer nano/micro composite thin film. Substrate 3906 is cleaned and etched to reach the underlying bulk substrate material. A metal interface mixing layer 3974 is introduced through a combination deposition and etch. A fully dense adhesion layer 3975 is deposited next serving as the base for a ductile layer (springiness) to manage thermal expansion and mismatched CTEs. An interface or diffusion barrier layer 3978 can be introduced to limit migration at elevated temperatures or galvanic potentials. A crack inhibition layer 3994 can be introduced to arrest thermal shocks and preserve a critical layer from catastrophic failure. Stress control layers 3976 can be added to manage tensile vs. compressive stress for thick films and vertical stack engineering. Bulk thin-film layers 3977 can be introduced at multiple levels to provide the needed thickness properties. Corrosion inhibition 3992 and wear resistance 3993 layers can be added to achieve a certain chemical resistance or hardness property. Capping layers 3979 for lubriciousness and tribological properties can be added. Control of the ion energy (E*) through the positive kick and the IMPULSE main pulse and particle flux (T*) allow adjustment of the thin-film microstructure and morphology.

Figure 40:
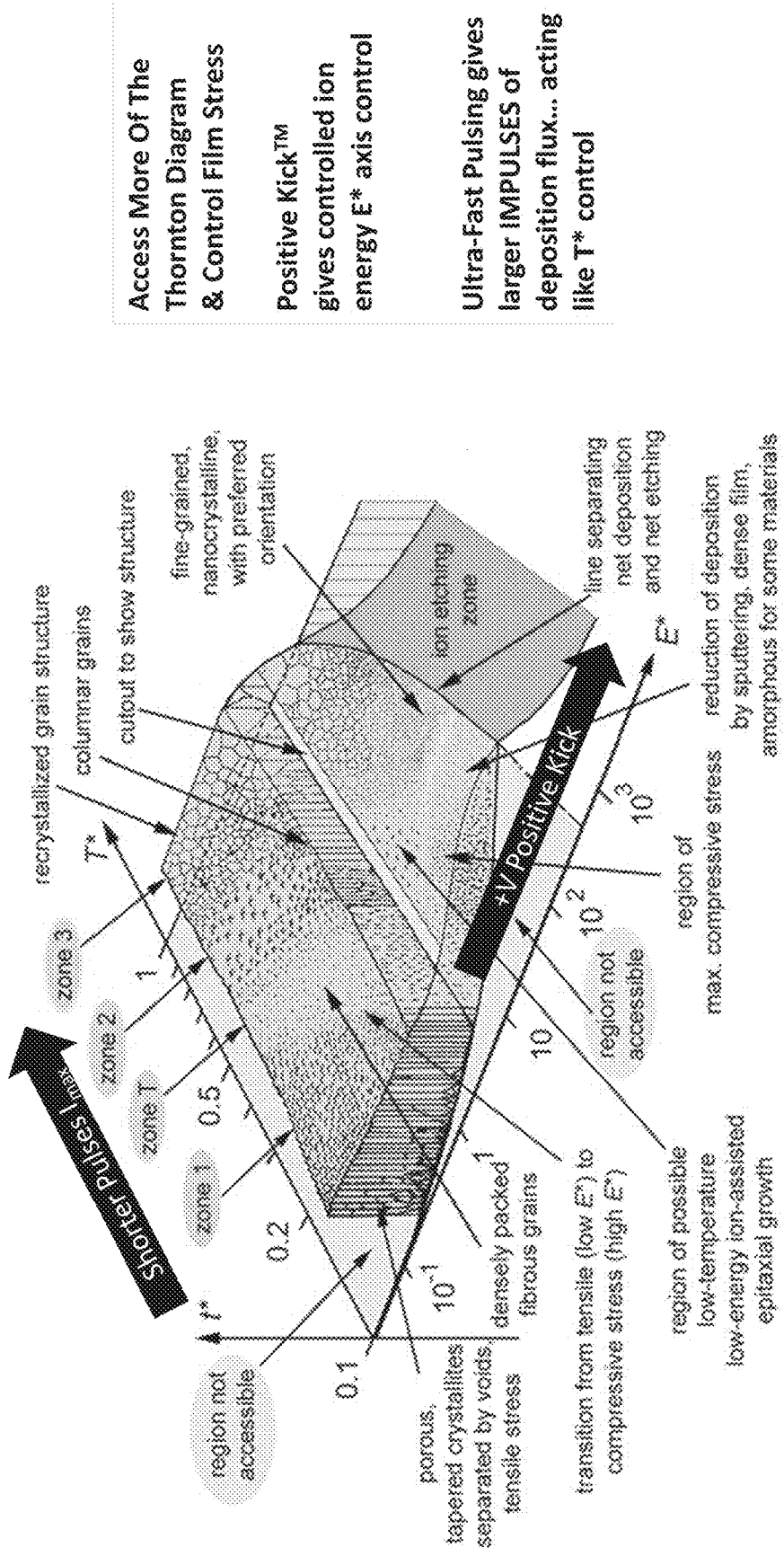
FIG. 40 illustratively depicts a Thornton/Anders structured zone diagram.

FIG. 40 expands on the control of thin-film microstructure and morphology via illustration of the Andre Anders' modified Thornton Structure Zone Diagram for generalized energetic condensation. Adjustment of the HiPIMS pulse amplitude, pulse width, timing, peak current density, repetition rate and pressure for a given substrate-to-sputter target distance, magnetic field geometry and field distribution, allows control over the main pulse particle flux (T*) which is approximate as a thermal spike. More intense short pulses with higher particle loading over shorter periods has a high temperature effect allowing the deposited material to equilibrate and adjust towards fibrous transitional grains (zone T), columnar grains (zone 2) and recrystallized grain structure (zone 3). Adjustment of the positive kick pulse amplitude, short/long kick pulse, onset delay and any super kick effect for RF-like oscillations for a given magnetic field, cusp magnetic null geometry, pressure and available plasma resulting from the main IMPULSE HiPIMS pulse will allow adjustment of the effective energy (E*) and adjustment of the thin-film microstructure and morphology. Essentially controlling the IMPULSE and the positive kick allows movement all over the Anders/Thornton SZD, even achieving fine-grained nanocrystalline films with preferred orientation and region of low-temperature low-energy ion-assisted epitaxial growth and dense, amorphous glassy films. The process engineer can move around the SZD to achieve tensile/compressive stress control, columnar growth vs. nanocrystalline with preferred orientation, etc.

Figure 41B:
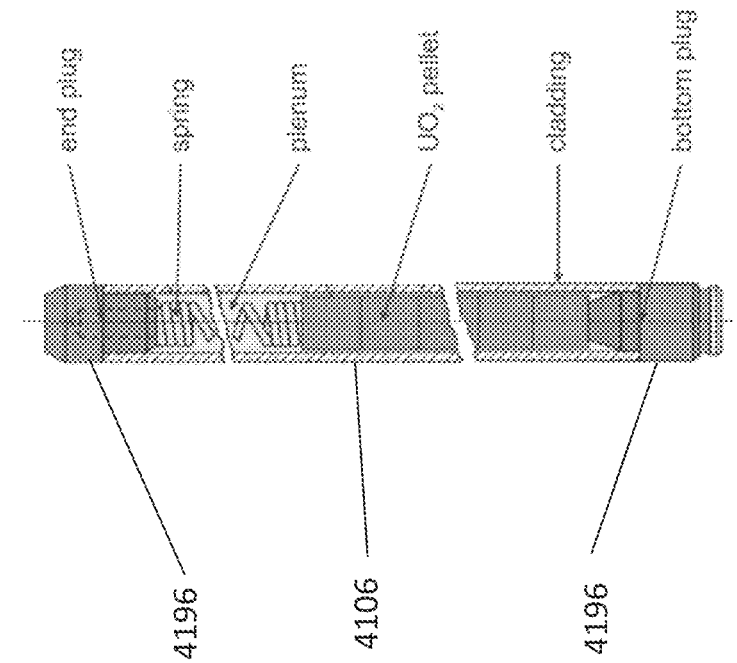
FIGS. 41A and 41B highlights applying thin-film coatings directly onto cladding and end plugs for loaded and welded nuclear fuel.
Figure 41A:
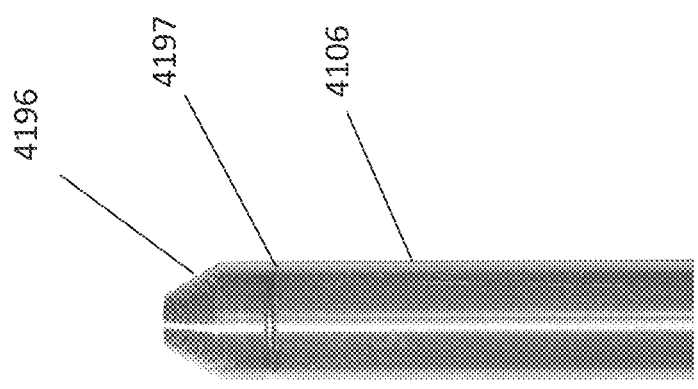

FIGS. 41A and 41B illustratively depict an additional figure highlighting the potential to directly apply HiPIMS thin-film coatings directly onto nuclear fuel rod cladding and end plugs after fuel is loaded and welded. This has the advantage of covering the weld seam for protection.

Figure 42B:
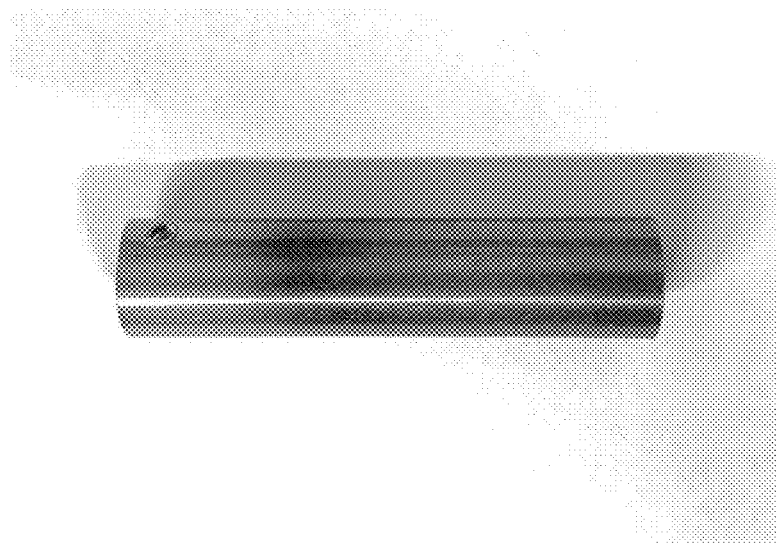
FIGS. 42A and 42B are photographs of an IMPULSE+ KICKNb/Cr coating stack heated in air 1200 C for 5 min followed by 20 C water quench with no delamination, spallation or film deterioration.
Figure 42A:
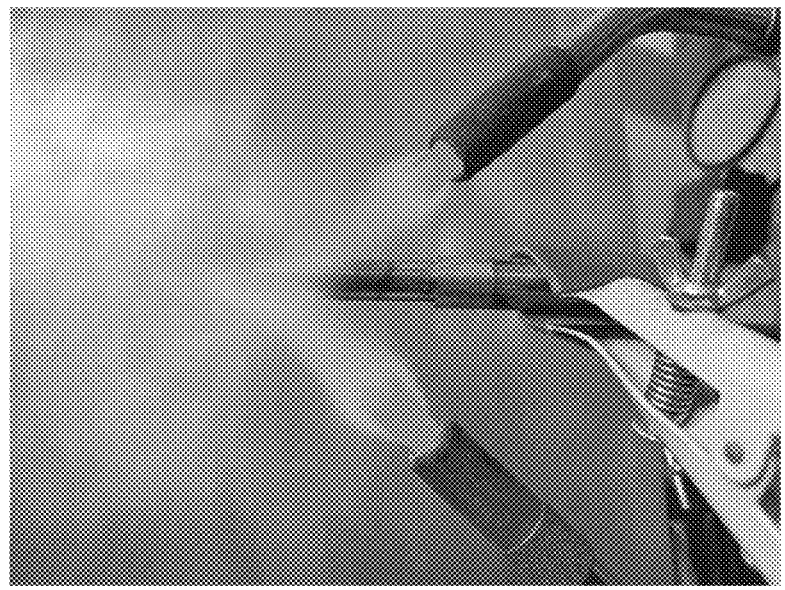

FIGS. 42A and 42B depict a photograph of a ZIRLO® fuel cladding sample coated using the IMPULSE+Positive Kick with a 8 µm Nb/Cr bilayer coating, torch heated in air to 1200 C for 5 min followed by 20 C water quench with no delamination, spallation or film deterioration (aside from mild oxide formation on the surface as expected).

Figure 43B:
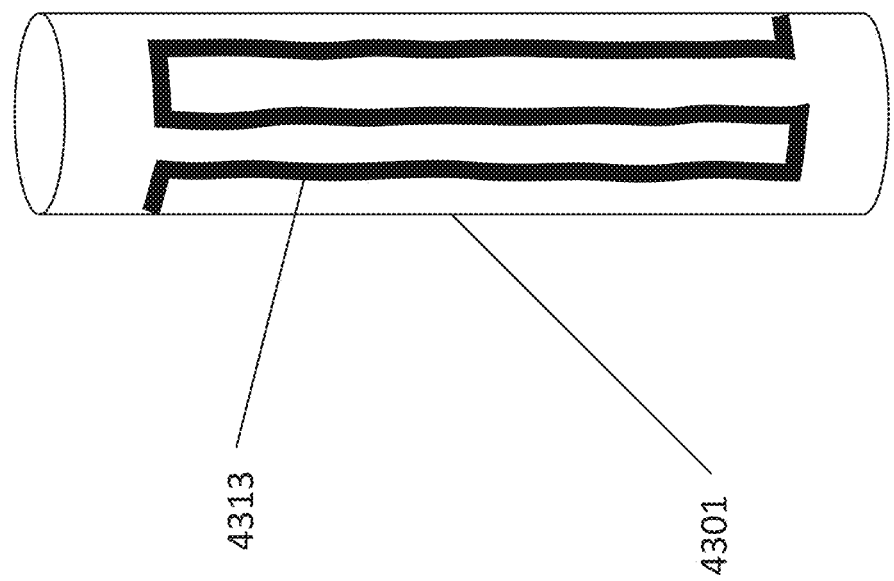
FIGS. 43A and 43B depict an alternative implementation of the present disclosure with a post-type cathode using a serpentine magnetic continuous racetrack (or other) with internal motion magnets.
Figure 43A:
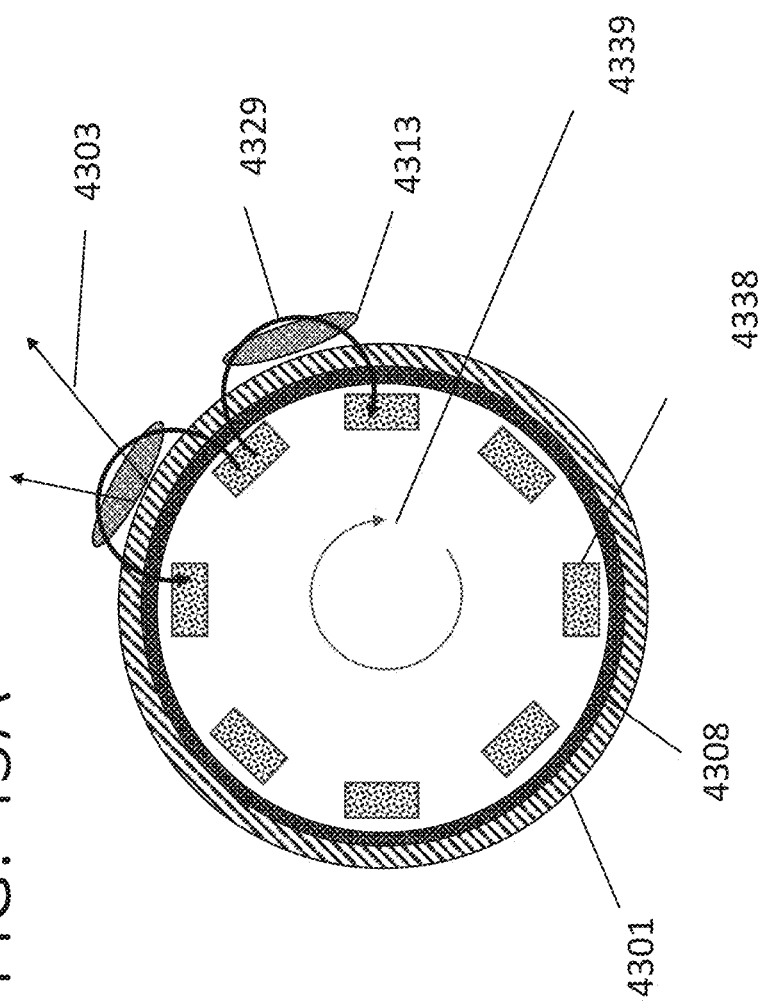

FIGS. 43A and 43B depict an alternative embodiment of the present invention with post-type cathode using a serpentine magnetic continuous racetrack (or other) with internal motion magnets for improved uniformity and less recycling for use with IMPULSE+KICK. A smaller version can be used for the coating on the inside of tubes, pipes, barrels, etc. Here magnetic assemblies 4338 are located inside a target holder 4308 bonded to a sputter target material 4301. The magnetic assemblies 4338 are rotated 4339 internally to produce moving dense plasma regions 4313 formed under the magnetic confinement zones 4329. Sputtered ions and neutrons 4303 are ejected outwards to coat objects.

Figure 44:
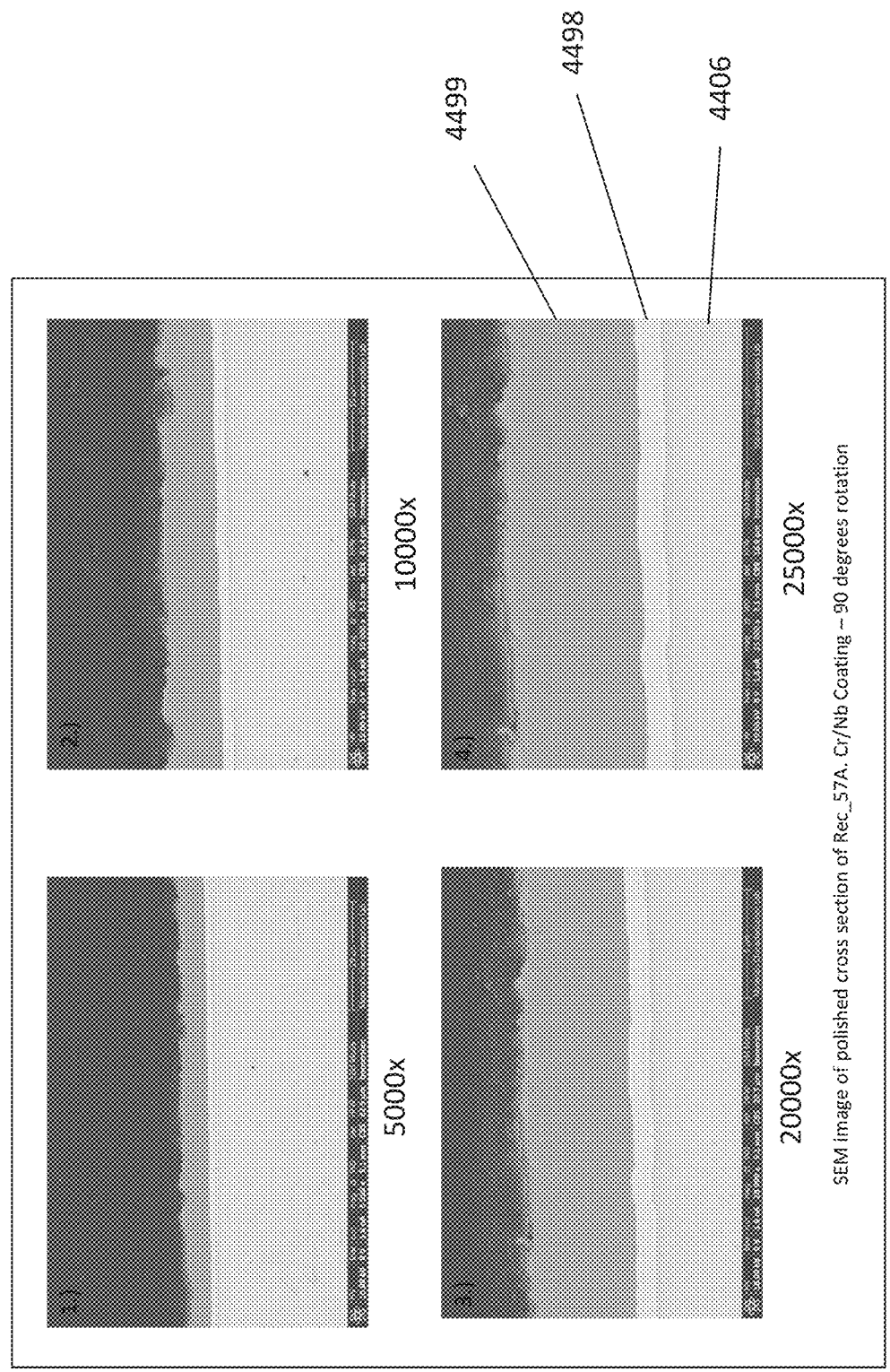
FIG. 44 is a set of scanning electron micrographs showing a Cr/Nb coating on a ZIRLO® reference tube following IMPULSE+KICK recipe #59A showing the Nb mixing layer, Nb stress control layer for ductility and interfacing Nb layer for Cr adhesion.

FIG. 44 is a set of four scanning electron micrographs at different levels of magnification showing an 8 µm Cr/Nb coating on a ZIRLO® reference tube following recipe #59A showing the Nb mixing layer to the underlying substrate 4406, Nb stress control layer for ductility and interfacing Nb layer for Cr adhesion. The Cr bulk film 4499 is fully dense with good microstructure with excellent adhesion with the Nb layer 4498.

Figure 45:
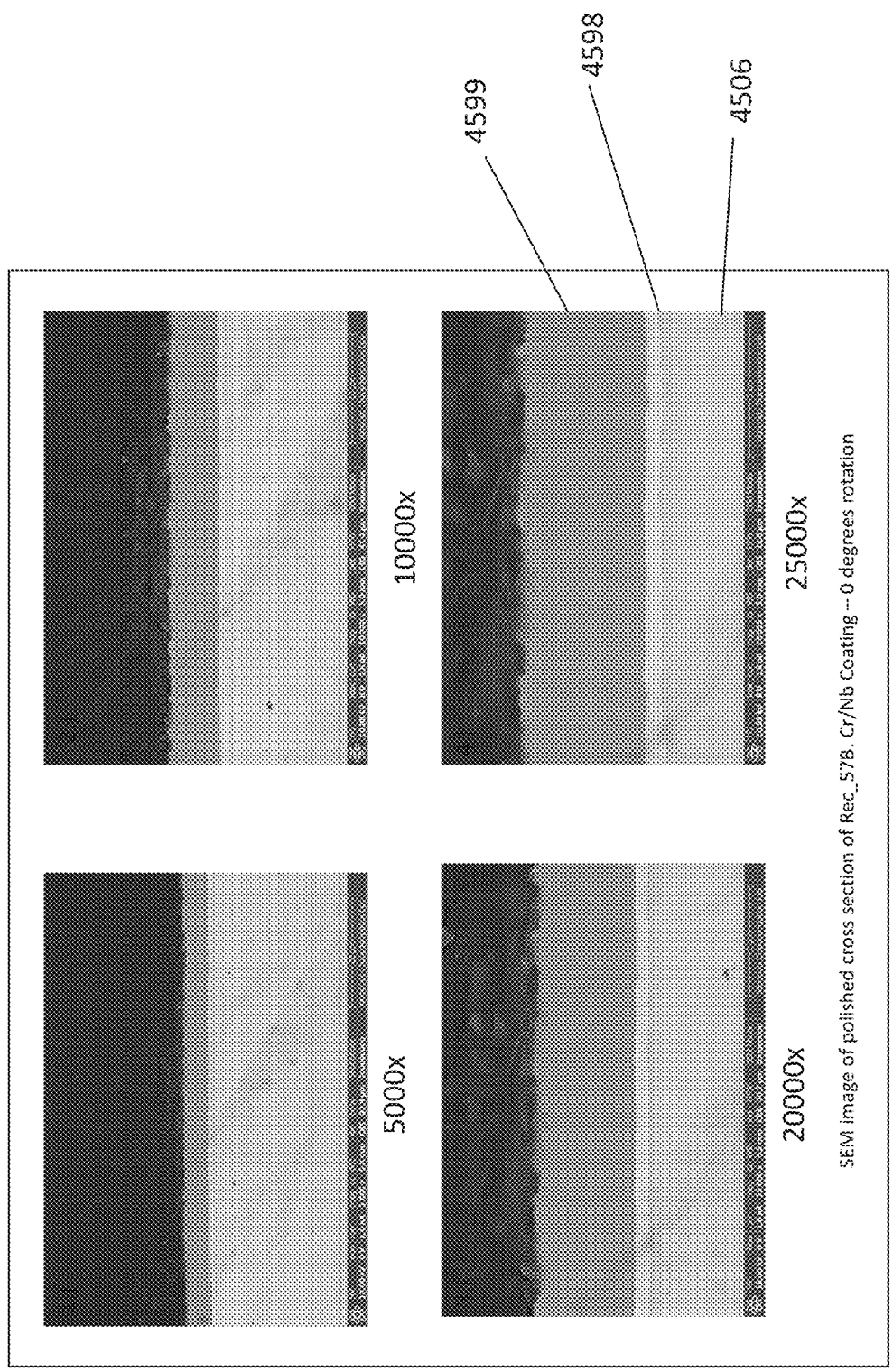
FIG. 45 is a set of scanning electron micrographs showing a Cr/Nb coating on a ZIRLO® reference tube following IMPULSE+KICK recipe #59B showing the Nb mixing layer, Nb stress control layer for ductility and interfacing Nb layer for Cr adhesion.

FIG. 45 is a set of four scanning electron micrographs at different levels of magnification showing an 8 µm Cr/Nb coating on a ZIRLO® reference tube following recipe #59B showing the Nb mixing layer to the underlying substrate 4506, Nb stress control layer for ductility and interfacing Nb layer for Cr adhesion. The Cr bulk film 4599 is fully dense with good microstructure with excellent adhesion with the Nb layer 4598.

Figure 46:
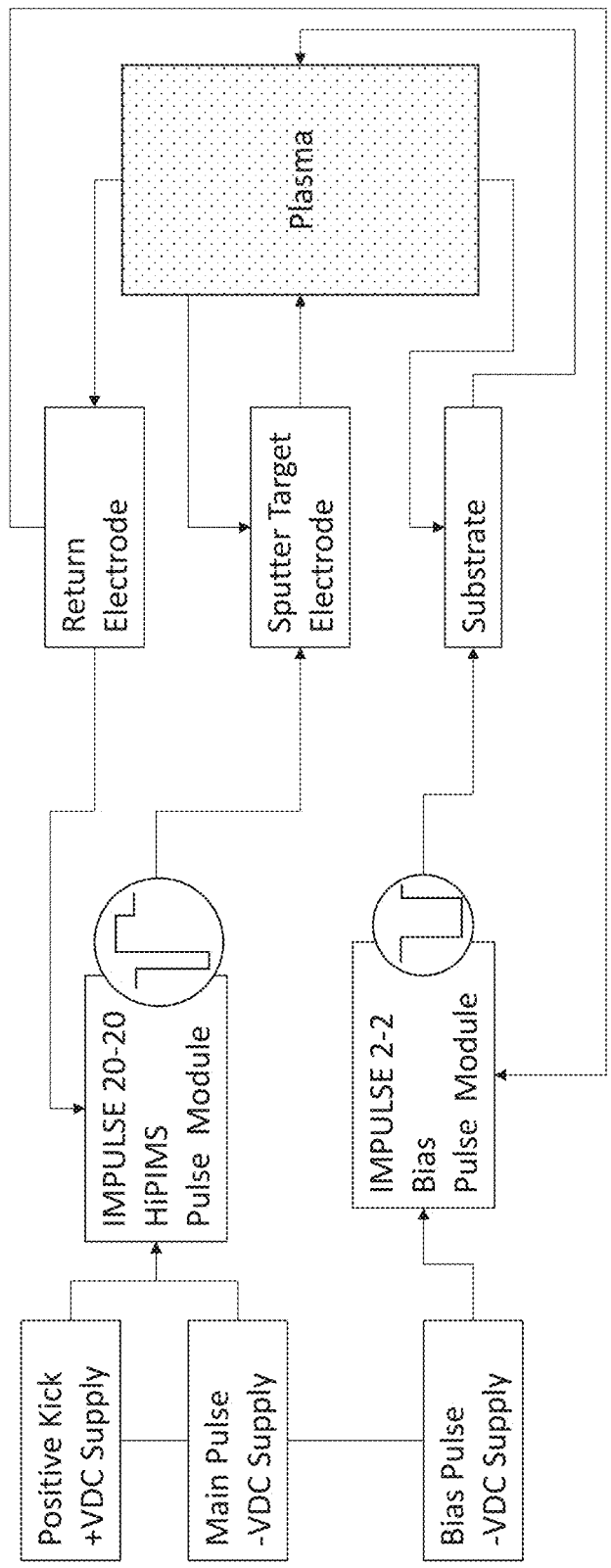
FIG. 46 is a block diagram showing an illustrative example of an electrical arrangement between the ICM and the IMPULSE systems for PVD/Etch operations.

FIG. 46 is a schematic a block diagram showing an illustrative example of an electrical component/circuitry arrangement between a sputter target electrode, a return electrode, a substrate, a plasma in a vacuum environment and one or more IMPULSE HiPIMS pulse module(s) (its main and kick supplies) and any IMPULSE bias pulse module supplies. The schematic block diagram in FIG. 46 outlines a generic setup of IMPULSE systems for deposition and etching. High voltage electrical pulses are provided from the external pulsed power modules directly to the sputter target through appropriate insulation and low-impedance connections. By rotating the magnetic assemblies, this allows for low-impedance electrical connections to the sputter target holder for efficient power transfer and coupling. The IMPULSE modules are designed for parallel synchronous and asynchronous operation. Therefore, multiple units can pulse in parallel to delivery needed power, risetime and plasma density for a sputtering target electrode configuration.

Figure 47:
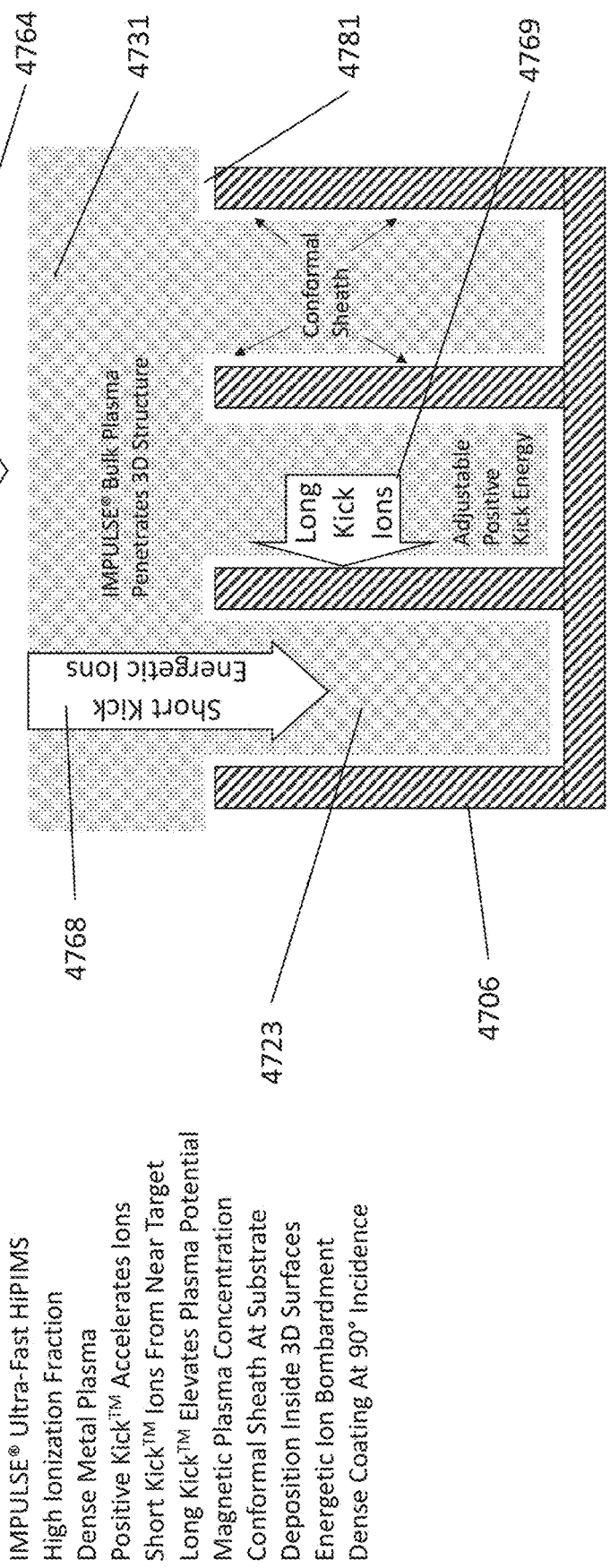
FIG. 47 provides additional detail on the improved deposition conformality and control compared to the current state of the art.

FIG. 47 provides additional detail on the improved deposition conformality and control compared to the current state of the art. A bulk plasma 4723 has the effect of contouring over the surface of a substrate 4706 to be coated and providing directed ion energy quasi-normal to the surface. Depending on the density of the plasma and the effective plasma sheath 4781 length, the contouring of this bulk plasma can be at a sub-mm length scale for superior conformality of deposition. The intense ultra-short pulsing of the IMPULSE leads to very high plasma density. Add to this the plasma concentration effect 4731 from the magnetic field null or minimum effect and magnetic nozzle/cusp effect (not shown), which leads to a very high degree of ionization and greater bulk plasma density leading to a higher degree of conformality and ion capture efficiency 4764. A net effect of the above-mentioned features is a superior control for engineered material coatings. The short kick 4768 and long kick pulse 4769 lead to energetic ion capture efficiency.

This improved ion capture efficiency 4764 and conformal sheath 4781 improves coating uniformity for complicated parts with 3D geometry, such as turbine blades, aerospace craft leading edges, medical devices, such as expandable stents and coils, battery electrodes, solar materials, semiconductor devices, etc.

FIG. 48A depicts an illustrative example of the present disclosure to facilitate depositing a coating on and/or etching an interior surface of an object, such as a nuclear fuel cladding tube, using a magnetic structure located external to the object. The interior surface of a substrate 4806 is coated with ions and neutral particles 4804 originating from a sputtering target 4801 electrode that is biased with voltage from the IMPULSE system (not shown). Magnetic field assemblies 4838 are located external to the substrate 4806, preferably outside of the vacuum environment and water cooled, but close enough to generate a sufficient magnetic field 4812 to promote the formation of a dense plasma 4813 within the substrate 4806 structure. In FIG. 48A the substrate 4806 could itself serve as the return electrode for pulse current or a separate path utilized along the axis or on the ends for example.

FIG. 48B depicts another scenario where an internal deposition and etching process is combined with an external process. A substrate 4806 with interior and exterior surfaces receive deposition and etching by ions and neutrals 4804 from a dense plasma region 4813 formed with assistance of magnetic fields 4812 from external magnetic assemblies 4838. Sputter targets 4801 can be pulsed synchronously, asynchronously or with a pattern to distribute the ions and neutral particles 4804 for the user's application. For example, due to the higher surface area on outer substrate 4801 it may be operated at three times the pulse frequency as the center target 4801. Voltages, pulse widths and parameters can be adjusted to tune (to a wide degree of variation) a deposition and etch process and the results achieved therefrom. The center sputtering target electrode 4801 could be a different material than outer sputtering target 4801 for different materials and applications. An example internal coating could be a fission product diffusion barrier and an anti-fretting layer where the nuclear fuel contacts the internal wall of the cladding tube. This would be different than the external coating that is tailored towards oxidation-resistance, higher-temperature fracture toughness and anti-crack layering.

Figure 49A:
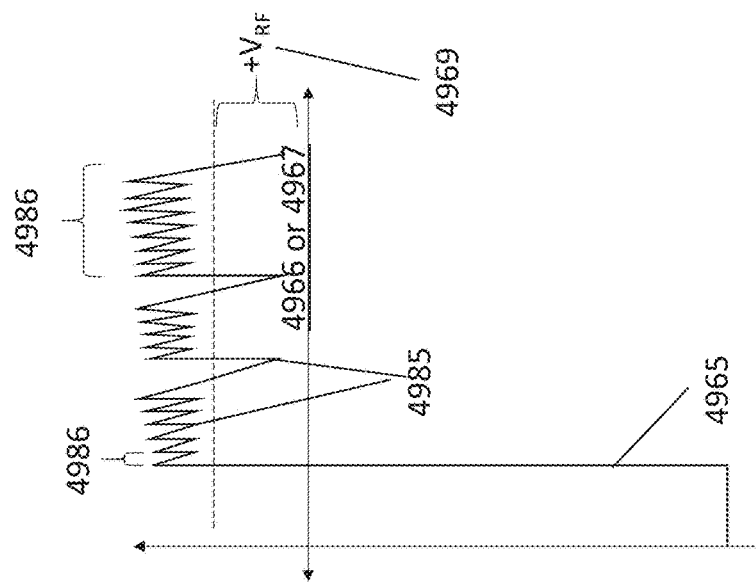
FIGS. 49A, 49B and 49C illustratively depict additional details on the positive voltage reversal and subsequent RF-like oscillation under the super kick mode of operation, where the frequency is lower and the positive kick amplitude draws down further each cycle lowering the effective RF bias potential, and a creative modulation of the positive kick waveform including multi-spectral frequency components to drive high-density plasma but maintain a lower effective RF bias potential.

FIG. 49A provides additional detail on the positive voltage reversal and subsequent RF-like oscillation under the super kick mode of operation. A main negative pulse 4965 transitions into a short positive kick phase 4966 and a long kick phase 4967. The kick voltage is modulated 4985 to produce an RF-like oscillation with a frequency 4986. This has the effect of transferring energy to electrons and serves to encourage ionization and generation of additional plasma in the system. Depending on the positive kick voltage amplitude and local conditions, a quasi-steady RF plasma can be driven with this RF-like oscillation 4985 of the positive kick voltage to sustain plasma. In one mode, the kick voltage is simply turned on to off (floating) and the plasma naturally decays by diffusion. The effective RF bias potential 4969 will naturally equilibrate to some function between the peak positive voltage and the draw down voltage, before the oscillation ramps back up to its peak. The frequency of oscillation allows adjustment of the effective RF bias potential 4969.

Figure 49B:
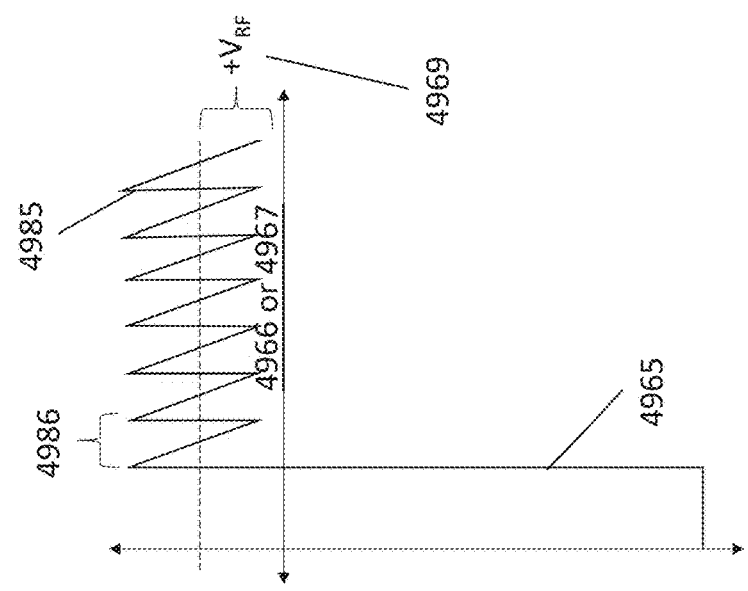

FIG. 49B shows an example where the frequency 4986 is lower and the positive kick amplitude draws down further each cycle lowering the effective RF bias potential 4969.

Figure 49C:
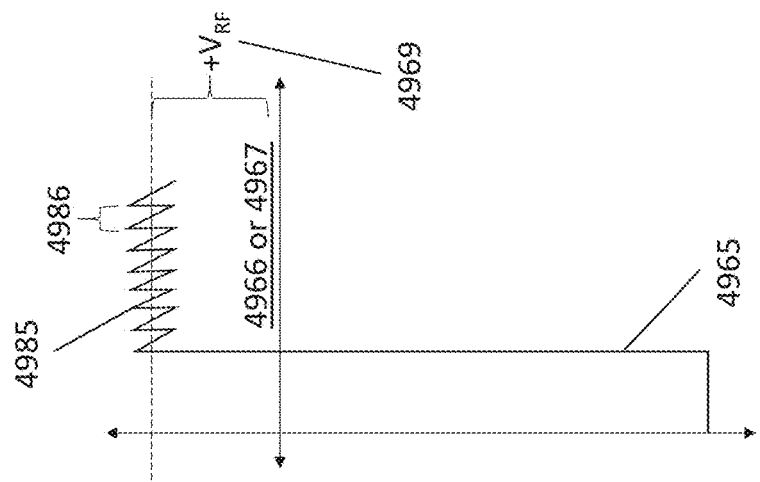

FIG. 49C shows creative modulation of the positive kick waveform including multi-spectral frequency components 4986 to drive high-density plasma but maintain a lower effective RF bias potential 4969. Not shown, but included for reference, is active modulation of the positive kick voltage between set voltage setpoints using the IMPULSE power module to define a custom voltage profile versus time. This is used to customize the plasma density and RF bias with each cycle or over time between many pulses, e.g. waveform A for 1000 main pulses and waveform B for 100 main pulses.

Figure 50B:
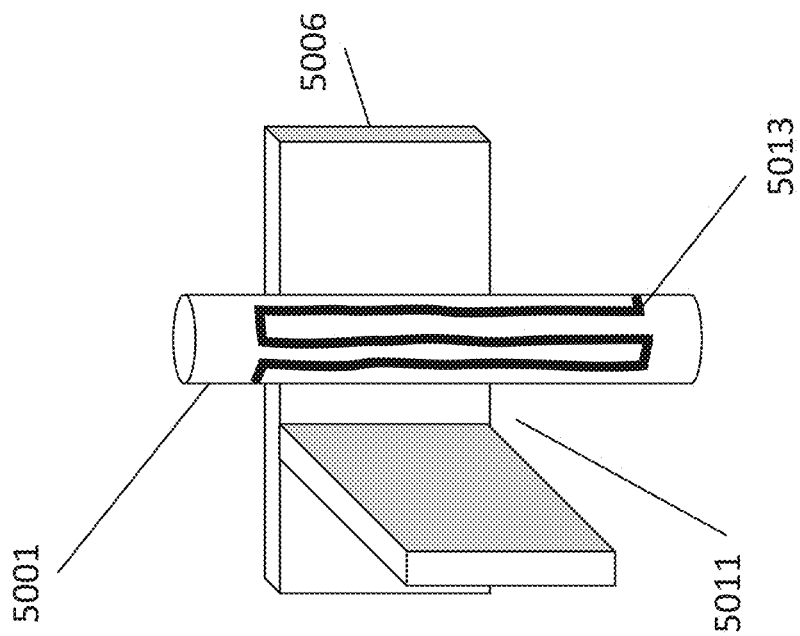
FIGS. 50A and 50B illustratively depict an application of the disclosure herein.
Figure 50A:
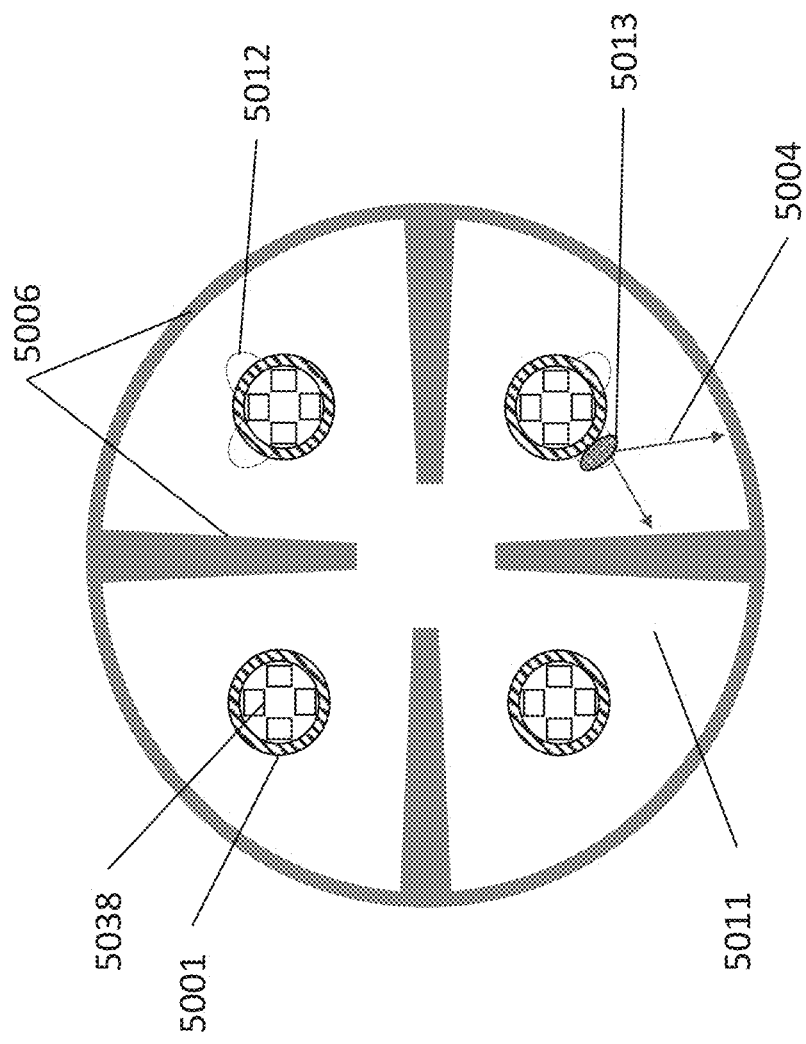

FIG. 50A illustratively depicts an application of the disclosure herein. Namely, a thin-film etching and deposition on particle accelerator electrodes and electromagnetic cavity structures. FIG. 50A depicts the cross-sectional area of a four-vane radiofrequency quadrupole accelerator cavity. The internal four quadrants of this cavity are subjected to intense electromagnetic fields and surface RF currents. To achieve high accelerating gradients, very high electric fields are used. The quality of the surface coating in the cavity, its microstructure and electrical conductivity are critically important to achieve high performance. The present disclosure, when implemented, allows for a surface preparation, cleaning, etching, adhesion and deposition of high-quality materials to improve performance. In this example, a sputter target 5001 is inserted inside the vacuum environment 5011 of the accelerator cavity substrate 5006. Magnetic assemblies 5038 inside of the sputter targets 5001 generate magnetic fields 5012 that generate and sustain the dense plasma regions 5013 needed to generate ions and neutrals 5004 that well deposit on substrate 5006.

FIG. 50B is a photograph showing four sputtering targets 5001 positioned inside an accelerator cavity structure substrate 5006. The dense plasma region 0513 are very visible inside the vacuum environment 5011. High-conductivity copper with dense nanograin structure can be deposited with an ultra-smooth surface roughness to withstand high electric field gradients. The nanograin texture is resistant to slip-plane whisker growth that promotes to surface electric field concentration and sparking under high gradients. The disclosure herein remedies this problem. Furthermore, the present invention can also be used for superconducting films and layers, such as Nb, Nb/NbN, etc. Using the IMPULSE and positive kick and aspects of this invention, the film morphology and crystallinity are controlled to achieve preferred grain orientation, grain size, lattice plane matching, surface roughness and other parameters leading to superior residual resistivity ration, current density and magnetic performance.

Figure 51B:
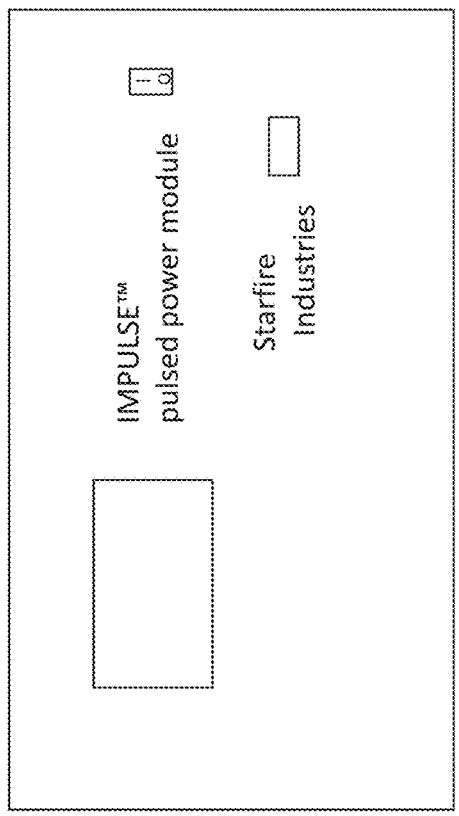
FIGS. 51A and 51B are photographs of an IMPULSE 2-2 system and an IMPULSE 20-20 system used as a power supply in the systems described herein in implementations of the present disclosure.
Figure 51A:
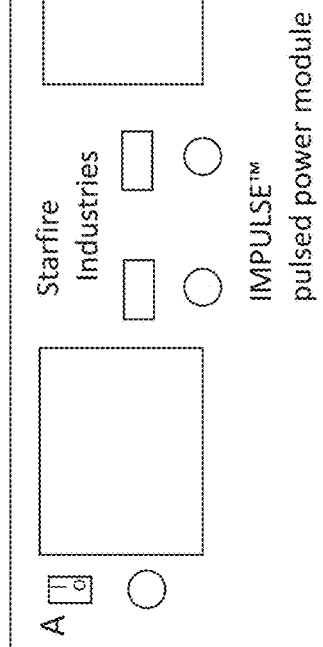

FIGS. 51A and 51B are photographs of an IMPULSE 2-2 system and an IMPULSE 20-20 system used as a power supply in the systems described herein in implementations of the present disclosure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments are described herein known to the inventors for carrying out the invention. Variations of these embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A system comprising:
 a sputter target:
  having a hollow cross section and shaped in the form of a cylinder or a quasi-cylinder, and
  made of sputter target material transferable, in operation of the system, to a substrate; and
 a magnetic element array including multiple sets of permanent magnets arranged along an outward face of the sputter target;
 wherein the magnetic element array is positioned relatively outwardly in relation to the sputter target hollow cross section so that, in operation, one or more localized Hall-Effect regions are generated that facilitate magnetron plasma discharge from an inward facing surface of the sputter target,
 wherein each region, of the one or more localized Hall-Effect regions, extends over an effective area of the sputter target to generate $0.1 A/cm^2$ to $10 A/cm^2$ plasma discharge current density in the effective area during a magnetron plasma discharge operation,
 wherein, during a magnetron plasma discharge operation, the system is configured to modify a surface of an object by generating and controlling an ion and neutral particle flux by:
  providing a vacuum apparatus containing a sputter target holder electrode that is electrically attached to the sputter target with an electrical connection and electrical insulation between said sputter target holder and the vacuum apparatus; and
  generating a magnetron plasma discharge by applying one or more voltage potential patterns to the sputter target holder electrode;
 wherein the magnetic element array is configured to provide, during operation, the magnetron plasma discharge for performing a direct current high-power impulse magnetron sputtering (direct current HiPIMS) operation,
 wherein a plasma coverage area fraction equals a ratio of a sum total area of the effective area of the one or more localized Hall-Effect regions to an outer surface area of the sputter target facing the magnetic array, and
 wherein the magnetic element array is configured such that the plasma coverage area fraction, during direct current HiPIMS operation, is less than one half.

2. The system according to claim 1 wherein the inverted magnetron sputtering system is configured to modify the surface of the object by generating and controlling an ion and neutral particle flux by:
 first generating a high-power pulsed plasma magnetron discharge with a high- current negative direct current (DC) pulse to the sputter a target holder electrode; and
 second generating a configurable positive voltage kick pulse to the sputter target holder electrode after terminating the negative DC pulse.

3. The system of claim 2 wherein during the second generating, a programmed processor configured logic circuitry issues a control signal to a positive kick pulse power transistor to control a kick pulse property of a sustained positive voltage kick pulse taken from the group consisting of: onset delay, amplitude and duration.

4. The system of claim 2 wherein the system is configured to further carry out a continuous hybrid production process including both a layer deposition operation and an etch process operation, wherein the continuous hybrid process is performed:
 without removing the object from a chamber within the system, and
 by varying a timing and/or an amplitude of a pulse during the first generating operation and/or the second generating operation.

5. The system of claim 2, wherein the system is configured to further carry out a continuous hybrid production process that is configurable such that a multi- stage process is performable on the object occurs without process stoppage, and wherein the multi-stage process comprises two or more operations taken from the group consisting of:
 cleaning, etching, ion implantation, stress management, deposition, mixing, adhesion, and layer control.

6. The system of claim 1 wherein the magnetic element array and the sputter target relatively rotate along a common lengthwise axis.

7. The of claim 6, wherein, in use, the sputter target is stationary.

8. The system of claim 6 wherein the sputter target is fixed and the magnetic array, during operation of the system, rotates in relation to the sputter target.

9. The system of claim 8 wherein the sputter target, during operation of the system, is coupled via an electrical connection to a power supply.

10. The system of claim 1 wherein the magnetic element array is physically arranged to create at least one Hall-Effect region in a continuous serpentine path.

11. The system of claim 10 wherein the continuous serpentine path comprises a turnaround profile magnetic assembly, wherein the turnaround profile magnet assembly is magnetically tailored to produce a desired magnetron plasma discharge density change relative to a centerline of the continuous serpentine path.

12. The system of claim 1 wherein the magnetic element array is arranged to create a magnetic null or minimum near the object or a centerline of the sputter target.

13. The system of claim 12 wherein the centerline magnetic minimum or null creates a virtual electrode for current return along the axis to electrodes located at the ends of the apparatus.

14. The system of claim 1 wherein, during a magnetron plasma discharge operation, the system is configured to modify the surface of an object by generating and controlling an ion and a neutral particle flux by applying a voltage bias to the object.

15. The system of claim 1 wherein the object is nuclear fuel.

16. The system of claim 1 wherein the sputter target comprises an elongated sputtering electrode material tube.

17. The system of claim 1 wherein the magnetic element array is located external to the vacuum apparatus.

18. The system of claim 1, wherein the magnetic element array is immersed in a liquid coolant, situated proximal to the sputter target and any sputter target holder electrode.

19. The system of claim 1 wherein the magnetic element array comprises one or more circular, rectangular, or other continuous loops to generate magnetic fields at the sputter target.

20. The system of claim 1 wherein sets of permanent magnets of the magnetic element array are shaped to generate magnetic field cusps with a magnetic field gradient towards the centerline of the hollow sputter target.

21. The system of claim 1 wherein sets of permanent magnets of the magnetic element array are poled in one direction and paired with a corresponding set of oppositely poled permanent magnets to generate an unbalanced magnetic configuration.

22. The system of claim 1 wherein the vacuum apparatus feeds the object continuously through the magnetron plasma discharge comprising one or more localized HiPIMS plasma discharge regions.

23. The system of claim 1, wherein the sputter target comprises a plurality of individual segments joined to form the quasi-cylinder.

24. The system of claim 1, wherein the substrate passes, during operation of the system, along a center axis of the sputter target.

25. The system of claim 1, wherein the magnetic array, during operation of the system, is operated such that the plasma coverage area fraction is less than one third.

26. The system of claim 1, wherein the magnetic array, during operation of the system, is operated such that the plasma coverage area fraction is between one-half and one third.

* * * * *